(12) United States Patent
Zhu et al.

(10) Patent No.: US 11,950,435 B2
(45) Date of Patent: Apr. 2, 2024

(54) NARROW-BANDGAP PEROVSKITES USING QUASI-2D CATION ENGINEERING

(71) Applicant: Alliance for Sustainable Energy, LLC, Golden, CO (US)

(72) Inventors: Kai Zhu, Littleton, CO (US); Jinhui Tong, Golden, CO (US); Qi Jiang, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/814,433

(22) Filed: Jul. 22, 2022

(65) Prior Publication Data

US 2023/0157039 A1    May 18, 2023

Related U.S. Application Data

(60) Provisional application No. 63/227,415, filed on Jul. 30, 2021.

(51) Int. Cl.
*H10K 30/57* (2023.01)
*H10K 85/50* (2023.01)

(52) U.S. Cl.
CPC ............ *H10K 30/57* (2023.02); *H10K 85/50* (2023.02)

(58) Field of Classification Search
CPC ...... H10K 30/05; H10K 85/50; H01G 9/2009; H01G 9/2072
See application file for complete search history.

(56) References Cited

U.S. PATENT DOCUMENTS

| 2017/0271622 | A1* | 9/2017 | Chaudhari | ........ H01L 31/03365 |
| 2020/0328077 | A1 | 10/2020 | Bush et al. | |
| 2022/0037597 | A1* | 2/2022 | Palmstrom | ........... H01G 9/0036 |
| 2022/0263025 | A1* | 8/2022 | Fateev | .................. H10K 71/12 |

FOREIGN PATENT DOCUMENTS

RU    2712151 C1 *  1/2020  ............. C23C 26/02

OTHER PUBLICATIONS

Chen, X. et al., "Impact of Layer Thickness on the Charge Carrier and Spin Coheerence Lifetime in Two-Dimensional Layered Perovskite Single Crystals," ACS Energy Letters, vol. 3, 2018, 7 pages.

Daub, M. et al., "Synthesis, Crystal Structures, Optical Properties, and Phase Transitions of the Layered Guanidinium-Based Hybrid Perovskites [C(NH2)3]2MI4; M=Sn, Pb," ChemPubSoc Europe, 2017, 7 pages.

Fu, Y. et al., "Incorporating Large A Cations into Lead Iodide Perovskite Cages: Relaxed Goldschmidt Tolerance Factor and Impact on Exciton-Phonon Interaction," ACS Central Science, vol. 5, 2019, 10 pages.

(Continued)

*Primary Examiner* — Tamir Ayad
(74) *Attorney, Agent, or Firm* — Michael A. McIntyre

(57) ABSTRACT

The present disclosure relates to a composition that includes a perovskite phase having the stoichiometry $ABX_3$ and a perovskite-like phase having the stoichiometry $A'_2A''B'_2X'$, where A is a first cation, B is a second cation, X is a first anion, A' is a third cation, A" is a fourth cation, B' is a fifth cation, X' is a second anion, and A' is different than A".

19 Claims, 44 Drawing Sheets

(56) References Cited

OTHER PUBLICATIONS

Jodlowski, A.D. et al., "Benign-by-Design Solventless Mechanochemical Systhesis of Three-, Two-, and One-Dimensional Hybrid Perovskites," Angewandte Chemie Communications, International Edition, vol. 55, 2016, 6 pages.
Kapil, G. et al., "Strain Relaxation and Light Management in Tin-Lead Perovskite Solar Cells to Achieve High Efficiencies," ACS Energy Letters, vol. 4, 2019, 8 pages.
Ke, W. et al., "Employing Lead Thiocyanate Additive to Reduce the Hysteresis and Boost the Fill Factor of Planar Perovskite Solar Cells," Advanced Materials, vol. 28, 2016, 8 pages.
Ke, W. et al., "Narrow-Bandgap Mixed Lead/Tin-Based 2D Dion-Jacobson Perovskites Boost the Performance of Solar Cells," Journal of the American Chemical Society, vol. 142, 2020, 9 pages.
Khenkin, Mark V. et al., "Consensus statement for stability assessment and reporting for perovskite photovoltaics based on ISOS procedures," Nature Energy, vol. 5, Jan. 2020, 5 pages.
Kim, D. et al., "Efficient, stable silicon tandem cells enabled by anion-engineered wide-bandgap perovskites," Science, vol. 368, 2020, 7 pages.
Krückemeier, L. et al., "How to Report Record Open-Circuit Voltages in Lead-Halide Perovskite Solar Cells," Advanced Energy Materials, vol. 10, 2020, 10 pages.
Li, C. et al., "Low-bandgap mixed tin-lead iodide perovskites with reduced methylammonium for simultaneous enhancement of solar cell efficiency and stability," Nature Energy, vol. 5, Oct. 2020, 11 pages.
Liang, C. et al., "Ruddlesden-Popper Perovskite for Stable Solar Cells," Energy Environmental Materials, vol. 1, 2018, 11 pages.
Liao, W. et al., "Lead-Free Inverted Planar Formamidinium Tin Triiodide Perovskite Solar Cells Achieving Power Conversion Efficiencies up to 6.22%," Advanced Materials, vol. 28, 2016, 8 pages.
Lin, R. et al., "Monolithic all-perovskite tandem solar cells with 24.8% efficiency exploiting comproportionation to suppress Sn(11) oxidation in precursor ink," Nature Energy, vol. 4, Oct. 2019, 12 pages.
Lin, R. et al., "All-perovskite tandem solar cells with improved grain surface passivation," Nature, vol. 603, Mar. 3, 2022, 19 pages.
Liu, Z. et al., "Open-Circuit Voltages Exceeding 1.26 V in Planar Methylammonium Lead Iodide Perovskite Solar Cells," ACS Energy Letters, vol. 4, 2019, 8 pages.
Meggiolaro, D. et al., "Tin versus Lead Redox Chemistry Modulates Charge Trapping and Self-Doping in Tin/Lead Iodide Perovskites," Journal of Physical Chemistry Letters, vol. 11, 2020, 11 pages.
Palmstrom, A. et al., "Enabling Flexible All-Perovskite Tandem Solar Cells," Joule, vol. 3, Sep. 18, 2019, 13 pages.
Perkins, C.L. et al., "Surfactant-assisted growth of CdS thin films for photovoltaic applications," Journal of Vacuum Society Technology A, vol. 3, No. 24, May/Jun. 2006, 8 pages.
Rühle, Sven, "Tabulated values of the Shockley-Queisser limit for single junction solar cells," Solar Energy, vol. 130, 2016, 9 pages.
Sabba, D. et al., Impact of Anionic Br-Substitution on Open Circuit Voltage in Lead Free Perovskite (CsSnl3-xBrx) Solar Cells, Journal of Physical Chemistry C, vol. 119, 2015, 5 pages.
Soe, Chan M.M. et al., "New Type of 2D Perovskites with Alternating Cations in the Interlayer Space, (C(NH2)3) (CH3NH3)nPbn13n+1: Structure, Properties, and Photovoltaic Performance," Journal of American Chemical Society, vol. 139, 2017, 13 pages.
Tong, J. et al., "Carrier lifetimes of >1 μs in Sn—Pb perovskites enable efficient all-perovskite tandem solar cells," Science, vol. 364, May 3, 2019, 6 pages.
Wang, J. et al., "16.8% Monolithic all-perovskite triple-junction solar cells via a universal two-step solution process," Nature Communications, vol. 11, 2020, 10 pages.
Xu, J. et al., "Triple-halide wide-band gap perovskites with suppressed phase segregation for efficient tandems," Science, vol. 367, 2020, 9 pages.
Yang, Z. et al., "Enhancing electron diffusion length in narrow-bandgap perovskites for efficient monolithic perovskite tandem solar cells," Nature Communications, vol. 10, 2019, 9 pages.
Yu, Z. et al., "Simplified interconnection structure based on C60/SnO2-x for all-perovskite tandem solar cells," Nature Energy, vol. 5, Sep. 2020, 11 pages.
Zhang, R. et al., "A potassium thiocyanate additive for hysteresis elimination in highly efficient perovskite solar cells," Inorganic Chemistry Frontiers, vol. 6, 2019, 9 pages.
Zhang, F. et al., "Enhanced Charge Transport in 2D Perovskites via Fluorination of Organic Cation," Journal of the American Chemical Society, vol. 141, 2019, 8 pages.
Zhang, F. et al., "Advances in two-dimensional organic-inorganic hybrid perovskites," Energy & Environmental Science, vol. 13, 2020, 33 pages.
Zhao, D. et al., "Efficient two-terminal all-perovskite tandem solar cells enabled by high-quality low-bandgap absorber layers," Nature Energy, vol. 3, Dec. 2018, 10 pages.
Ricciarelli, D. et al., "Instability of Tin Iodide Perovskites: Bulk p-Doping versus Surface Tin Oxidation," ACS Energy Letters, vol. 5, 2020, 9 pages.

\* cited by examiner

NARROW-BANDGAP PEROVSKITES USING QUASI-2D CATION ENGINEERING

CROSS-REFERENCE TO RELATED APPLICATIONS

This application claims priority from U.S. Provisional Patent Application No. 63/227,415 filed on Jul. 30, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

At present, the main challenge in all-perovskite tandem solar cells is the effective use of Sn—Pb-based narrow-bandgap perovskite solar cells (PSCs). There are two main challenges in fabricating efficient and stable Sn—Pb PSCs. First, $Sn^{2+}$ can be oxidized to $Sn^{4+}$ during and after Sn-containing perovskite processing, which dopes Sn—Pb perovskites p-type, eventually leading to a high background (dark) carrier density that renders them poor photovoltaic (PV) materials. Second, the nonuniform nucleation and fast crystallization of Sn-containing perovskites make it more challenging to fabricate high-quality, dense, and compact Sn—Pb perovskite layers. The defective grain boundaries/surfaces can exacerbate the $Sn^{2+}$ to $Sn^{4+}$ issue. These challenges often result in large voltage loss and poor stability of Sn—Pb based PSCs. Thus, there remains a need for improved methods and compositions that can overcome the shortcoming currently facing the use of Sn—Pb perovskite compositions in PSCs, tandem devices in particular.

SUMMARY

An aspect of the present disclosure is a composition that includes a perovskite phase having the stoichiometry $ABX_3$ and a perovskite-like phase having the stoichiometry $A'_2A''B'_2X'$, where A is a first cation, B is a second cation, X is a first anion, A' is a third cation, A" is a fourth cation, B' is a fifth cation, X' is a second anion, and A' is different than A". In some embodiments of the present disclosure, A' may include an ammonium functional group. In some embodiments of the present disclosure, A' may include at least one of phenylethylammonium (PEA), guanidinium (GA), 4-flouorophenethylammonium, N-methyl-1,3-propane diammonium, 1,4-butane diamine, or N,N-dimethyl-1,3-propane diammonium, dipropylammonium, and/or diethylammonium. In some embodiments of the present disclosure, A" may include at least one of phenylethylammonium (PEA), guanidinium (GA), 4-flouorophenethylammonium, N-methyl-1,3-propane diammonium, 1,4-butane diamine (BDA), or N,N-dimethyl-1,3-propane diammonium, dipropylammonium, and/or diethylammonium.

In some embodiments of the present disclosure, B may include at least one of tin or lead. In some embodiments of the present disclosure, B includes tin and lead. In some embodiments of the present disclosure, A may include at least one of methylammonium (MA), formamidinium (FA), dimethylammonium, and/or cesium. In some embodiments of the present disclosure, the perovskite phase may include $FA_{(1-x)}MA_xPb_{1-z}Sn_zI_3$, with each of x and z greater than zero. In some embodiments of the present disclosure, the perovskite phase may further include cesium as $FA_{(1-x-y)}MA_xCs_yPb_{1-z}Sn_zI_3$ where y is greater than zero. In some embodiments of the present disclosure, the perovskite phase may further include at least one of bromide or chloride as $FA_{(1-x-y)}MA_xCs_yPb_{1-z}Sn_z(I_{1-a-b}Br_aCl_b)_3$ where at least one of a or b is greater than zero. In some embodiments of the present disclosure, the perovskite phase may further include at least one of A' or A", where the amount of A' or A" may be present in the perovskite phase at a concentration between 0.0001 mol % and 10 mol %.

In some embodiments of the present disclosure, the perovskite-like phase may include $(PEA)_2GAPb_2I_7$. In some embodiments of the present disclosure, the perovskite-like phase may further include A as $(PEA)_2(GA_{1-x}A_x)Pb_2I_7$ where x is greater than zero. In some embodiments of the present disclosure, the perovskite-like phase may further include tin as $(PEA)_2(GA_{1-x}A_x)(Pb_{1-z}Sn_z)_2I_7$ where z is greater than zero. In some embodiments of the present disclosure, the perovskite-like phase may further include A in the form of at least one of methylammonium or formamidinium as $(PEA)_2(GA_{1-x-y}MA_xFA_y)(Pb_{1-z}Sn_z)_2(I)_7$ where at least one of x or y is greater than zero. In some embodiments of the present disclosure, the perovskite-like phase may further include bromide as $(PEA)_2(GA_{1-x-y}MA_xFA_y)(Pb_{1-z}Sn_z)_2(I_{1-m}Br_m)_7$ where m is greater than zero. In some embodiments of the present disclosure, the perovskite-like phase may be present in the composition at a concentration between greater than 0 mol % and less than or equal to 5 mol %. In some embodiments of the present disclosure, the composition may be characterized by a low-angle diffraction peak below 14 degrees (°), when tested by XRD. In some embodiments of the present disclosure, the low-angle diffraction peak may include three peaks present at about 4.3°, about 8.5°, and about 12.8°.

An aspect of the present disclosure is a tandem device that includes a composite layer having a first bandgap and constructed to include both a perovskite phase and a perovskite-like phase, and a perovskite layer having a second bandgap, where the first bandgap is less than the second bandgap.

DETAILED DESCRIPTION

Figure 1A:
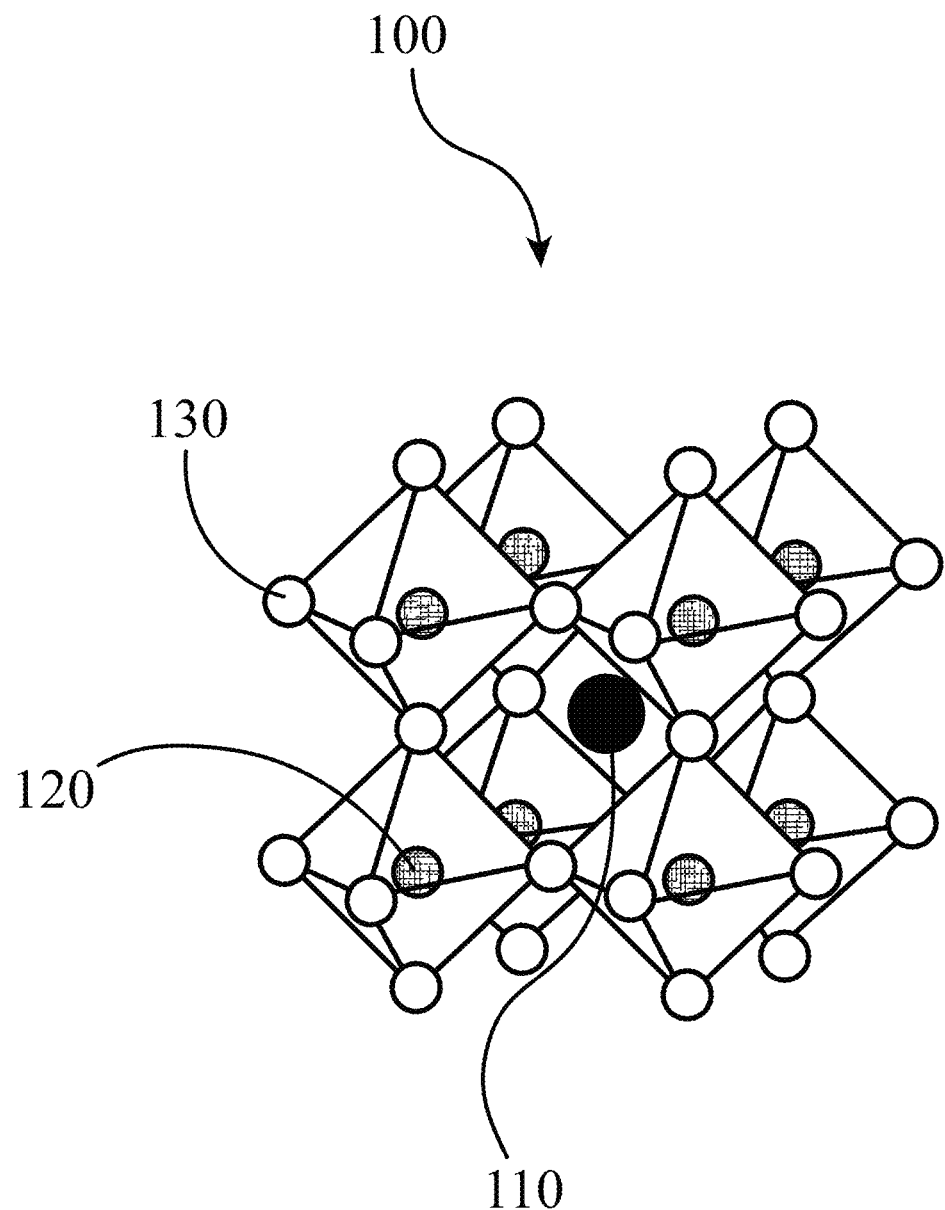
FIGS. 1A and 1B illustrate a perovskite in a corner-sharing, cubic phase arrangement, according to some embodiments of the present disclosure.

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to unique perovskite-like compositions that when combined with perovskite compositions provide a stable and reliable low bandgap absorber layer, which among other things, enables the manufacture of perovskite multijunction solar cells and modules. As described herein, in some embodiments of the present disclosure, such perovskite-like compositions, may be quasi-2D perovskites (with n=2 as described below) based on phenethyl ammonium ($PEA^+$) and guanidinium ($GA^+$) in the form of $(PEA)_2GAX_2Y_7$ (where X=Pb and/or Sn; Y=I, or mixture of halides.)

Figure 1B:
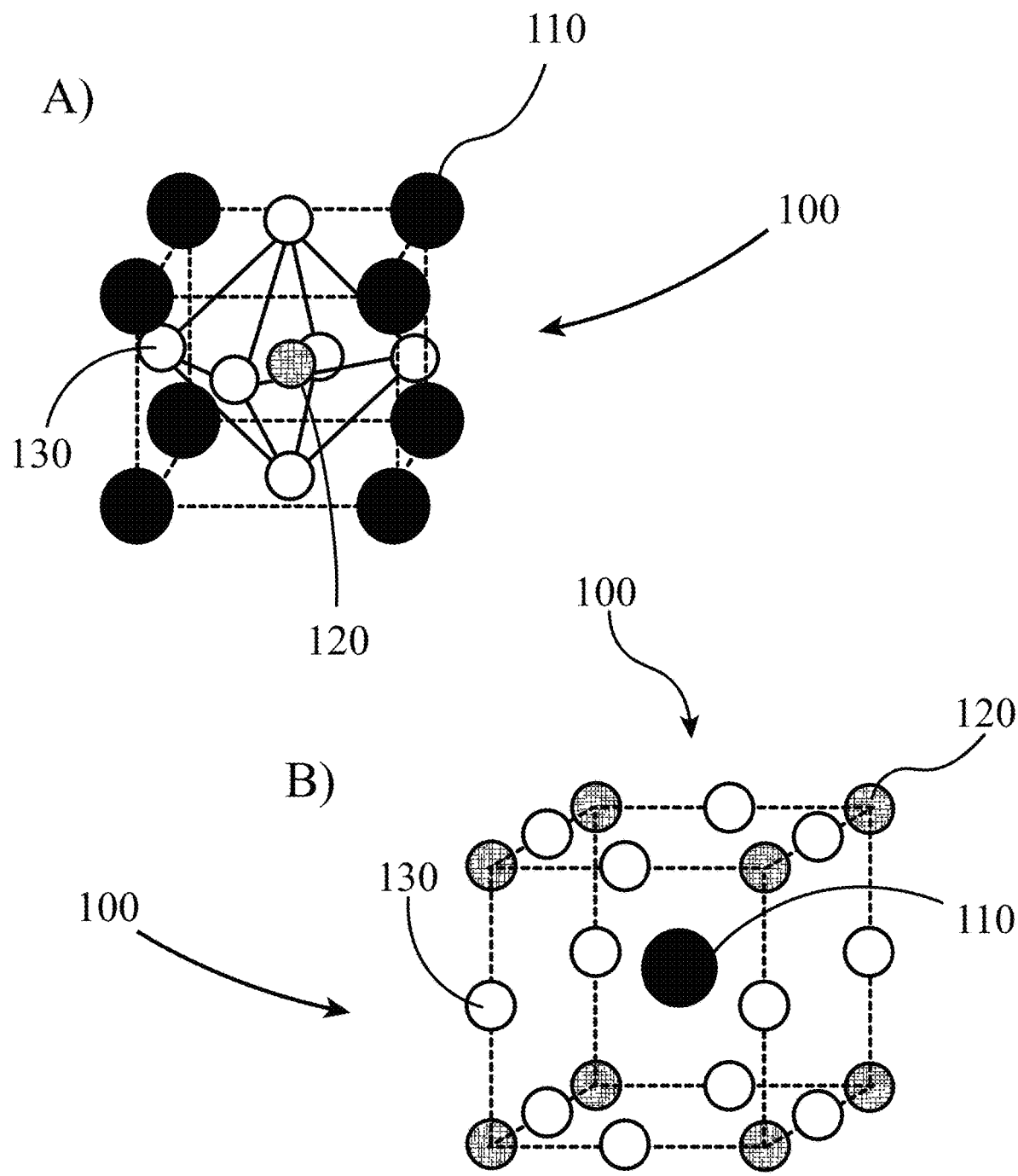

As defined herein, the term "perovskite" refers to compositions having a network of corner-sharing $BX_6$ octahedra resulting in the general stoichiometry of $ABX_3$. FIGS. 1A and 1B illustrate that perovskites 100, for example metal halide perovskites, may organize into a three-dimensional (3D) cubic crystalline structures (i.e., α-phase or α-$ABX_3$) constructed of a plurality of corner-sharing $BX_6$ octahedra. In the general stoichiometry for a perovskite, $ABX_3$, X (130) is an anion and A (110) and B (120) are cations, typically of different sizes. FIG. 1A illustrates that a perovskite 100 having an α-phase structure may be further characterized by eight $BX_6$ octahedra surrounding a central A-cation 110, where each octahedra is formed by six X-anions 130 surrounding a central B-cation 120 and each of the octahedra are linked together by "corner-sharing" of anions, X (130).

Panel A of FIG. 1B provides another visualization of a perovskite 100 in the α-phase, also referred to as the cubic phase. This is because, as illustrated in FIG. 1B, a perovskite in the α-phase may be visualized as a cubic unit cell, where the B-cation 120 is positioned at the center of the cube, an A-cation 110 is positioned at each corner of the cube, and an X-anion 130 is face-centered on each face of the cube. Panel B of FIG. 1B provides another visualization of the cubic unit cell of an α-phase perovskite, where the B-cation 120 resides at the eight corners of a cube, while the A-cation 110 is located at the center of the cube and with 12 X-anions 130 centrally located between B-cations 120 along each edge of the unit cell. For both unit cells illustrated in FIGS. 1B, the A-cations 110, the B-cations 120, and the X-anions 130 balance to the general formula $ABX_3$ of a perovskite, after accounting for the fractions of each atom shared with neighboring unit cells. For example, referring to Panel A of FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell illustrate in Panel A of FIG. 1B, the stoichiometry simplifies to B=1, A=8*0.125=1, and X=6*0.5=3, or $ABX_3$. Similarly, referring again to Panel B of FIG. 1B, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to Panel B of FIG. 1B, the X-anions 130 and the B-cations 120 of a perovskite in the α-phase are aligned along an axis; e.g. where the angle at the X-anion 130 between two neighboring B-cations 120 is exactly 180 degrees, referred to herein as the tilt angle. However, as illustrate in FIG. 2, a perovskite 100 may assume other corner-sharing crystalline phases having tilt angles not equal to 180 degrees.

Figure 2:
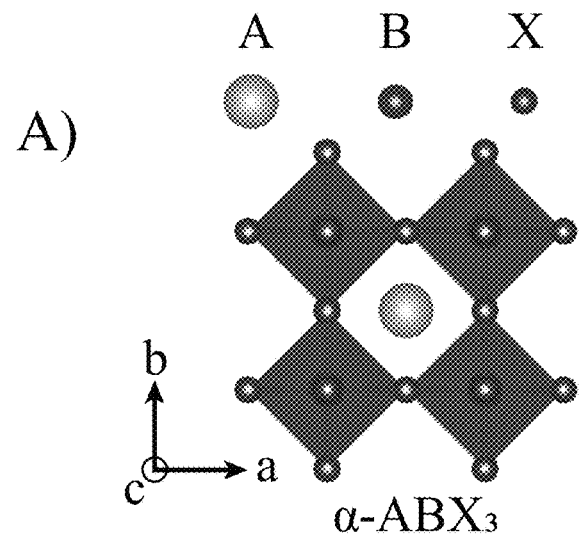
FIG. 2 illustrates three possible corner-sharing phases for perovskites, Panel (A) cubic phase (i.e., $\alpha$-$ABX_3$), Panel (B) a tetragonal crystalline phase (i.e., $\beta$-$ABX_3$), and Panel (C) an orthorhombic crystalline phase (i.e., $\gamma$-$ABX_3$), according to some embodiments of the present disclosure.
Figure 2:
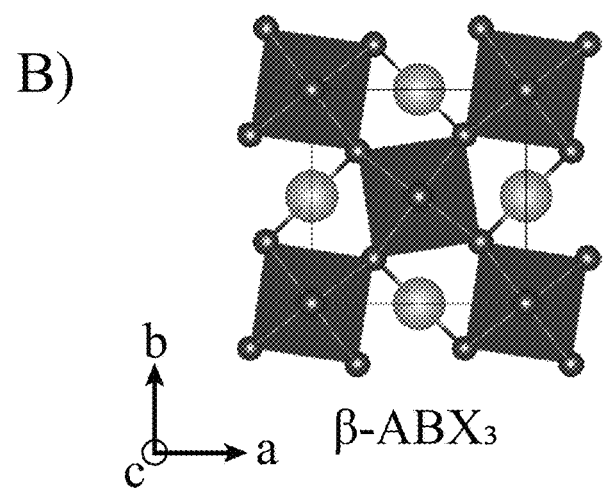
Figure 2:
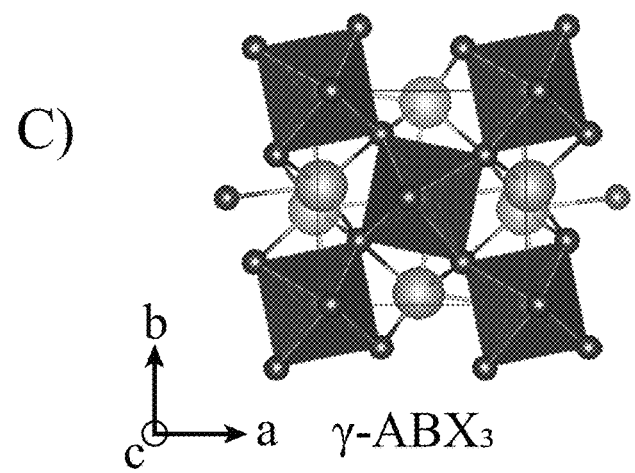

FIG. 2 illustrates that a perovskite can assume other crystalline forms while still maintaining the criteria of an $ABX_3$ stoichiometry with neighboring $BX_6$ octahedra maintaining X anion (130) corner-sharing. Thus, in addition to α-$ABX_3$ perovskites (in the cubic phase) having a tilt angle of 180 degrees, illustrate in Panel A of FIG. 2, a perovskite may also assume a tetragonal crystalline phase (i.e., β-$ABX_3$) (see Panel B of FIG. 2) and/or an orthorhombic crystalline phase (i.e., γ-$ABX_3$) (see Panel C of FIG. 2), where the adjacent octahedra are tilted relative to the reference axes a, b, and c.

Figure 3:
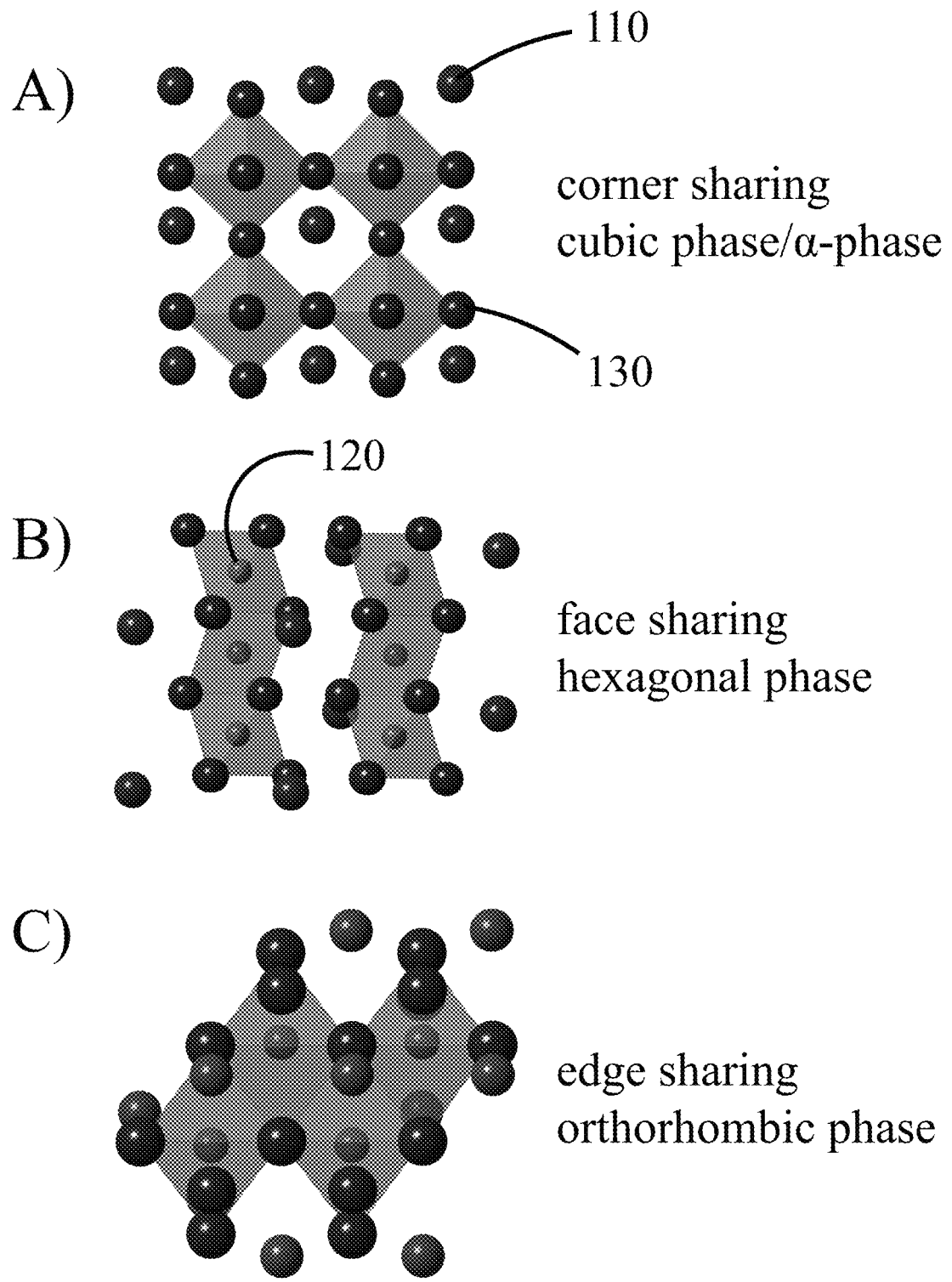
FIG. 3 illustrates a perovskite in one of the three possible phases, the cubic phase (i.e., $\alpha$-phase), compared to two non-perovskite phases (i.e., non-corner sharing), according to some embodiments of the present disclosure.

FIG. 3 illustrates that the elements used to construct a perovskite, as described above, A-cations 110, B-cations 120, and X-anions 130, may result in 3D non-perovskite structures, i.e., structures where neighboring $BX_6$ octahedra are not X-anion 130 corner-sharing and/or do not have a unit structure that simplifies to the $ABX_3$ stoichiometry. Referring to Panel A of FIG. 3, a perovskite in the cubic phase is illustrated, i.e., α-$ABX_3$, compared to a non-perovskite structure constructed of face-sharing $BX_6$ octahedra resulting in a hexagonal crystalline structure (see Panel B of FIG. 3) and a non-perovskite structure constructed of edge-sharing $BX_6$ octahedra resulting in an orthorhombic crystalline structure (see Panel C of FIG. 3).

Figure 4:
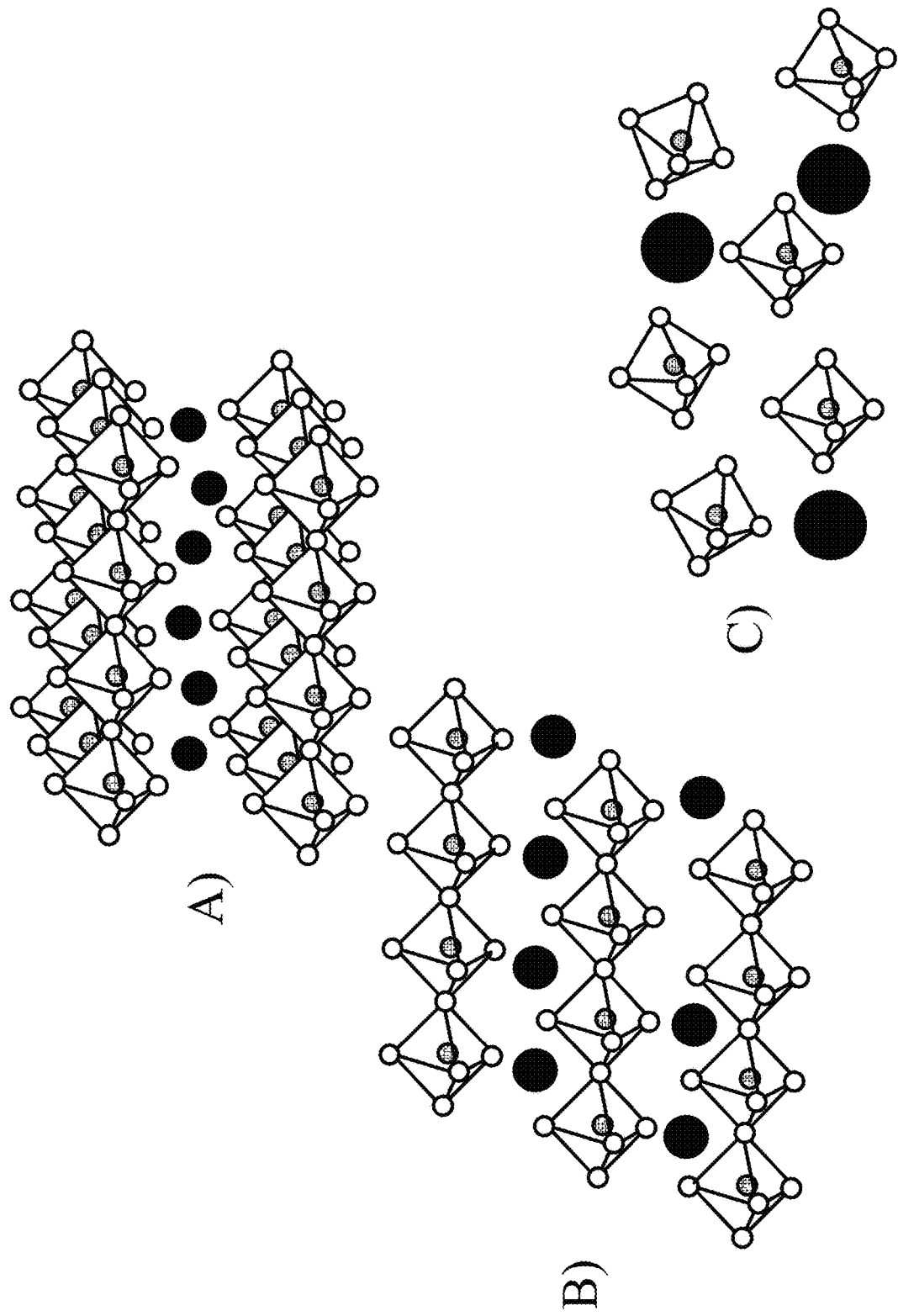
FIG. 4 illustrates 2D, 1D, and 0D perovskite-like structures, in Panels (A), (B), and (C), respectively, according to some embodiments of the present disclosure.

Further, referring now to FIG. 4, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As illustrate in FIG. 4, such lower dimensional, perovskite-like structures still include the $BX_6$ octahedra, and depending on the dimensionality, e.g., 2D or 1D, may still maintain a degree of X-anion corner-sharing. However, as illustrate in FIG. 4, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Referring to Panel A of FIG. 4, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A')_m(A)_{n-1}B_nX_{3n+1}$, where monovalent (m=2) or divalent (m=1) A' cations 110' can intercalate between the X-anions of 2D perovskite-like sheets. Referring to Panel B of FIG. 4, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 4, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material. As discussed in more detail below, a "pure" 2D perovskite-like structure corresponds to n substantially equal to 1 in the formula $(A')_m(A)_{n-1}B_nX_{3n+1}$ and a quasi-2D perovskite-like structure corresponds to n substantially equal to 2. In some embodiments of the present disclosure, a quasi-2D perovskite-like structure may have a value for n of $1 < n \leq 5$.

Figure 5:
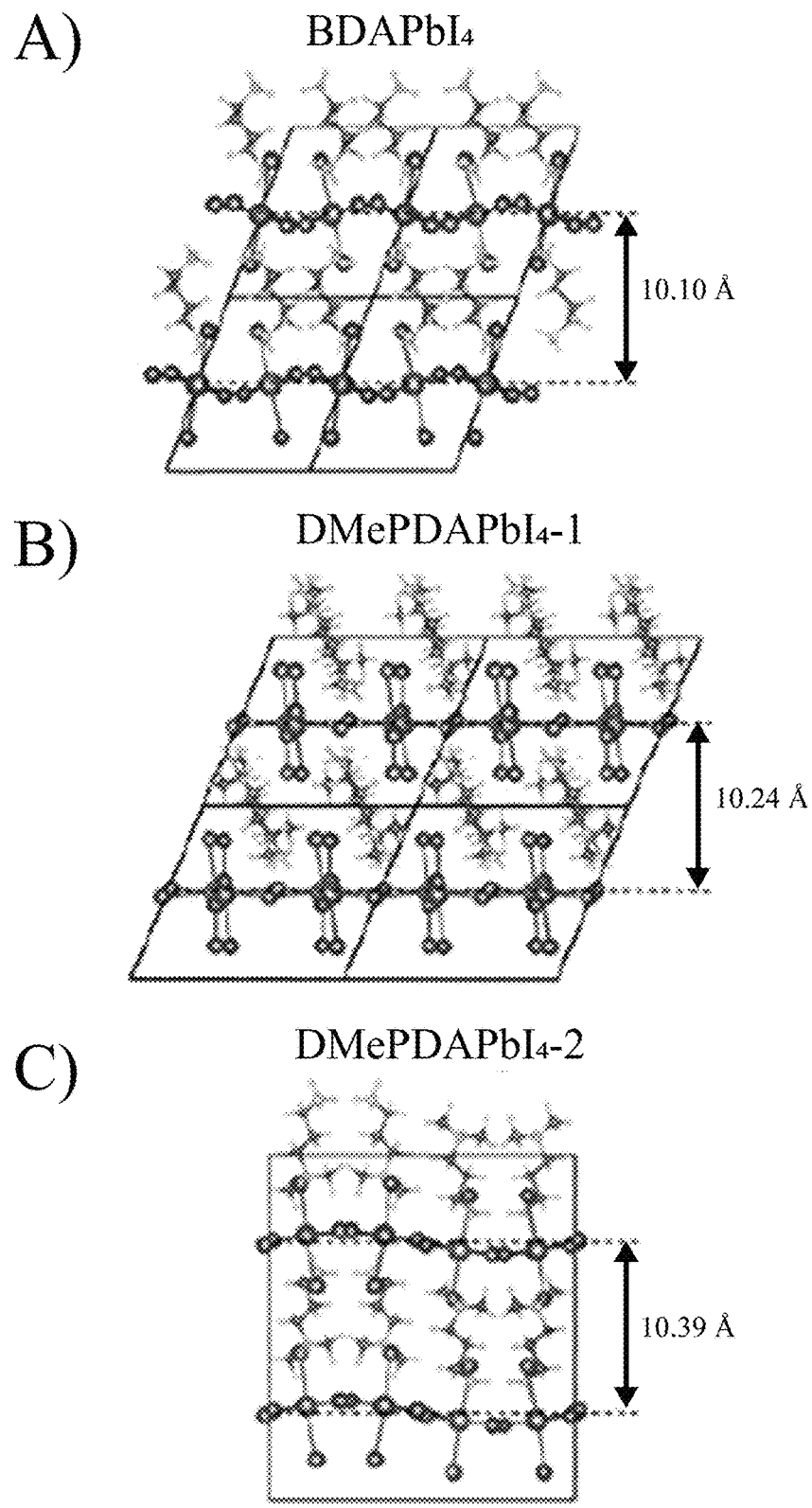
FIG. 5 illustrates side views of the crystal structures of exemplary 2D perovskite-like structures (A) $BDAPbI_4$, (B) $DMePDAPbI_4$-1, and (C) $DMePDAPbI_4$-2 single crystals, according to some embodiments of the present disclosure. The average interlayer distances are indicated. (BDA=1,4-butane diamine and DMePDA=N,N-dimethyl-1,3-propane diammonium, both having a 2+ charge.)

FIG. 5 compares the crystal structure of $DMePDAPbI_4$, an exemplary 2D perovskite with $BDAPbI_4$, another 2D perovskite. (BDA=1,4-butane diamine and DMePDA=N,N-dimethyl-1,3-propane diammonium, both having a 2+ charge.) Thus, a non-perovskite structure may have a composition defined by $ABX_4$ as illustrate in FIG. 5, where the A-cation has a 2+ charge. In some embodiments of the present disclosure, the A-cation of a 2D non-perovskite material may have a characteristic length between about 2.53 Å and about 7.62 Å or between about 2.72 Å and about 7.06 Å.

In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g. fluorine, chlorine, bromine, iodine and/or astatine. In some cases, the perovskite halide may include more than one X-anion 130, for example pairs of anions of halogens; chlorine and iodine, bromine and iodine, and/or any other suitable pairing of halogens. In other cases, the perovskite 100 may include anions of two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g. at least one of I, Br, Cl, and/or F), thiocyanate, and/or sulfur. Any combination is possible provided that the charges balance.

For example, a perovskite having the basic crystal structure illustrated in FIGS. 1A and 1B, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

The present disclosure relates to the formation of quasi-2D perovskite-like structures, for example $(PEA)_2GAPb_2I_7$, resulting from the use of mixed bulky organic cations such as phenethylammonium ($PEA^+$) and guanidinium ($GA^+$) and, in particular, the use of both $PEA^+$ and $GA^+$ in combination in perovskite-lite structure. As shown herein, these molecules, when mixed with a second phase of a 3D perovskite, very effectively control, minimize, and/or eliminate the formation of defects, which significantly improves the structural and optoelectronic properties of the 3D perovskite phase. In some embodiments of the present disclosure, as shown herein, the resultant mixtures enable the manufacture of narrow-bandgap (~1.25-eV) Sn—Pb perovskite layers. Thus, the compositions and methods describe herein enable the manufacture of, among other things, Sn—Pb based perovskite absorber layers having unprecedented low dark carrier density (~$1.3 \times 10^{14}$ cm$^{-3}$), long bulk carrier lifetime (~9.2 µs), and low surface recombination velocity (~1.4 cm/s), leading to 22.1%-efficient single-junction Sn—Pb perovskite cells, and 25.5%-efficient all-perovskite two-terminal tandems with record high photovoltage and long operational stability. Although the present disclosure focuses on single-junction perovskite devices and tandem all-perovskite devices, the methods and compositions described herein may be applied to multi-junction devices (two or more junctions) and/or devices that include one or more perovskite absorbing layers combined with other photovoltaic semiconducting materials such as silicon, CdTe, organic photovoltaic (OPV) materials, CIGS, and III-V alloys. Further, the concepts described herein may be applied to multi-junction devices have two or more terminals.

Thus, in some embodiments of the present disclosure, a composition may be synthesized that includes two distinct phases, a 3D perovskite phase and a quasi-2D perovskite-like phase. In some embodiments of the present disclosure, the perovskite phase may have a composition defined by $ABX_3$ (where A may include one or more A-site cations, B may include one or more B-site cations and X may include one or more X-site anions) and the perovskite-like phase may have a composition defined by $A'_2A''B'_2X'_7$ (when n=1 and the A-site cations have a 1+ charge, as described in more detail below). In some embodiments of the present disclosure, a perovskite-like phase may be mixed throughout at least a portion of a perovskite phase. As defined herein, and above, A is a first cation, B is a second cation, X is a first anion, A' is a third cation, A" is a fourth cation, B' is a fifth cation, and X' is a second anion. In some embodiments of the present disclosure, A' and A" are different than A, and A' is different than A".

In general, the 3D perovskite of a composition made of a mixture of the 3D perovskite phase and a quasi-2D perovskite-like phase may be characterized by $ABX_3$, where each of the A-site cation, the B-site cation, and the X-site anion includes one or more of each. For example, the A-site cation of an $ABX_3$ 3 D composition may include one or more of cesium, methylammonium, and/or formamidinium. Similarly, the B-site cation of an $ABX_3$ 3 D composition may include one or more of lead and/or tin and the X-site anion of an $ABX_3$ 3 D composition may include one or more of iodide, bromide, and/or chloride. Similarly, the first A-site cation, i.e., the A'-site cation of the $A'_2A''B'_2X'_7$ quasi-2D perovskite-like phase, may include one or more of phenylethylammonium (PEA), guanidinium (GA), 4-flouorophenethylammonium (F-PEA), N-methyl-1,3-propane diammonium (ME-PDA), 1,4-butane diamine (BDA), N,N-dimethyl-1,3-propane diammonium (DMePDA), dipropylammonium, and/or diethylammonium. The second A-site cation, i.e., A"-site cation of the $A'_2A''B'_2X'_7$ quasi-2D perovskite-like phase, may include one or more of phenylethylammonium (PEA), guanidinium (GA), 4-flouorophenethylammonium (F-PEA), N-methyl-1,3-propane diammonium (ME-PDA), 1,4-butane diamine (BDA), N,N-dimethyl-1,3-propane diammonium (DMePDA), dipropylammonium, and/or diethylammonium. The B-site cation, i.e., the B'-site cation of the $A'_2A''B'_2X'_7$ quasi-2D perovskite-like phase, may include one or more of lead and/or tin and the X-site anion, i.e., the X'-site anion of the quasi-2D perovskite-like phase may include one or more iodide, chloride, and/or bromide. However, each composition of $ABX_3$ and $A'_2A''B'_2X'_7$ has one or more primary A-site cations, where the primary A-site cation of the $ABX_3$ 3 D perovskite phase is different from the primary A-site cations of the A'2A"B'2X'7 quasi-2D perovskite-like phase. However, each phase may contain measurable amounts of the other phase's primary A-site cation. For example, the primary A-site cation of a 3D perovskite, $ABX_3$, may include each of cesium, formamidinium, and methylammonium and the primary A-site cation of a quasi-2D perovskite, $A'_2A''B'_2X'_7$, may include each of PEA and GA. However, in addition, in some embodiments of the present disclosure, the A-sites of the 3D $ABX_3$ perovskite phase may also include measurable amounts of primary A-site cation of the quasi-2D perovskite-like phase, for example, at least one of PEA and/or GA, and the A-sites of the quasi-2D $A'_2A''B'_2X'_7$ perovskite-like phase may also include measurable amounts of the primary A-site cation of the 3D perovskite, for example, at least one of cesium, formamidinium, and/or methylammonium.

In some embodiments of the present disclosure, the B-site cation of the $ABX_3$ perovskite phase may be the same or different than the B-site cation (i.e., B') of the quasi-2D A'2A"B'2X'7 perovskite-like phase and the X-site anion of the $ABX_3$ perovskite phase may be the same or different than the X-site anion (i.e., X') of the quasi-2D $A'_2A''B'_2X'_7$ perovskite-like phase.

In some embodiments of the present disclosure, the perovskite phase may be in the form of a layer. Further, the perovskite phase may be present as a continuous phase, with the perovskite-like phase dispersed within the continuous perovskite phase. The continuous perovskite phase may include a plurality of grains separated by grain boundaries, where the dispersed perovskite-like phase may associate with the grain boundaries. In some embodiments of the present disclosure, the dispersed phase may form a coating that covers at least a portion of the grain boundaries separating adjacent crystals of the 3D perovskite phase, where the coating has a thickness between about 1 nm and about 100 nm, or between about 1 nm and about 10 nm. In some embodiments of the present disclosure, the grains forming the 3D perovskite phase may have a characteristic length between 300 nm and 1 µm. In some embodiments of the present disclosure, the grain boundaries between neighboring 3D perovskite grains may have a characteristic thickness between about 1 nm and about 50 nm. In some embodiments of the present disclosure, a quasi-2D perovskite-like phase may be substantially mixed with the 3D perovskite phase. In some embodiments of the present disclosure, a quasi-2D perovskite-like phase may be substantially present in the grain boundaries separating adjacent grains (i.e., individual crystals) of the 3D perovskite phase. In some embodiments of the present disclosure, a quasi-2D perovskite-like phase may be mixed within the other components making up a ground boundary, where other components may include unreacted perovskite precursors and/or other components unable to crystallize within the 3D perovskite phase. In some embodiments of the present disclosure, a quasi-2D perovskite-like phase may coat the other components making up a grain boundary, where "coat" refers to deposited onto, grown on, and/or positioned on a grain boundary. In some embodiments of the present disclosure, a quasi-2D perovskite-like phase may form a layer on a grain boundary, where the quasi-2D perovskite-like layer is positioned between a grain boundary and a neighboring 3D perovskite crystal. In some embodiments of the present disclosure, a quasi-2D perovskite-like phase may form a layer on a grain boundary, where the quasi-2D perovskite-like layer is positioned between the grain boundary and the 3D perovskite phase forming the crystal that is surrounded by the grain boundary.

In some embodiments of the present disclosure, the perovskite layer may have a thickness between about 200 nm and about 1000 nm. In some embodiments of the present disclosure, the amount of quasi-2D perovskite-like phase present in the 3D phase may be between 0.0001 wt % and 5 wt %, or between 0.1 wt % and 2 wt %. For example, when using 1M $(FASnI_3)_{0.6}(MAPbI_3)_{0.4}$, there is up to about 4 mM $(PEA)_2GAPb_2I_7$ present in the precursor solution. So, for the molecular weights of 574 for $(FASnI_3)_{0.6}(MAPbI_3)_{0.4}$ and 1607 for $(PEA)_2GAPb_2I_7$, the weight percent of quasi-2D perovskite-like phase is approximately 1.1%.

In some embodiments of the present disclosure, the A' cation may include an ammonium functional group, with examples including at least one of phenylethylammonium (PEA), guanidinium (GA), 4-flouorophenethylammonium (F-PEA), N-methyl-1,3-propane diammonium (ME-PDA), 1,4-butane diamine (BDA), N,N-dimethyl-1,3-propane diammonium (DMePDA), dipropylammonium, and/or diethylammonium. In some embodiments of the present disclosure, the A" cation may include an ammonium functional group, with examples including at least one of phenylethylammonium (PEA), guanidinium (GA), 4-flouorophenethylammonium (F-PEA), N-methyl-1,3-propane diammonium (ME-PDA), 1,4-butane diamine (BDA), N,N-dimethyl-1,3-propane diammonium (DMePDA), dipropylammonium, and/or diethylammonium, where A' is different than A".

In some embodiments of the present disclosure, the X anion may include a halide, such as at least one of iodide, bromide, and/or chloride. In some embodiments of the present disclosure, the B cation may include at least one of tin or lead. In some embodiments of the present disclosure, the B cation includes tin and lead. In some embodiments of the present disclosure, the A cation may include at least one of methylammonium (MA), formamidinium (FA), dimethylammonium, and/or cesium. In some embodiments of the present disclosure, the perovskite phase may have a stoichiometry approximately equal to $(FASnI_3)_{(1-x)}(MAPbI_3)_x$ where $0 \leq x \leq 1$.

In some embodiments of the present disclosure, the X' anion may include a halide, such as least one of iodide, bromide, or chloride. In some embodiments of the present disclosure, the B' cation may include at least one of tin or lead. In some embodiments of the present disclosure, the B' cation includes tin and lead. In some embodiments of the present disclosure, the perovskite-like material may have a stoichiometry approximately equal to $(PEA)_2(GA_{1-x-y}MA_xFA_y)(Pb_{1-z}Sn_z)_2(I_{1-m}Br_m)_7$, where PEA is an A' cation; GA is an A" cation; MA and FA are also A" cations, which may or may not be equal to an A cation used in the perovskite phase; both Pb and Sn are B' cations, which may or may not be equal to the B cation used in the perovskite phase; and both I and Br are X' anions, which may or may not be equal to the X anion used in the perovskite phase. In some embodiments of the present disclosure, the perovskite-like material may include have a stoichiometry approximately equal to $(PEA)_2(GA_{1-x-y}MA_xFA_y)(Pb_{1-z}Sn_z)_2I_7$. In some embodiments of the present disclosure, the perovskite-like material may have a stoichiometry approximately equal to include $(PEA)_2GAPb_2I_7$ where PEA is an A' cation; GA is an A" cation; Pb is a B' cation, and I is an X' anion.

As described below, compositions that include a perovskite phase and a perovskite-like phase, may be combined with other perovskite-containing compositions to form a tandem solar cell or module. For example, a composite layer (e.g., a dispersed quasi-2D perovskite-like phase positioned within a continuous 3D perovskite phase) may form a first junction having a first bandgap. This composite layer may then be combined with another perovskite layer, forming a second junction and having a second bandgap greater than the first bandgap. The composite layer may be positioned adjacent to the perovskite layer, resulting in a tandem (i.e., two junction) device.

In some embodiments of the present disclosure, the methods and compositions described herein may be utilized to improve a narrow-bandgap (approximately 1.25 eV) Sn—Pb perovskite based on $(FASnI_3)_{0.6}(MAPbI_3)_{0.4}$ (FA: formamidinium; MA: methylammonium), where both FA and MA are A-site cations, both Sn and Pb are B-site cations, and I is an X-site anion. As shown herein, a combination of phenethylammonium iodide (PEAI) and guanidinium thiocyanate (GASCN) provided to the perovskite precursor solution was found to significantly improve the quality of the Sn—Pb perovskite layers, resulting in low background carrier density (~$10^{14}$ cm$^{-3}$) and long bulk carrier lifetime (~9 μs). The formation of a quasi-2D perovskite-like $(PEA)_2GAPb_2I_7$ material and its incorporation into the 3D perovskite phase resulting from the use of mixed-cation additives was found to dramatically improve the optoelectronic properties of the resultant composition containing the quasi-2D perovskite-like phase dispersed within the 3D perovskite, wherein PEA$^+$ is an A' cation; GA$^+$ is an A" cation; Pb is a B' cation that is the same as one of the B cations of the perovskite phase; and I is an X' anion that is equal to the X anion of the perovskite phase. As shown herein, this new approach and the resultant new compositions enable the synthesis of narrow-bandgap Sn—Pb PSCs having ~22.1% efficiencies with open-circuit voltages ($V_{oc}$) greater than about 0.91 V. In addition, as shown herein, this exemplary efficient single-junction narrow-bandgap cell was successfully combined with an ~1.75-eV bandgap perovskite to make two-terminal tandem solar cells having power conversion efficiencies (PCE) as high as ~25.5% and open-circuit voltages ($V_{oc}$) greater than about 2.1 V. Moreover, it is shown herein that the resultant Sn—Pb narrow-bandgap and all-perovskite tandem devices using these narrow-bandgap compositions were stable, retaining about 82% and 80% of their respective maximum PCEs after 1,830 hours and 1,500 hours of continuous operation, respectively (at ISOS-L-1 conditions).

Figure 6:
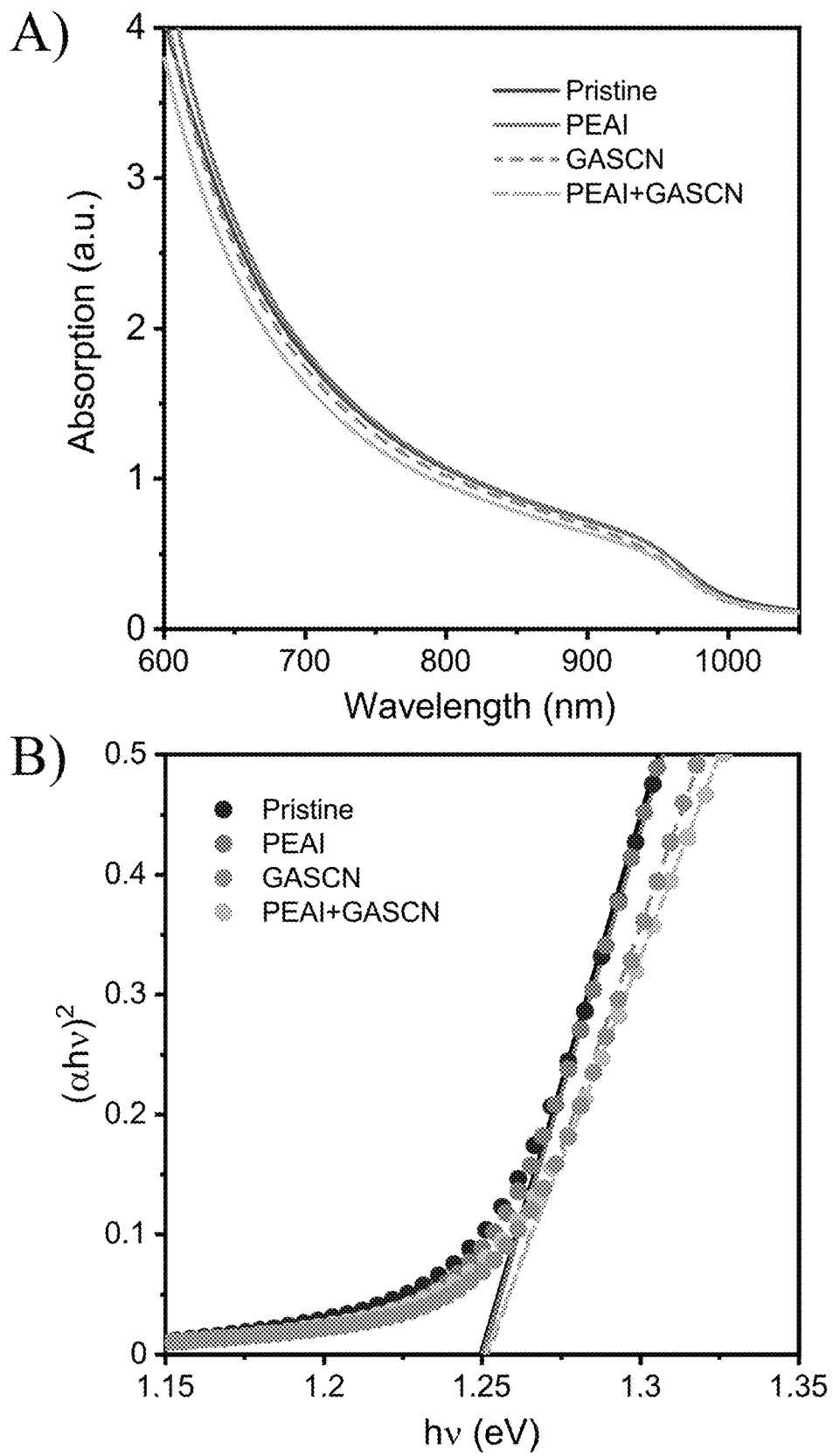
FIG. 6 illustrates optical absorption data of perovskite compositions as described herein, according to some embodiments of the present disclosure. Panel (A) illustrates UV-vis absorption spectra of narrow-bandgap perovskite layers prepared without (pristine) and with additives as indicated, according to some embodiments of the present disclosure. Panel (B) illustrates Tauc plots of the absorption spectra illustrated in Panel (A).
Figure 7:
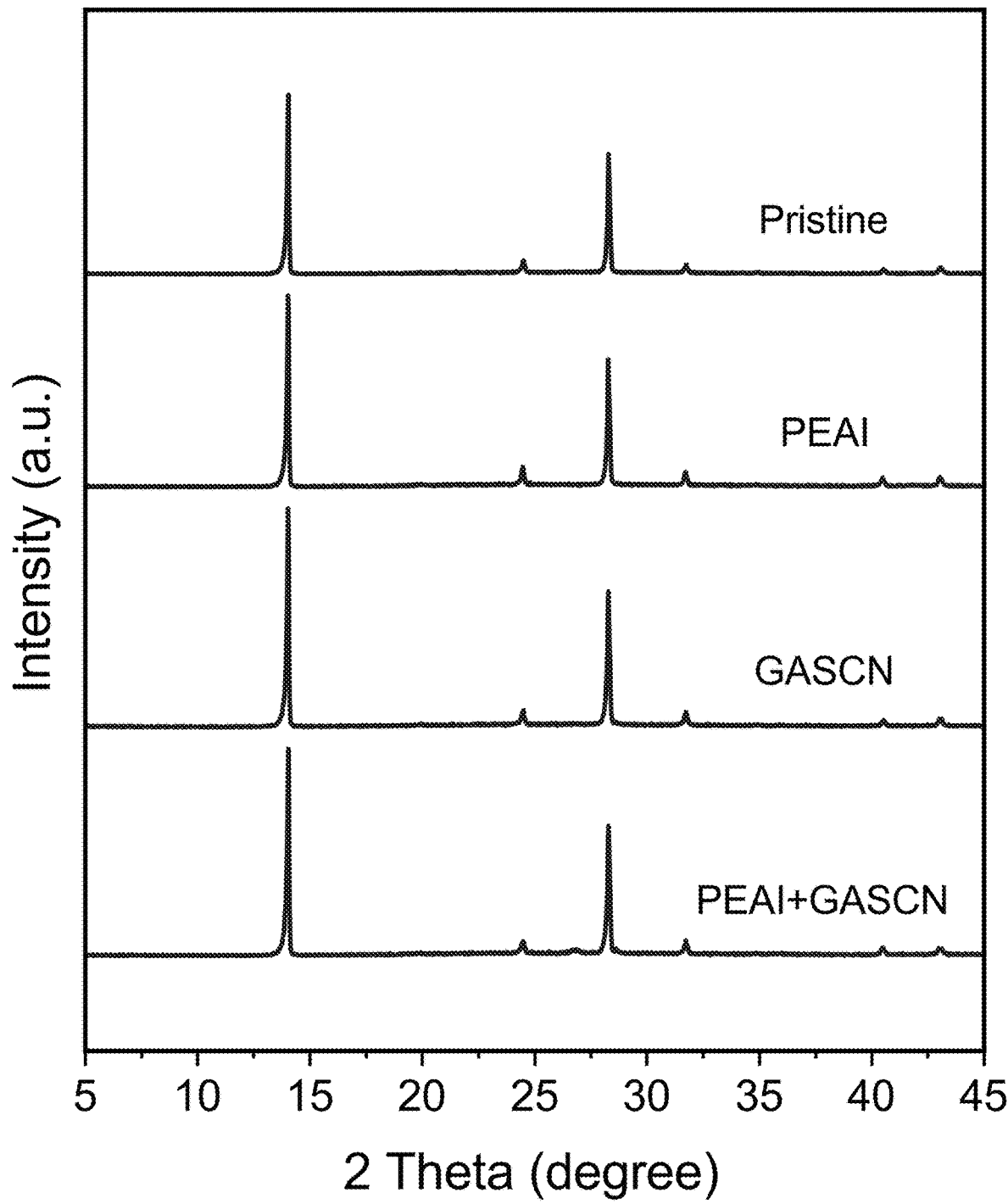
FIG. 7 illustrates XRD patterns of various narrow-bandgap perovskite layers prepared without (pristine) and with additives as indicated, according to some embodiments of the present disclosure.
Figure 8A:
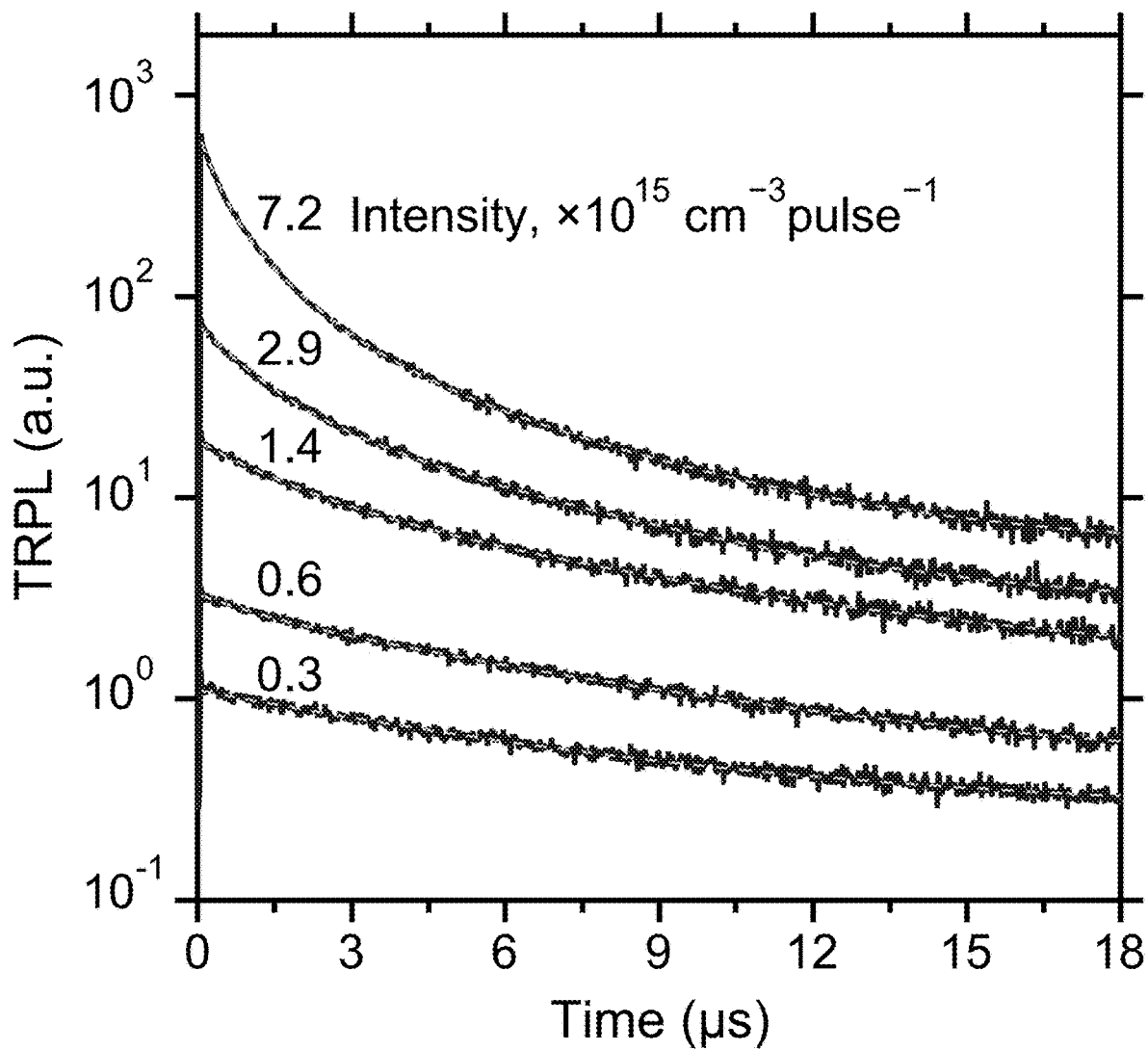
FIG. 8A illustrates time-resolved photoluminescence (TRPL) measurements of a ~0.800-nm-thick narrow-bandgap perovskite layer prepared with both of the PEAI and GASCN additives under different excitation intensities (injection levels), according to some embodiments of the present disclosure. The laser excitation wavelength was 640 nm.
Figure 8B:
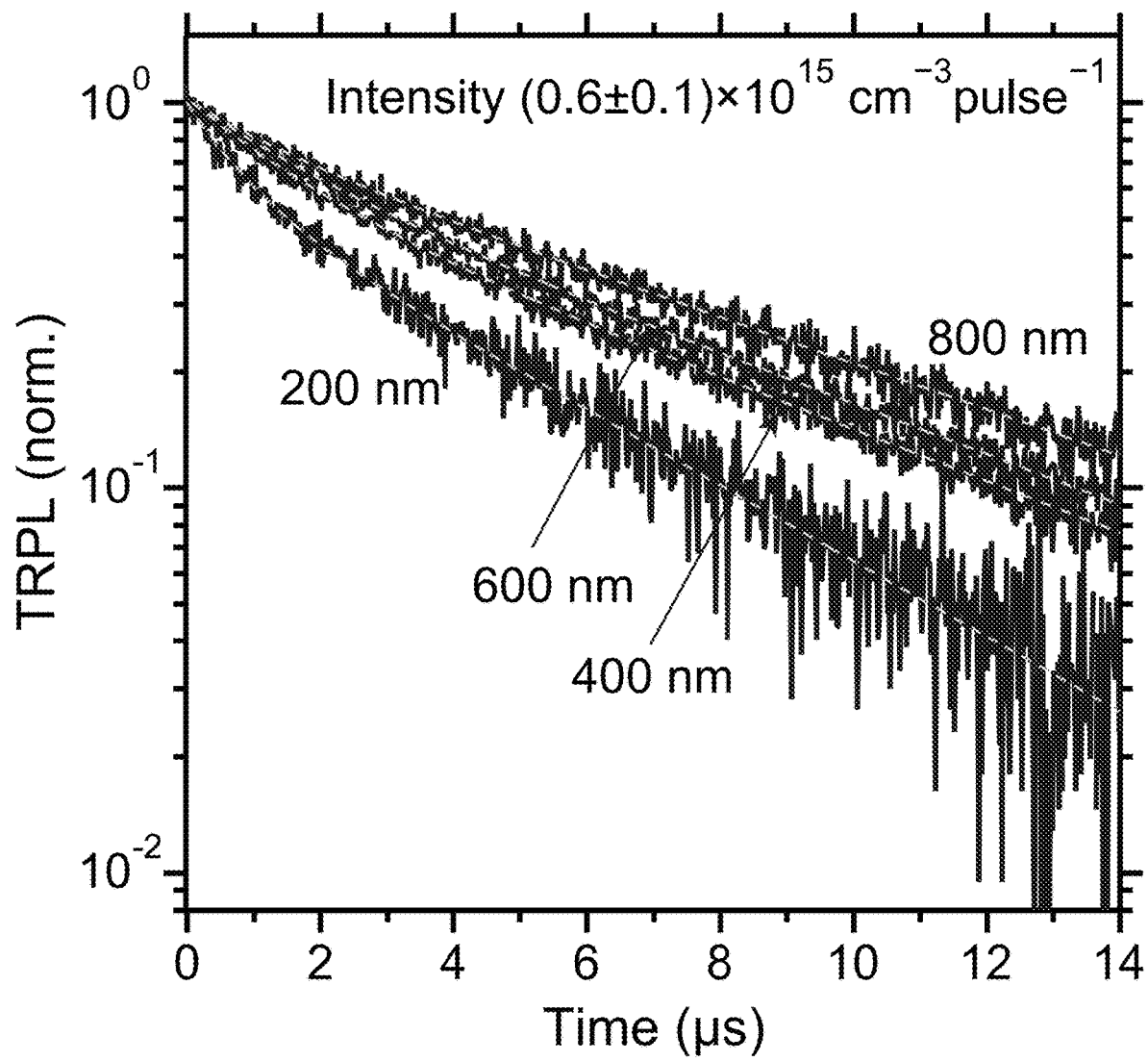
FIG. 8B illustrates TRPL measurements of perovskite layers with thicknesses varying from 200 nm to 800 nm, according to some embodiments of the present disclosure. The laser excitation wavelength was 640 nm.
Figure 8C:
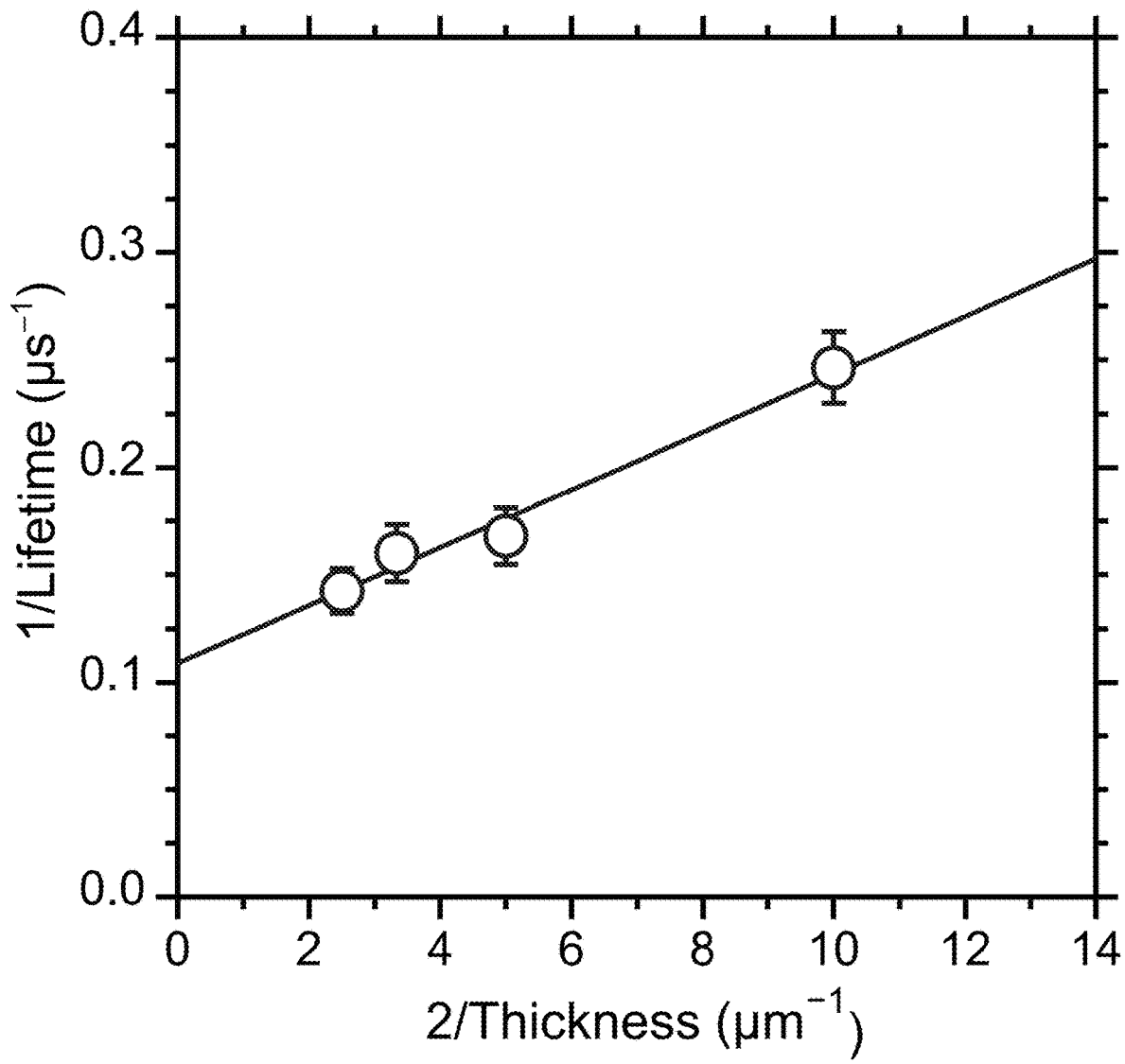
FIG. 8C illustrates the thickness dependence of the TRPL lifetime, according to some embodiments of the present disclosure. The laser excitation wavelength was 640 nm. The laser excitation wavelength was 640 nm.

A set of time-resolved photoluminescence (TRPL) measurements were conducted to examine the charge recombination kinetics in $(FASnI_3)_{0.6}(MAPbI_3)_{0.4}$ perovskite layers on glass substrates prepared using a combination of 2 mol % PEAI and 7 mol % GASCN in the perovskite precursor solution relative to the amount of MA$^+$ utilized in the precursor solution. The use of these materials did not affect the bandgap (~1.25 eV; see Panel B of FIG. 6) or the crystal structure (see FIG. 7). Panel A of FIG. 6 illustrates UV-vis absorption spectra of the narrow-bandgap perovskites used to generate the Tau plots illustrated in Panel B of FIG. 6. It was determined in this study that, that by using the combination of PEAI and GASCN as additives in the perovskite precursor formulation, the carrier lifetime was increased by an order of magnitude; from about 1 to about 10 μs and higher. FIG. 8A illustrates the TRPL decay at various excitation intensities (injection levels) of the perovskite layers made using both PEAI and GASCN in the perovskite precursor solutions. The effective average carrier lifetime was increased from about 2.5 to 7 μs when the injection density was decreased from $7.2 \times 10^{15}$ to ~$3\text{-}6 \times 10^{14}$ cm$^{-3}$pulse$^{-1}$. Next, the thickness dependence of TRPL decay kinetics was evaluated, to separate the contributions from the bulk and surface effects on charge carrier recombination. FIG. 8B shows the TRPL decay for perovskite layers with varying thickness from 200 nm to 800 nm with injection fixed at about $6 \times 10^{14}$ cm$^3$pulse$^{-1}$. The TRPL decay rate increased with reduced layer thickness, suggesting that surface recombination has a non-negligible impact on carrier recombination. In general, the measured TRPL lifetime ($\tau_{TRPL}$) can be related to the bulk recombination lifetime ($\tau_b$) and surface recombination velocity (S) by the following equation based on a simple double-heterostructure model, $$1/\tau_{TRPL} = 1/\tau_b + 2S/d \qquad \text{Equation 1}$$

where d is the layer thickness. Analyzing the thickness dependent TRPL results (see FIG. 8C) using Equation 1 yielded remarkable $\tau_b$ of ~9.2 μs and low S of ~1.4 cm/s. The low value of S corresponds to a "lifetime" for surface recombination of about 30 ms for an 800-nm-thick absorber layer, suggesting that for the Sn—Pb perovskite in this study, charge recombination is primarily determined by recombination processes in the bulk phase of the absorber layer.

Figure 8D:
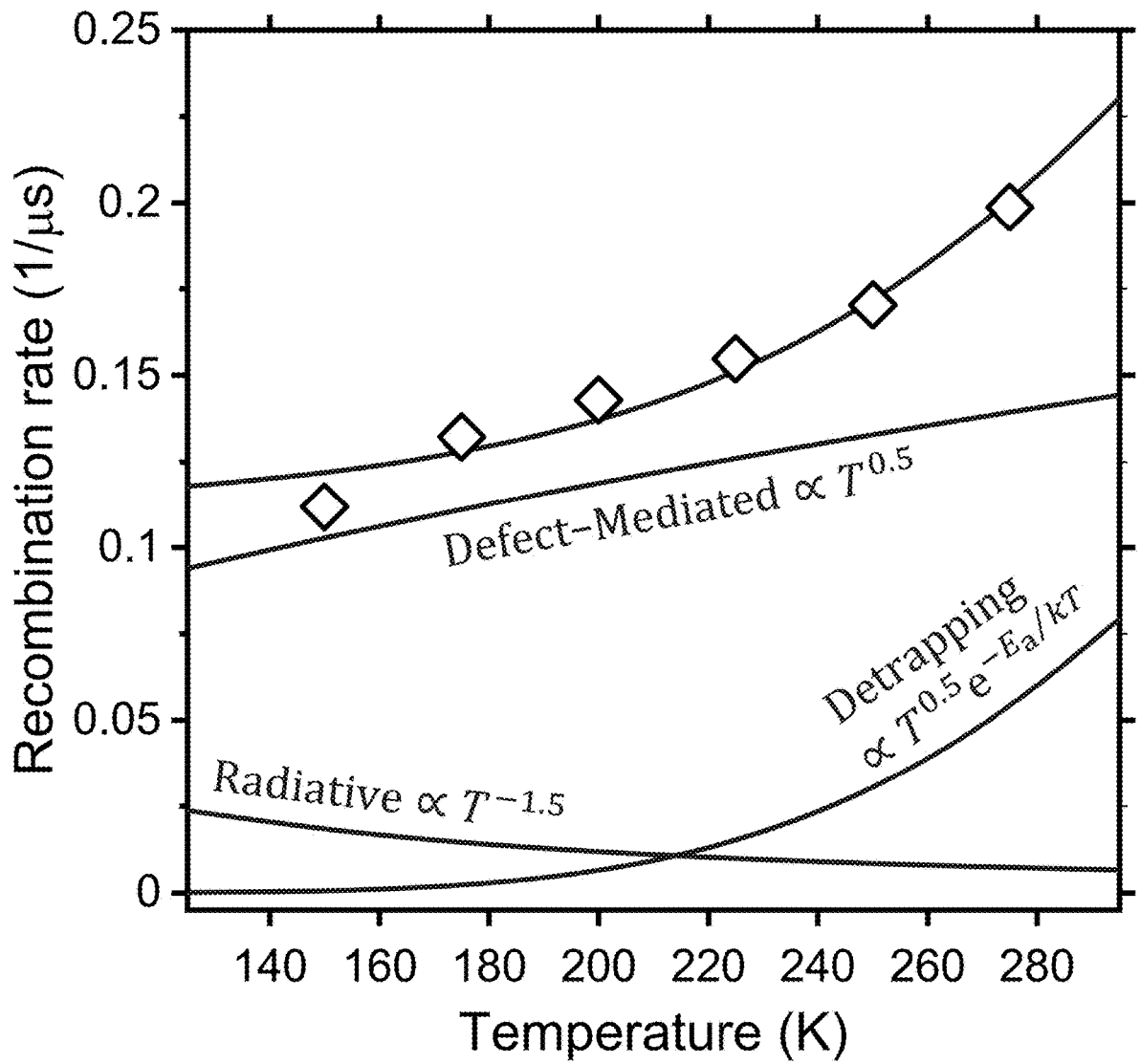
FIG. 8D illustrates the temperature dependence of recombination rate (or lifetime$^{-1}$) obtained from the TRPL measurements, according to some embodiments of the present disclosure. The laser excitation wavelength was 640 nm. T is the temperature, $E_a$ is the activation energy associated with shallow traps, and k is Boltzmann's constant.
Figure 9A:
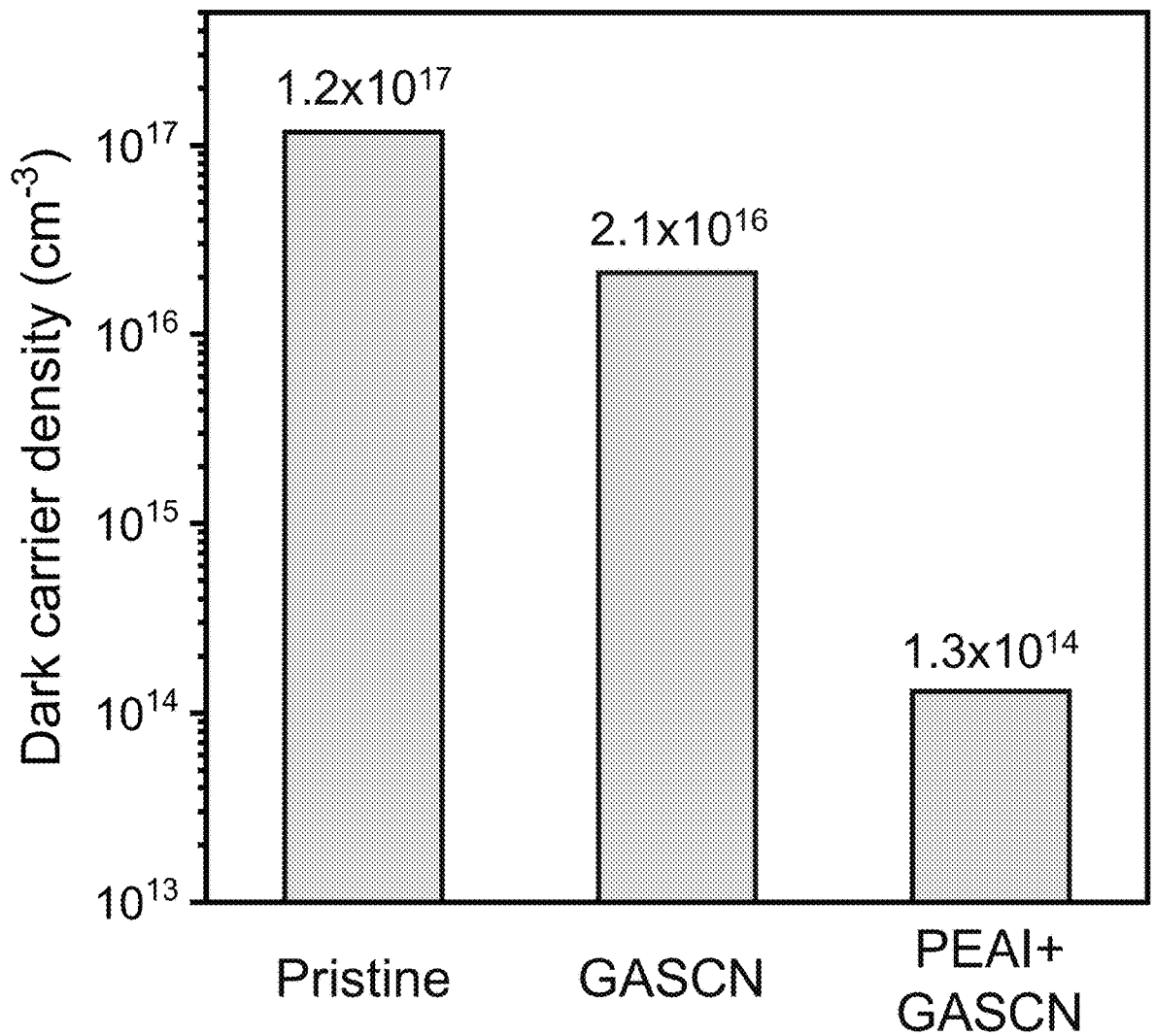
FIGS. 9A and 9B illustrate a comparison of dark carrier densities obtained from Hall effect measurements (FIG. 9A) and its correlation with the TRPL lifetime (FIG. 9B) for perovskite thin layers prepared with and without the use of a quasi-2D perovskite-like phase and as indicated, according to some embodiments of the present disclosure.

The bulk lifetime $T_b$ is affected by defect-mediated recombination and radiative recombination. The lifetime for radiative recombination is given by $t_{rad} = (BN_A)^{-1}$, where the radiative recombination coefficient B is about $(0.6\text{-}2) \times 10^{-10}$ cm$^3$/s and $N_A$ is the dark carrier (hole) density. With $N_A = 1.3 \times 10^{14}$ cm$^{-3}$ for the perovskite layer prepared with using both PEAI and GASCN additives in the perovskite precursor solution (see FIG. 9A), $\tau_{rad}$ was estimated to be between 38 ms and 128 ms; thus, the TRPL decay (see FIGS. 8A and 8B) is dominated by defect-mediated recombination. The same conclusion is obtained from the temperature (7) dependence of TRPL decay kinetics (see FIG. 8D). Note that trapping/detrapping from shallow traps could affect recombination kinetics. Analysis using a trap level/activation energy $E_a$ of 130 meV suggests that trapping/detrapping from shallow traps is not the main reason for the long carrier lifetime (see FIG. 8D). The same conclusion was obtained when the trap level was varied from about 100 meV to 170 meV, which is likely attributable to iodine vacancy and/or interstitial tin in Sn—Pb perovskites.

Figure 10:
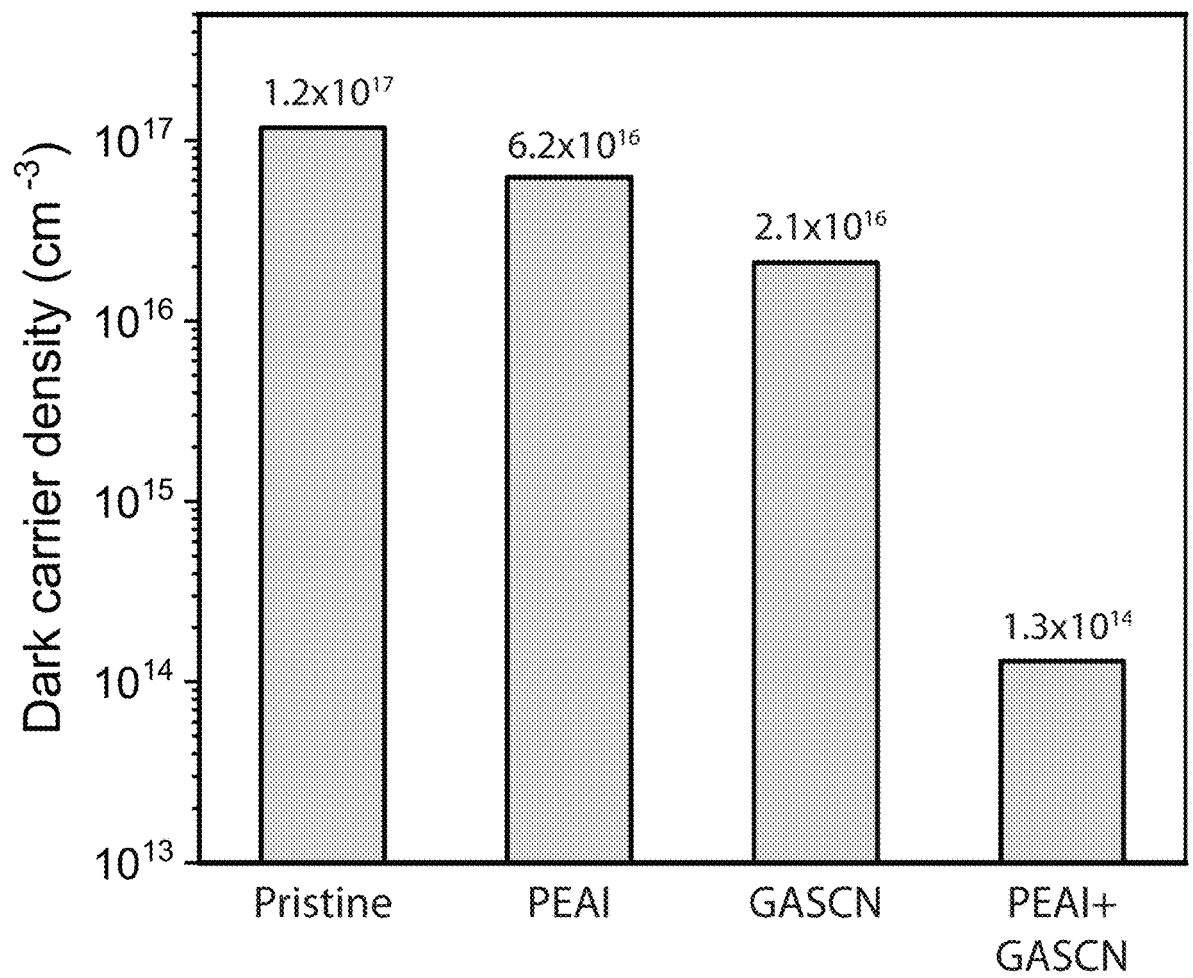
FIG. 10 illustrates Hall effect measurements of dark carrier densities for various narrow-bandgap perovskite layers prepared without (pristine) and with additives as indicated, according to some embodiments of the present disclosure.

To understand the reason for the long carrier lifetime, the Hall effect measurement was performed to examine the dark carrier (hole) density. In general, due to the facile oxidation of $Sn^{2+}$ to $Sn^{4+}$ and rapid crystallization of Sn-based perovskite layers, Sn-containing perovskites can exhibit >$10^{17}$ $cm^{-3}$ dark carrier density. The Hall effect measurement further confirmed the results that using GASCN can reduce the dark carrier density from about $1.2 \times 10^{17}$ to about $2.1 \times 10^{16}$ $cm^{-3}$ (see FIG. 9A and FIG. 10). However, when the combination of PEAI and GASCN is used in the perovskite precursor solution, the dark carrier density is reduced even more by more than two orders of magnitude, reaching ~$1.3 \times 10^{14}$ $cm^{-3}$ (see FIG. 9A). Such a low dark carrier density is unprecedented for Sn—Pb perovskites. These results suggest that due to the formation of quasi-2D perovskite-like phases within a 3D perovskite resulting from the use of the materials described herein, Sn—Pb perovskites can have recombination lifetimes and dark carrier densities comparable to perovskites containing only lead as the B-site cation.

Figure 9B:
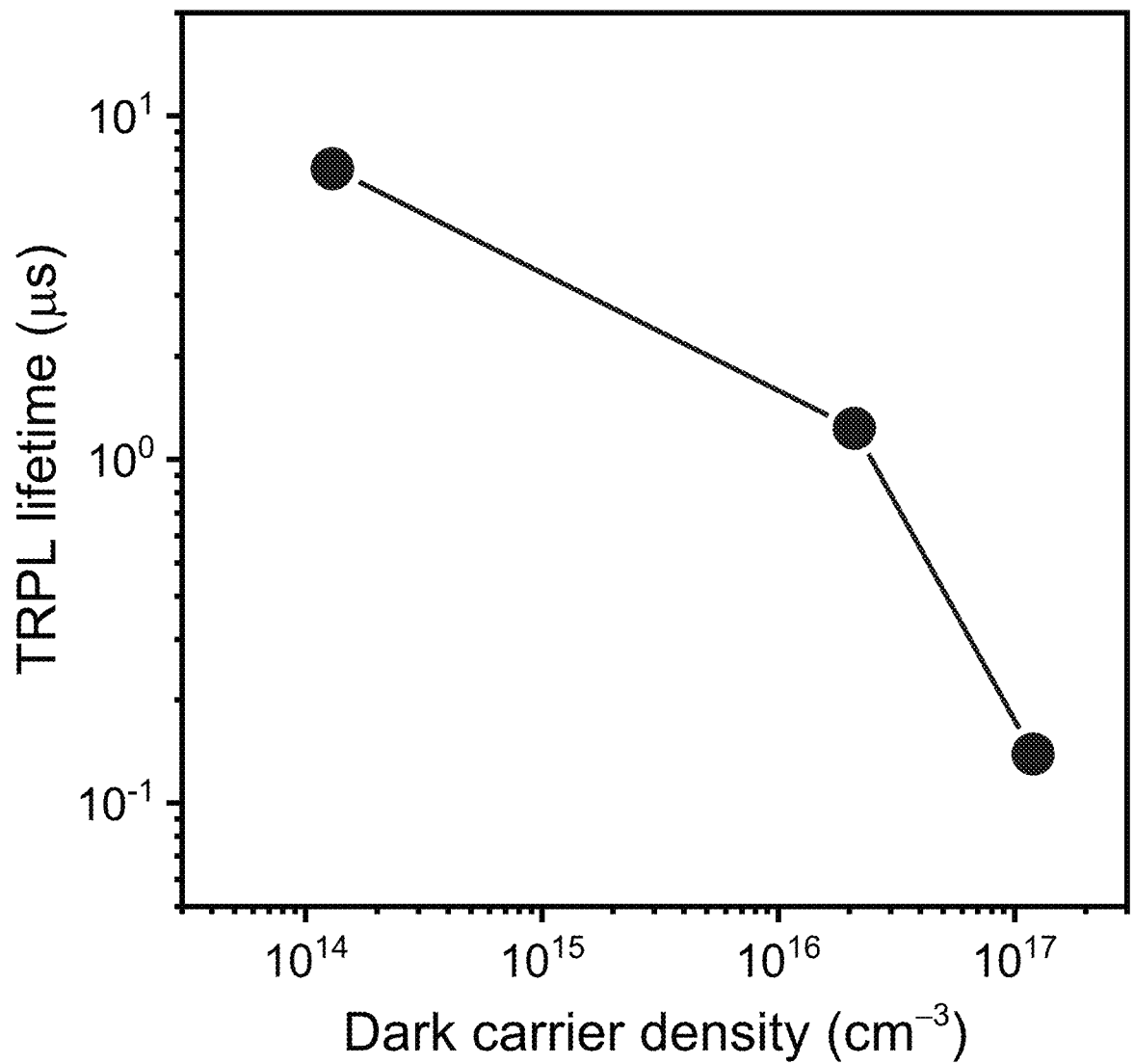

It is evident from these experimental results that the carrier lifetime increases with decreasing dark carrier density in the perovskite compositions tested herein (see FIG. 9B). Because the dark carrier density can be tuned by orders of magnitude, the relative importance of radiative and defect-mediated recombination is shown in this study to be variable. For example, the measured radiative lifetime for $N_A = 1.2 \times 10^{17}$ $cm^{-3}$ is ~100 ns. Therefore, the combination of PEAI and GASCN in a perovskite precursor solution offers the possibility to engineer the dark carrier density and lifetime, giving an effective route to PV performance optimization.

Figure 9C:
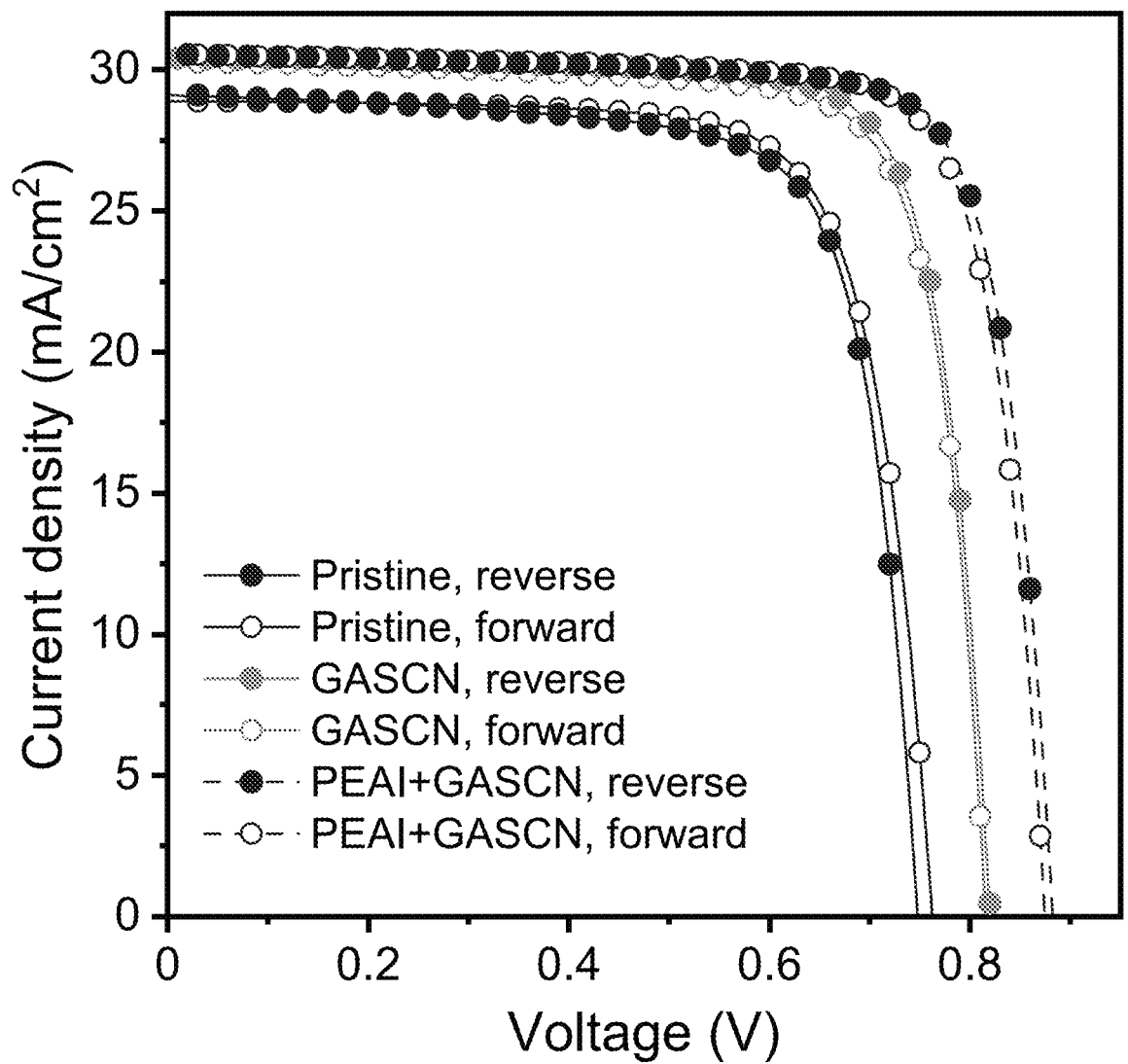
FIG. 9C illustrates a comparison of J-V characteristics of PSCs prepared with and without the use of a quasi-2D perovskite-like phase as indicated.

The low dark carrier density and long carrier lifetime are expected to significantly reduce the $V_{oc}$ deficit in Sn—Pb-based PSCs. FIG. 9C illustrates the typical current density-voltage (J-V) curves of narrow-bandgap PSCs based on perovskite layers with and without a quasi-2D perovskite-like phase. The $V_{oc}$ of these devices shows a clear increase from 0.747 V (pristine, i.e., no perovskite-like phase) to 0.820 V (having a perovskite-like phase resulting from the addition of GASCN used as an additive in the precursor solution) to 0.883 V (having a perovskite-like phase resulting from the addition of both PEAI and GASCN in the precursor solution) from the reverse scan. The detailed PV parameters for both reverse and forward scans for these devices are summarized in Table 1. The significant improvement of $V_{oc}$ when using the combination of PEAI and GASCN is consistent with reduced recombination associated with the low dark carrier density. The detailed balance limit for a single-junction solar cell with a 1.25-eV-bandgap absorber is $V_{oc} = 0.981$ V. Analysis of the solar cell external quantum efficiency (EQE; see FIG. 11) provides an upper estimate for the radiative limit for open-circuit voltage, $V_{oc}^{rad} = 0.973$ V. This analysis suggests that losses associated with band tails might be as low as 8 mV, highlighting the high optoelectronic quality of the Sn—Pb absorber. Comparison with the measured $V_{oc}$ indicates that all non-radiative recombination processes account for voltage losses of about 90 mV (and as low as 57 mV for the champion cell illustrated in FIG. 21A), comparable with the voltage losses observed for higher bandgap Pb-only devices.

TABLE 1

Typical photovoltaic parameters of narrow-bandgap perovskite solar cells prepared without (pristine) and with additives as indicated.

| Device | | $J_{sc}$ (mA $cm^{-2}$) | $V_{oc}$ (V) | FF (%) | PCE (%) |
|---|---|---|---|---|---|
| Pristine | Reverse | 29.11 | 0.747 | 0.749 | 16.3 |
| | Forward | 28.91 | 0.762 | 0.754 | 16.6 |

TABLE 1-continued

Typical photovoltaic parameters of narrow-bandgap perovskite solar cells prepared without (pristine) and with additives as indicated.

| Device | | $J_{sc}$ (mA $cm^{-2}$) | $V_{oc}$ (V) | FF (%) | PCE (%) |
|---|---|---|---|---|---|
| PEAI | Reverse | 29.86 | 0.765 | 0.753 | 17.2 |
| | Forward | 29.96 | 0.756 | 0.751 | 17.0 |
| GASCN | Reverse | 30.39 | 0.820 | 0.776 | 19.3 |
| | Forward | 30.30 | 0.816 | 0.781 | 19.3 |
| PEAI + GASCN | Reverse | 30.52 | 0.883 | 0.795 | 21.4 |
| | Forward | 30.53 | 0.875 | 0.792 | 21.2 |

Figure 9D:
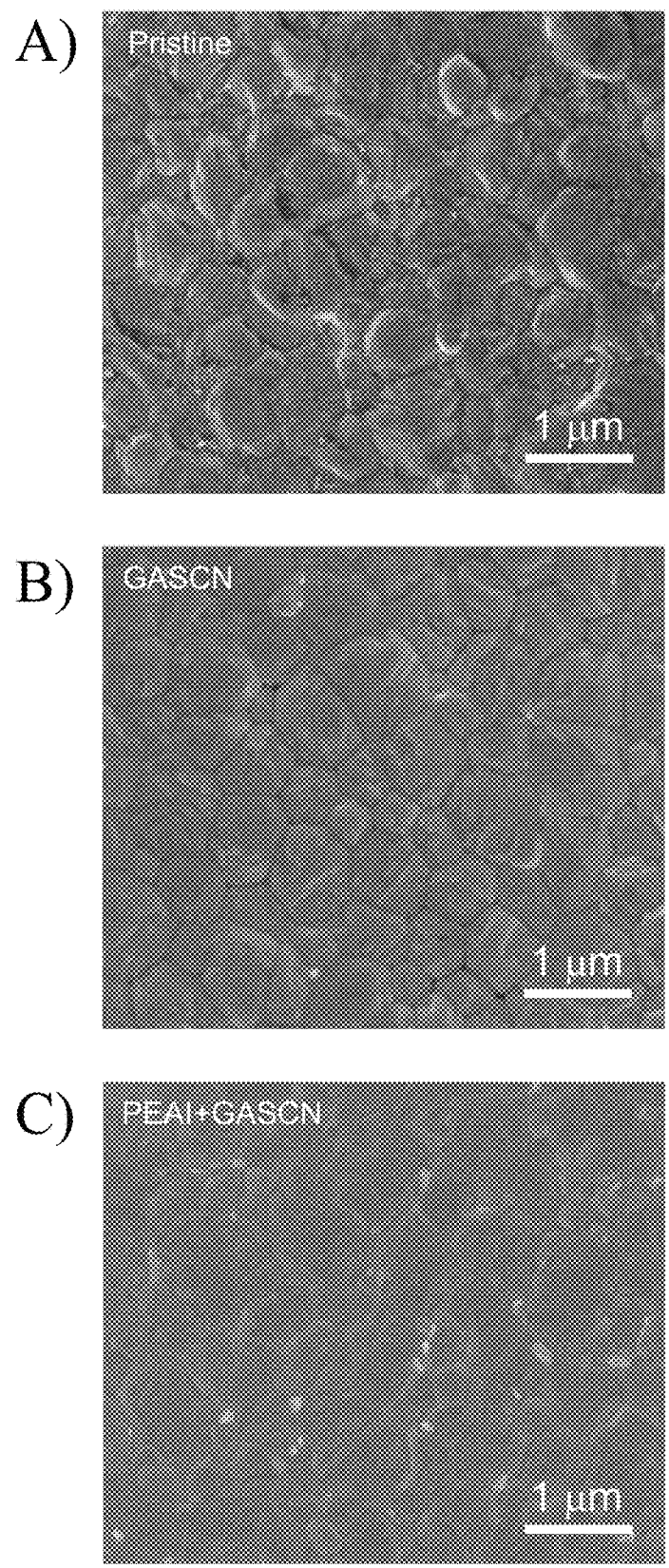
FIG. 9D illustrates SEM images of perovskite layers prepared with and without the use of an additive form forming a quasi-2D perovskite-like phase as indicated, according to some embodiments of the present disclosure. (Panel A) pristine without any additive, (Panel B) with GASCN, and (Panel C) with both PEAI and GASCN.
Figure 12:
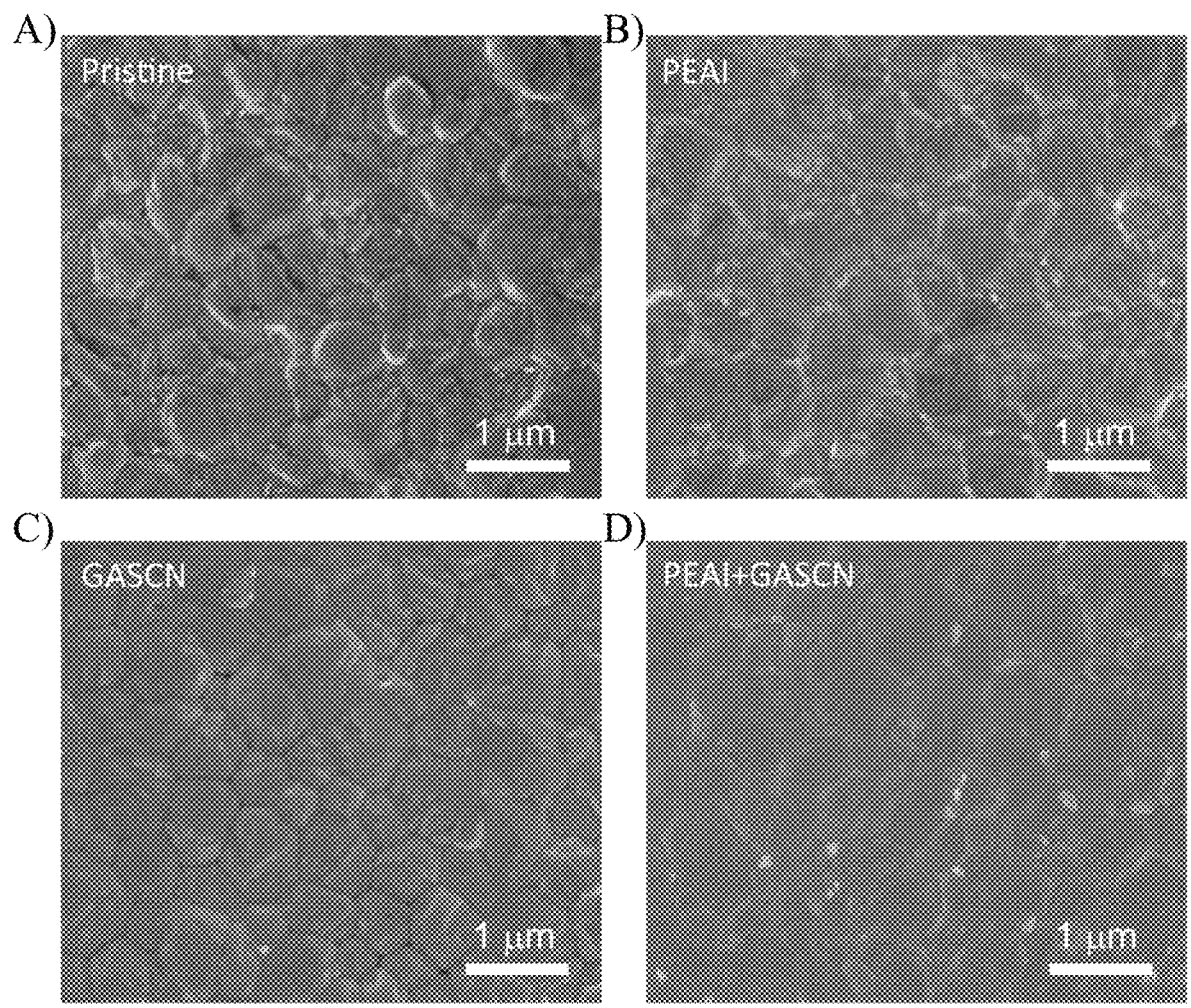
FIG. 12 illustrates scanning electron microscope (SEM) images of various narrow-bandgap perovskite layers prepared without (pristine) and with additives as indicated, according to some embodiments of the present disclosure.
Figure 13A:
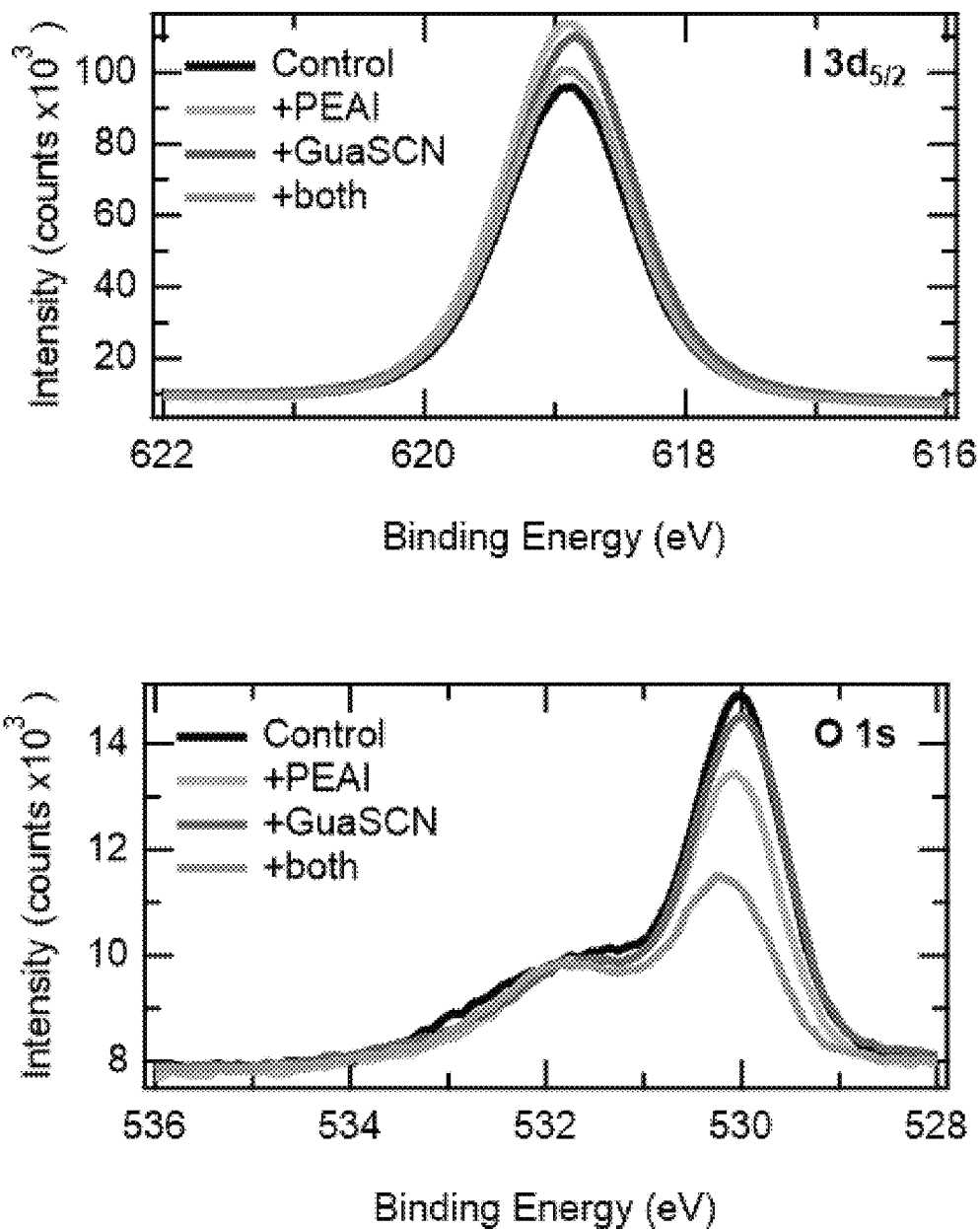
FIG. 13A-13D illustrate X-ray photoemission spectroscopy (XPS) core levels for a control sample (pristine), a sample resulting from the use of PEAI, a sample resulting from the use of GASCN, and a sample resulting from the use of both PEAI and GASCN in the perovskite precursor solution, according to some embodiments of the present disclosure. The corresponding XPS results are summarized in Tables 2 and 3.
Figure 13B:
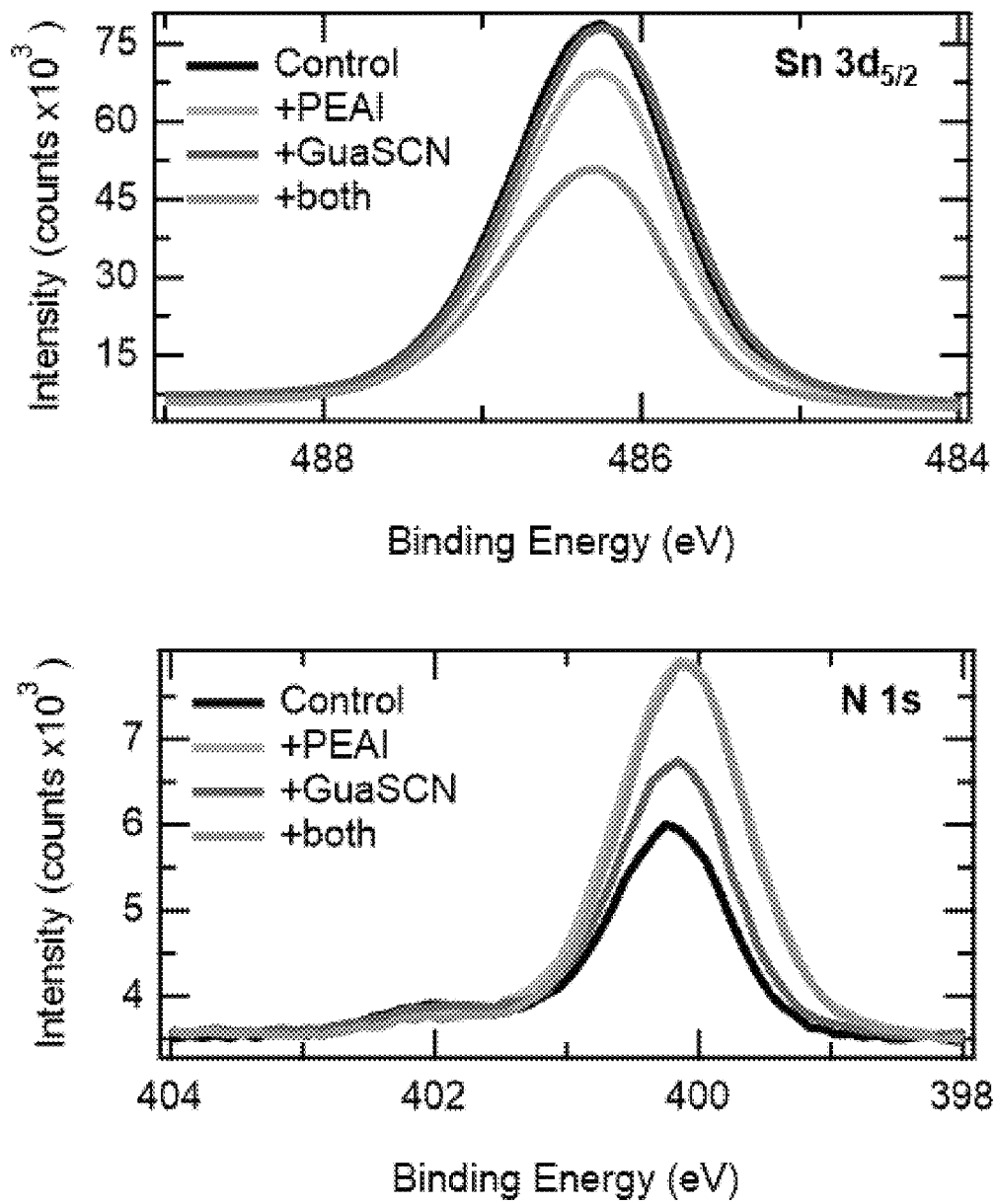
Figure 13C:
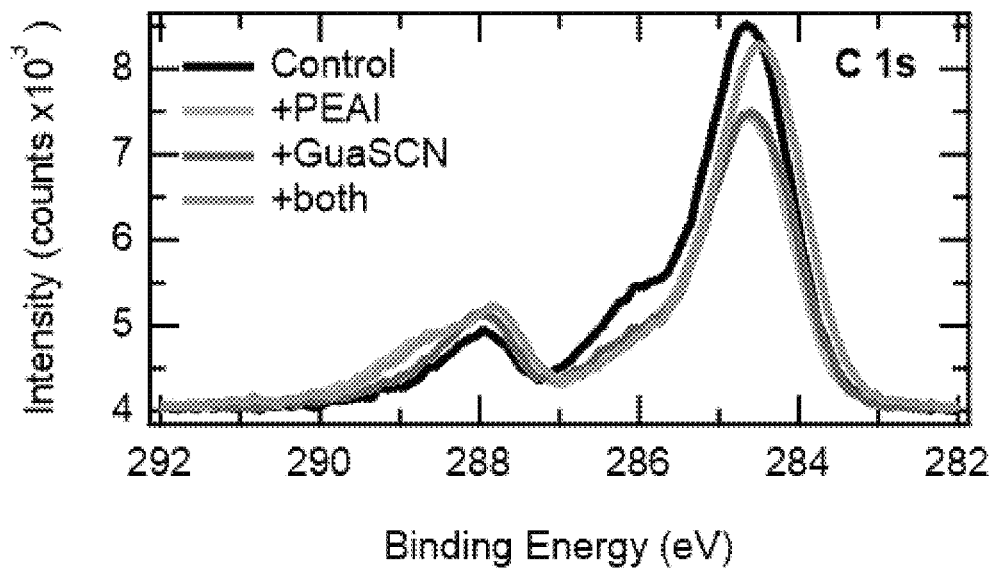
Figure 13C:
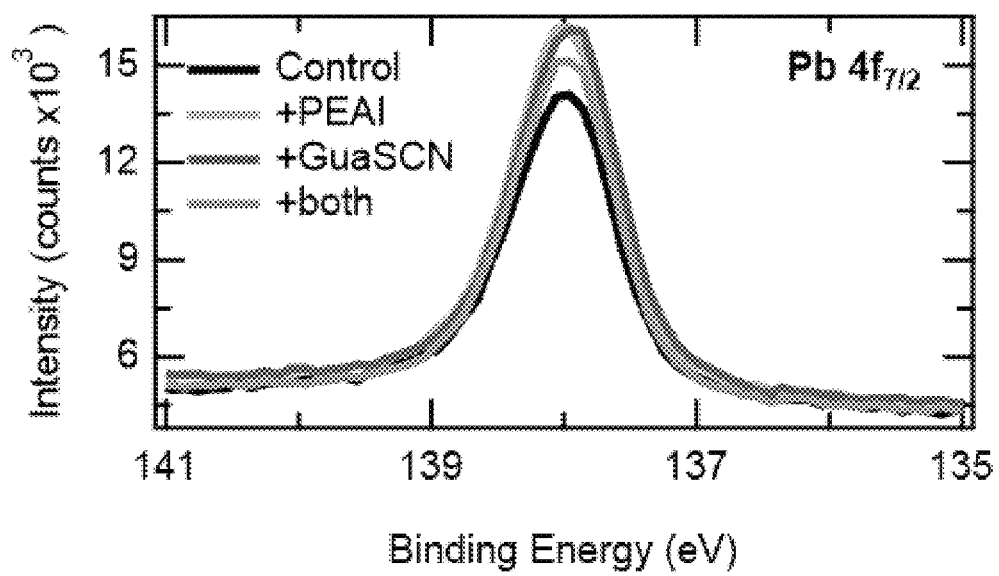
Figure 13D:
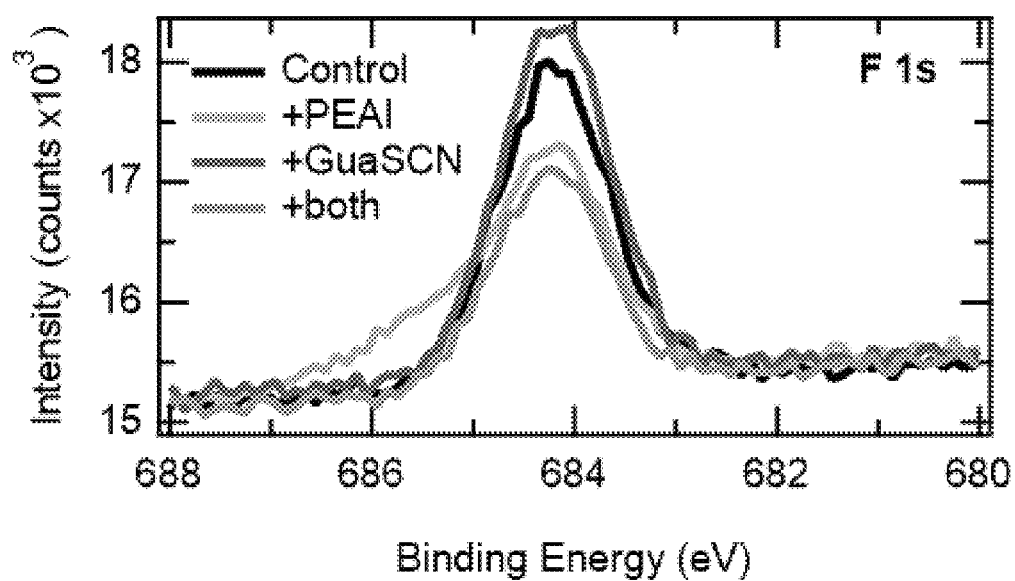

The improved optoelectronic properties of the composition resulting from the use of both PEAI and GASCN additives are also consistent with the layer morphologies (see Panels A-C of FIG. 9D, and FIG. 12) where the perovskite layer was prepared with the combination of PEAI and GASCN showed the smoothest layer surface with relatively large grain sizes and less clear grain boundaries. In addition, X-ray photoelectron spectroscopy (XPS) measurements (see FIGS. 13A-D and Tables 2 and 3) showed that the use of both PEAI and GASCN resulted in an organic halide rich surface region on the perovskite phase and significantly reduced overall oxidation, which is consistent with the reduction of dark carrier density in Sn—Pb perovskites.

TABLE 2

Elemental composition of the surfaces for the control sample and each of the additives, as determined by the XPS core levels displayed in FIGS. 13A-D.

| Sample | C 1s | N 1s | O 1s | F 1s | Sn $3d_{5/2}$ | I $3d_{5/2}$ | Pb $4f_{7/2}$ |
|---|---|---|---|---|---|---|---|
| Control | 28.9 | 6.5 | 15.9 | 3.4 | 22.9 | 19.6 | 2.7 |
| PEAI | 24.6 | 8.0 | 15.0 | 3.7 | 22.9 | 22.7 | 3.2 |
| GASCN | 24.9 | 11.8 | 13.8 | 3.0 | 19.6 | 23.8 | 3.1 |
| PEAI + GASCN | 31.2 | 12.4 | 11.4 | 2.5 | 16.1 | 23.2 | 3.2 |

TABLE 3

Relative elemental ratios based on elemental compositions summarized in Table 2.

| Sample | Sn:Pb | I:(Sn + Pb) | N:(Sn + Pb) | I:(Sn + Pb + N) |
|---|---|---|---|---|
| Control | 8.40 | 0.77 | 0.25 | 0.61 |
| PEAI | 7.22 | 0.87 | 0.31 | 0.67 |
| GASCN | 6.32 | 1.05 | 0.52 | 0.69 |
| PEAI + GASCN | 5.05 | 1.20 | 0.64 | 0.73 |

To understand the role of using the combination of $GA^+$ with $PEA^+$ for Sn—Pb perovskite synthesis, structural analysis was also completed. Without wishing to be bound by theory, it may be hypothesized that the use of the combination of PEAI and GASCN in a perovskite precursor solution leads to the formation of 2D and/or quasi-2D perovskite-like structures. To test this hypothesis and understand how $PEA^+$ and $GA^+$ compete in forming 2D and/or quasi-2D perovskite-like structures, the XRD patterns resulting from the use of different $GA^+$:$PEA^+$ mixing ratios were studied. To simplify the comparison, only GAI was used as the source for $GA^+$ as it is known that $SCN^-$ easily escapes from the perovskite layers during preparation.

Figure 14A:
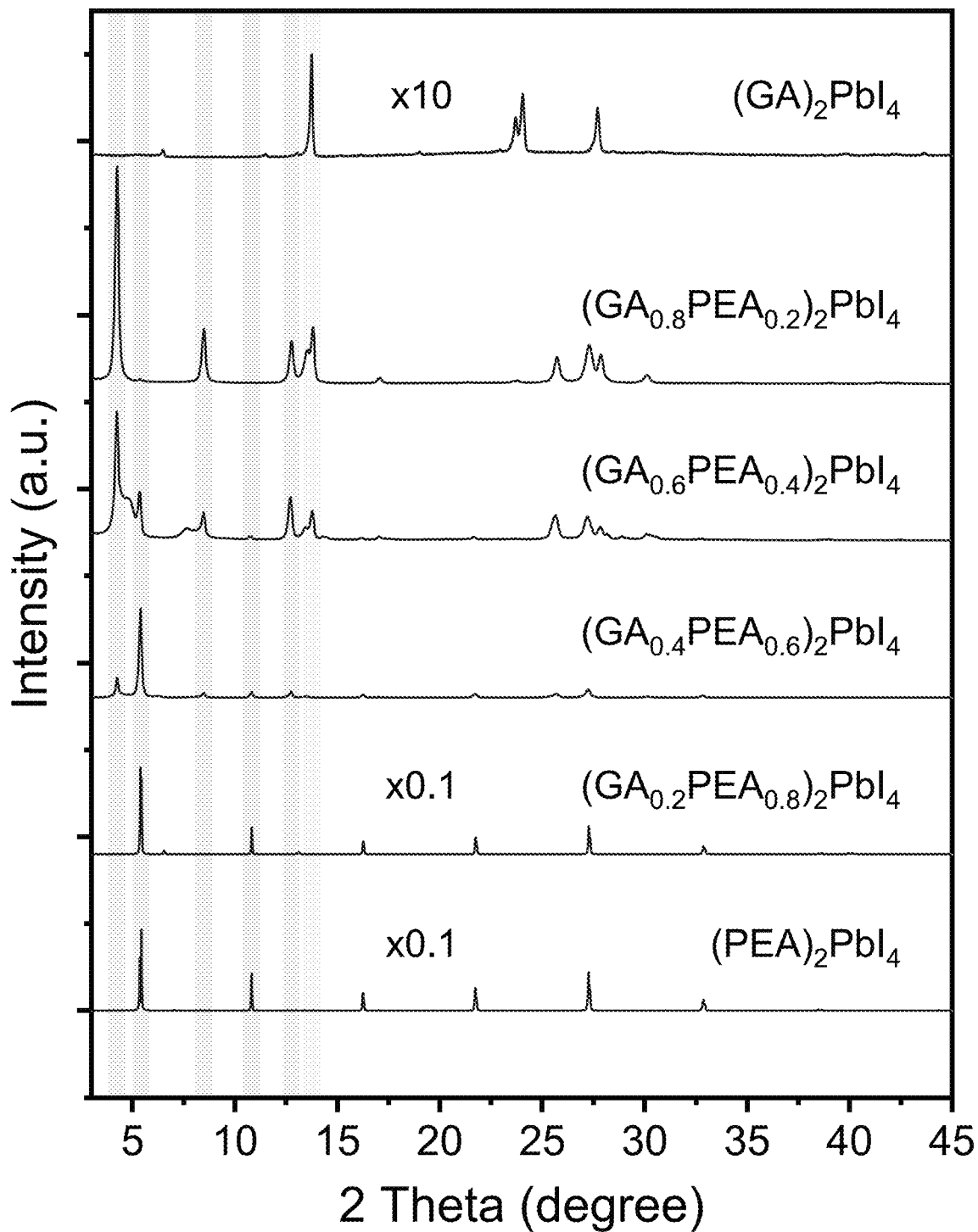
FIG. 14A illustrates a comparison of XRD patterns of quasi-2D perovskite layers resulting from varying the degrees of GA:PEA mixing ratios used in the precursor solutions, as indicated by the low-angle diffraction peaks below 14 degrees, according to some embodiments of the present disclosure. The quasi-2D perovskite structure was obtained, despite using a starting precursor stoichiometry associated with 2D perovskites, $A_2PbI_4$ for A having a 1+ charge. X-ray source: Cu Kα radiation.

FIG. 14A illustrates the evolution of diffraction patterns with the $GA^+$:$PEA^+$ mixing ratio spanning a range from 0:1

Figure 14B:
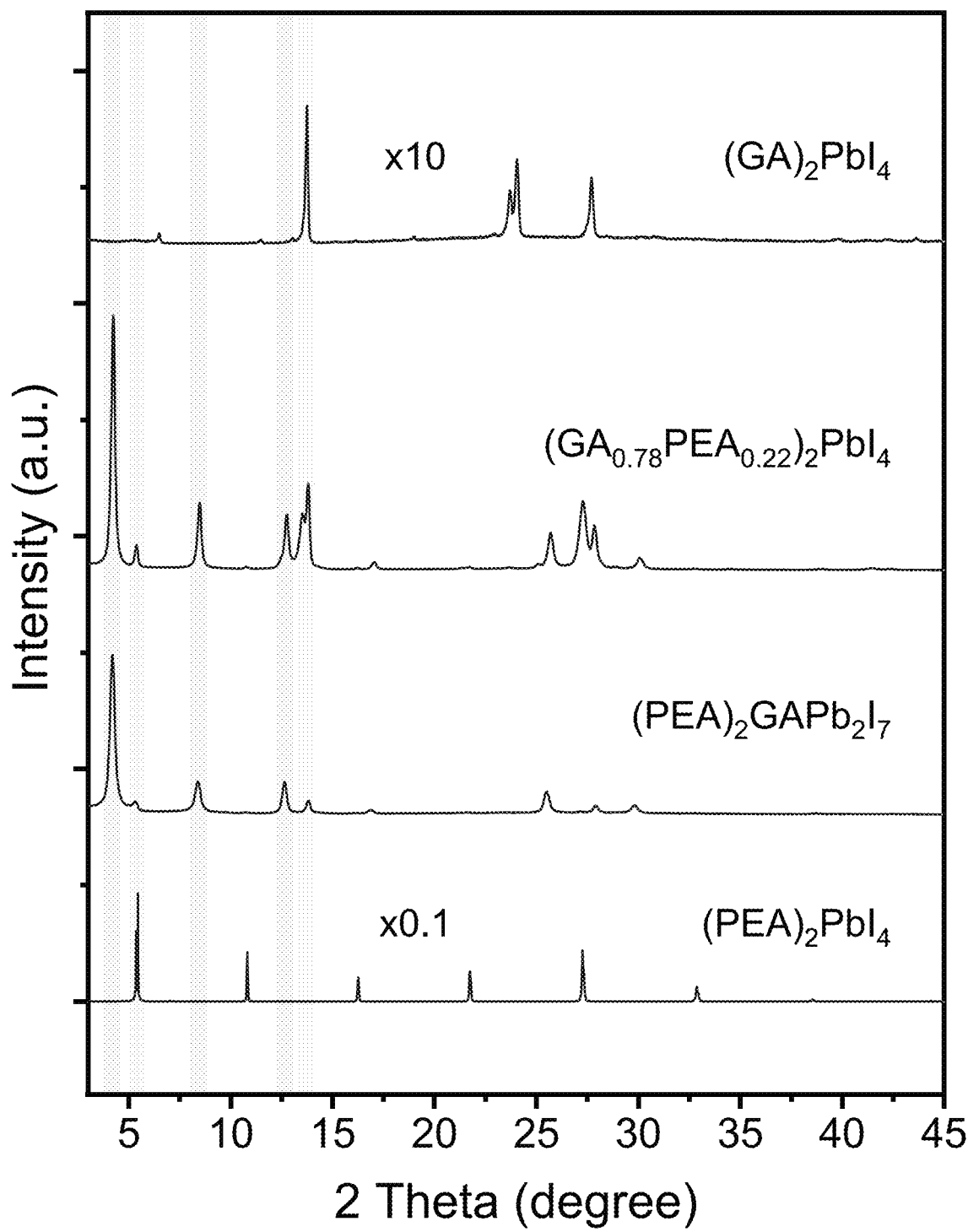
FIG. 14B illustrates a comparison of the XRD patterns of quasi-2D perovskite layers resulting from a GA:PEA ratio of about 7:2 (mol basis) and $(PEA)_2GAPb_2I_7$ perovskite along with that of a 2D $(GA)_2PbI_4$ perovskite and a 2D $(PEA)_2PbI_4$ perovskite, according to some embodiments of the present disclosure. X-ray source: Cu Kα radiation.

(PEA$_2$PbI$_4$) to 1:0 (GA$_2$PbI$_4$) with a systematic change observed in the low diffraction angle region. The samples were prepared using the A$_2$PbI$_4$ stoichiometry in the perovskite precursor, corresponding to n=1 pure 2D perovskite. However, the material actually formed as quasi-2D, with n=2, perovskite-like crystal structures as reflected by the low-angle diffraction peaks (below 14 degrees). FIG. 14B illustrates the presence of both 2D perovskite structures (n=1) and quasi-2D (n=2) perovskite-like structures. (PEA)$_2$GAPb$_2$I$_7$ was prepared using n=2 quasi-2D stoichiometry in the perovskite precursor, whereas the others were prepared using A$_2$PbI$_4$ 2 D stoichiometry. The layer based on (GA$_{0.78}$PEA$_{0.22}$)$_2$PbI$_4$ precursor displayed n=2 quasi-2D diffraction features as indicated by the low-angle diffraction peaks (below 14 degrees) in the XRD data.

Figure 15:
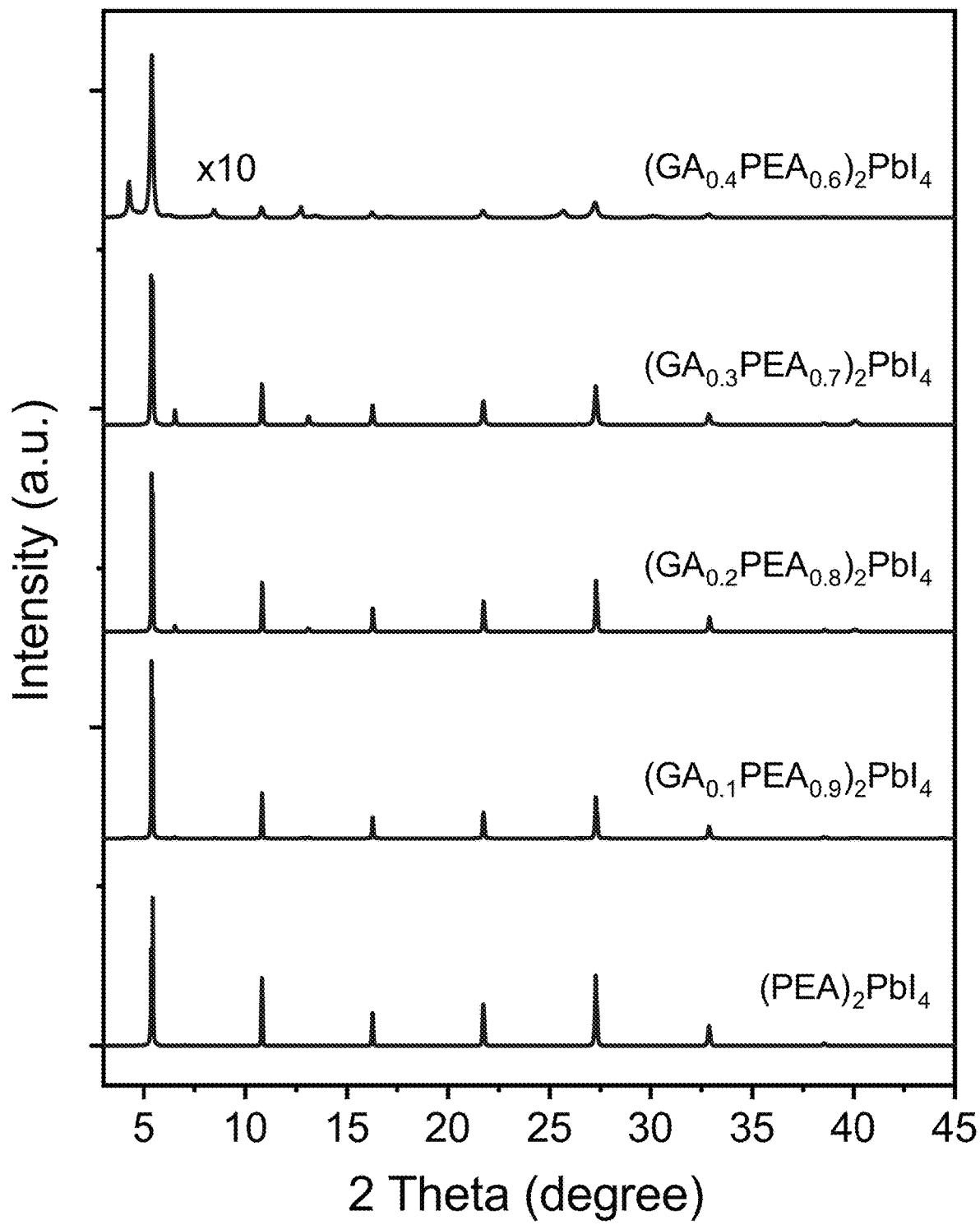
FIG. 15 illustrates XRD patterns of 2D perovskites obtained using different GA:PEA mixing ratios from 0:1 to 0.4:0.6 in the precursor solution, according to some embodiments of the present disclosure.
Figure 16:
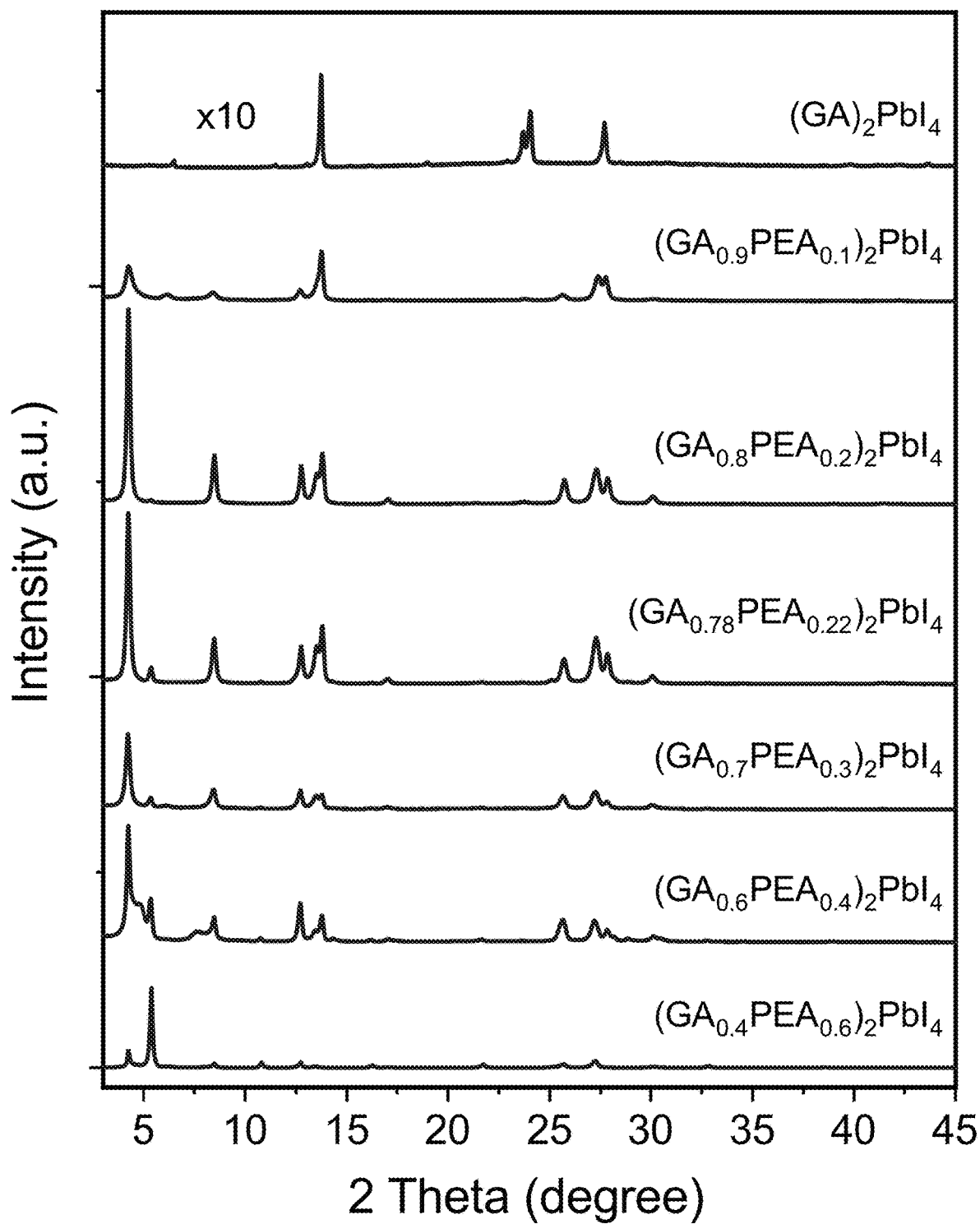
FIG. 16 illustrates XRD patterns of 2D perovskites obtained using different GA:PEA mixing ratios from 0.4:0.6 to 1:0 in the precursor solution, according to some embodiments of the present disclosure.
Figure 17:
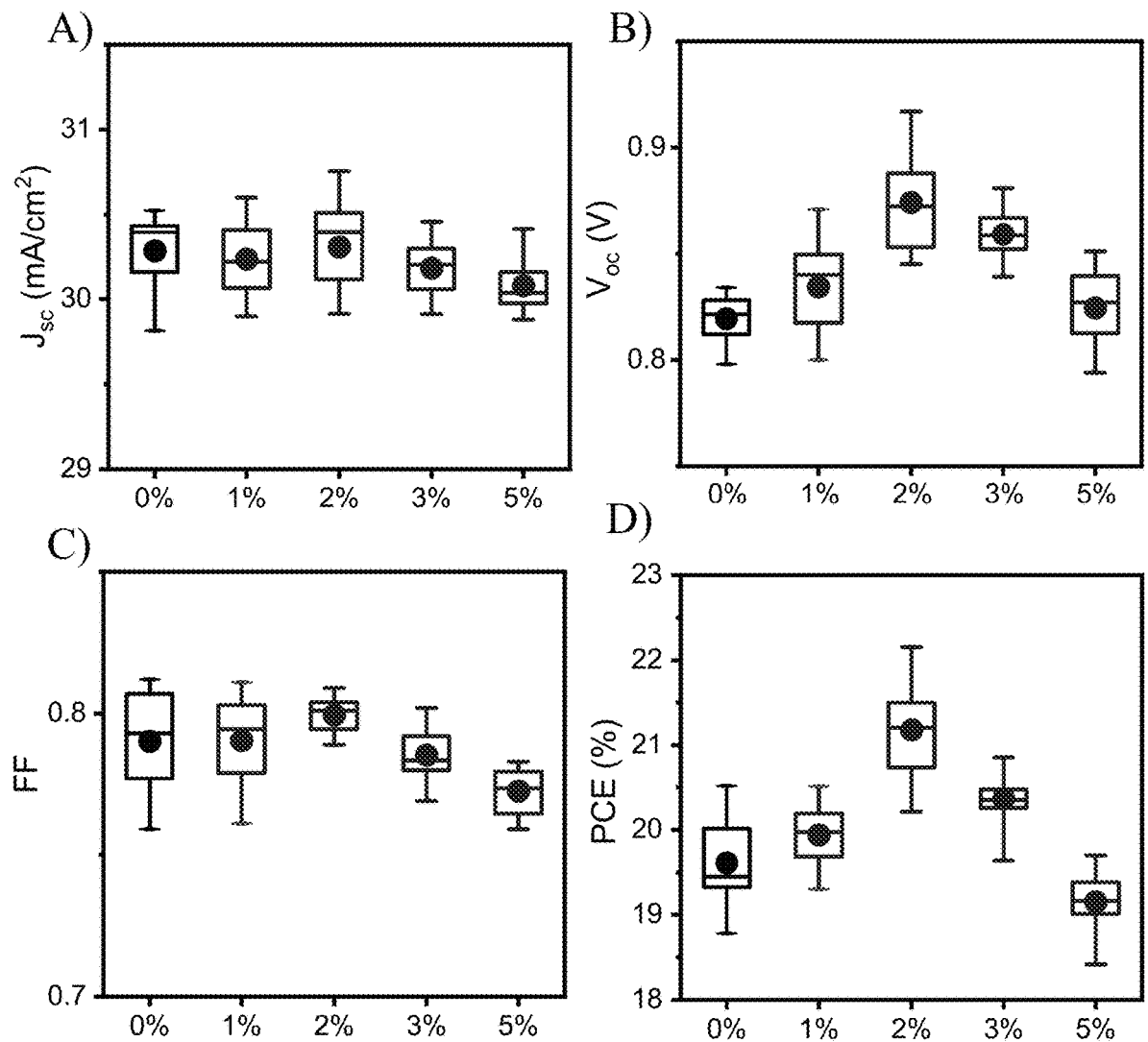
FIG. 17 illustrates PEAI concentration dependence of device characteristics, according to some embodiments of the present disclosure. (Panel A) Short-circuit photocurrent density ($J_{sc}$), (Panel B) open-circuit voltage ($V_{oc}$), (Panel C) fill factor (FF), and (Panel D) power conversion efficiency (PCE) of narrow-bandgap perovskite solar cells prepared with different amounts of PEAI additive ranging from 0 mol % to 5 mol % in the precursor solutions. For all these devices, 7 mol % GASCN was used. All the additive concentrations are mole ratios with respective to MAI. These figures show that the optimum concentration for PEAI is at about 2 mol %.

The main diffraction peaks (about 5.4° and 10.8°) from PEA$_2$PbI$_4$ decreased whereas the main peak (about 13.8°) from GA$_2$PbI$_4$ increased with an increasing GA$^+$:PEA$^+$ ratio. When the GA$^+$:PEA$^+$ ratio increased to above 0.4:0.6, three new diffraction peaks (about 4.3°, 8.5°, and) 12.8° emerged, which continued to increase with higher GA$^+$ up to about to a ratio of about 0.8:0.2; more detailed structural evolution with increasing GA$^+$:PEA$^+$ ratios is illustrated in FIGS. 15 and 16. The low-angle diffraction peaks suggest that the competition of GA$^+$ and PEA$^+$ in the precursor likely resulted in the formation of new 2D/quasi-2D structures, where 2D corresponds to n=1 as illustrate in Panel A of FIG. 4 and quasi-2D corresponds to n=2, each according to the formula (A')$_m$(A")$_{n-1}$B'$_n$X'$_{3n+1}$, where when monovalent m=2 or when divalent m=1. FIG. 14B compares the XRD pattern based on a mixing ratio of 0.78:0.22 corresponding to GA$^+$:PEA$^+$=7:2 as used in the optimal Sn—Pb perovskite precursor to that of PEA$_2$GAPb$_2$I$_7$ n=2 2D film; the XRD patterns of GA$_2$PbI$_4$ and PEA$_2$PbI$_4$ are also shown for comparison. This is illustrated in FIG. 17, which illustrates the impact of varying PEAI concentration on the device performance. The amount of PEAI additive was changed from 0 mol % to 5 mol %, whereas the GASCN additive was fixed at 7 mol %. All the additive concentrations are mole ratios with respect to MAI used in the precursor. The results show varying the PEAI concentration strongly affect the V$_{oc}$ and PCE, reaching a peak value at about 2 mol %, giving rise to an optimum mixed ratio of about 7:2 for GASCN:PEAI.

Figure 14C:
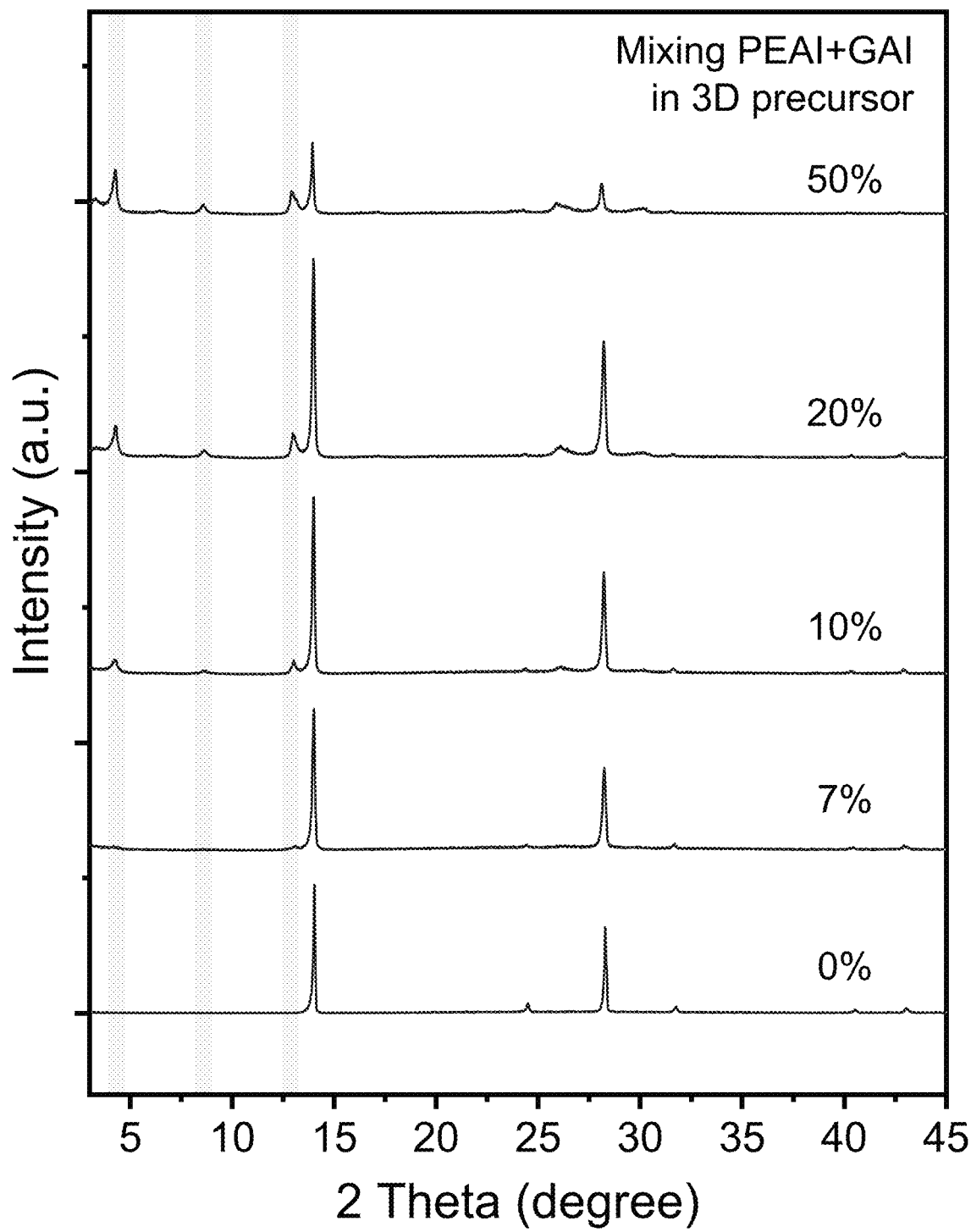
FIG. 14C illustrates a comparison of XRD patterns of 3D Sn—Pb perovskite precursor solutions when using different amounts of PEAI and GAI additives, according to some embodiments of the present disclosure. X-ray source: Cu Kα radiation.
Figure 18:
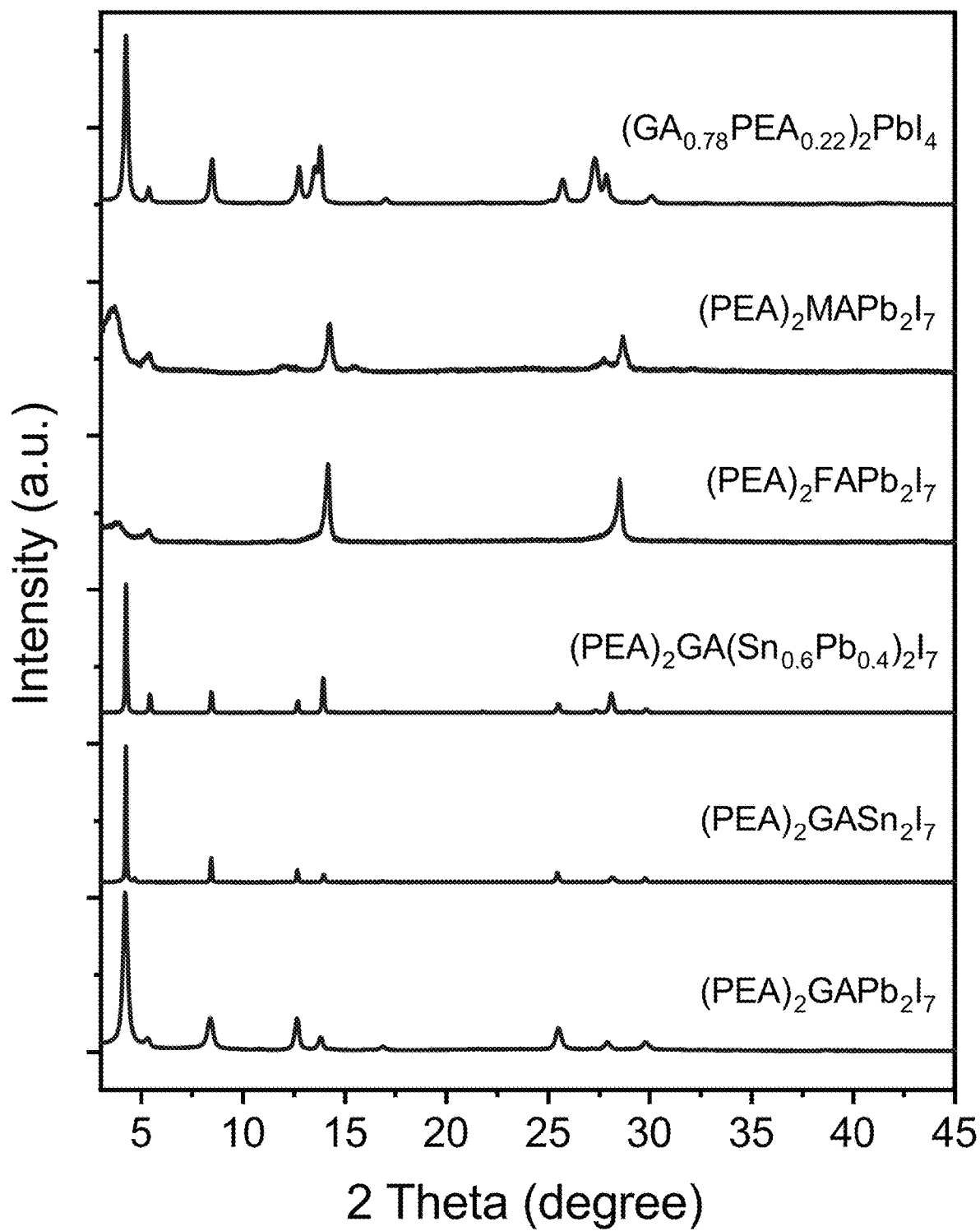
FIG. 18 illustrates XRD patterns of various 2D (i.e., n=2) perovskite layers having the compositions indicated, according to some embodiments of the present disclosure. The XRD pattern of $(GA_{0.78}PEA_{0.22})_2PbI_4$ is also shown for comparison, according to some embodiments of the present disclosure.

The XRD results show that the material based on the precursor of (GA$_{0.78}$PEA$_{0.22}$)$_2$PbI$_4$ consists primarily of n=2 (GA$_{0.78}$PEA$_{0.22}$)$_2$PbI$_4$ along with some n=1 PEA$_2$PbI$_4$ and GA$_2$PbI$_4$. When a significant amount of mixed PEA$^+$ and GA$^+$ (>10% mole ratio with respect to A-site cations) was added to the 3D perovskite (FASnI$_3$)$_{0.6}$(MAPbI$_3$)$_{0.4}$ precursor mixture, the diffraction peaks associated with PEA$_2$GAPb$_2$I$_7$ perovskite-like structure were observed (see FIG. 14C). For a lower concentration (<7%) the amount of 2D/quasi-2D structures was likely too low to be detected in these experiments. Note that replacing Pb with Sn or a Pb—Sn mixture in PEA$_2$GAPb$_2$I$_7$ did not strongly affect the crystal structure (see FIG. 18).

Pure 2D perovskite-like structures (corresponding to n=1) can be used to passivate 3D perovskite surfaces and/or grain boundaries. In comparison to the n=1 pure 2D perovskite-like structure (see Panel A of FIG. 4), n=2 quasi-2D perovskite-like structures offer some unique advantages without losing the barrier protection capability associated with bulky organic cations. Time-resolved microwave conductivity (TRMC) studies determined that the free carrier lifetime was much longer in n=2 PEA$_2$GAPb$_2$I$_7$ (about 309 ns) than n=1 PEA$_2$PbI$_4$ (~21 ns) and GA$_2$PbI$_4$ (~101 ns) (see Panels A and B of FIG. 19 and Table 4). It was also determined that PEA$_2$GAPb$_2$I$_7$ exhibited enhanced out-of-plane charge transport when compared to PEA$_2$PbI$_4$, whereas the out-of-plane transport in GA$_2$PbI$_4$ is too low to measure (see Panels A and B of FIG. 20). These results are significant for minimizing charge recombination and enhancing charge separation at the 3D/2D interface. In some embodiments of the present disclosure, a 3D/2D interface may occur at a grain boundary. Thus, in some embodiments of the present disclosure, there may be a first interface at the outer surface of a 3D crystal with a layer of quasi-2D perovskite-like phase coating the 3D crystal. This layer of quasi-2D perovskite-like material may then form a second interface with a grain boundary, where the grain boundary forms another layer that coats the layer of quasi-2D perovskite-like material.

Figure 11:
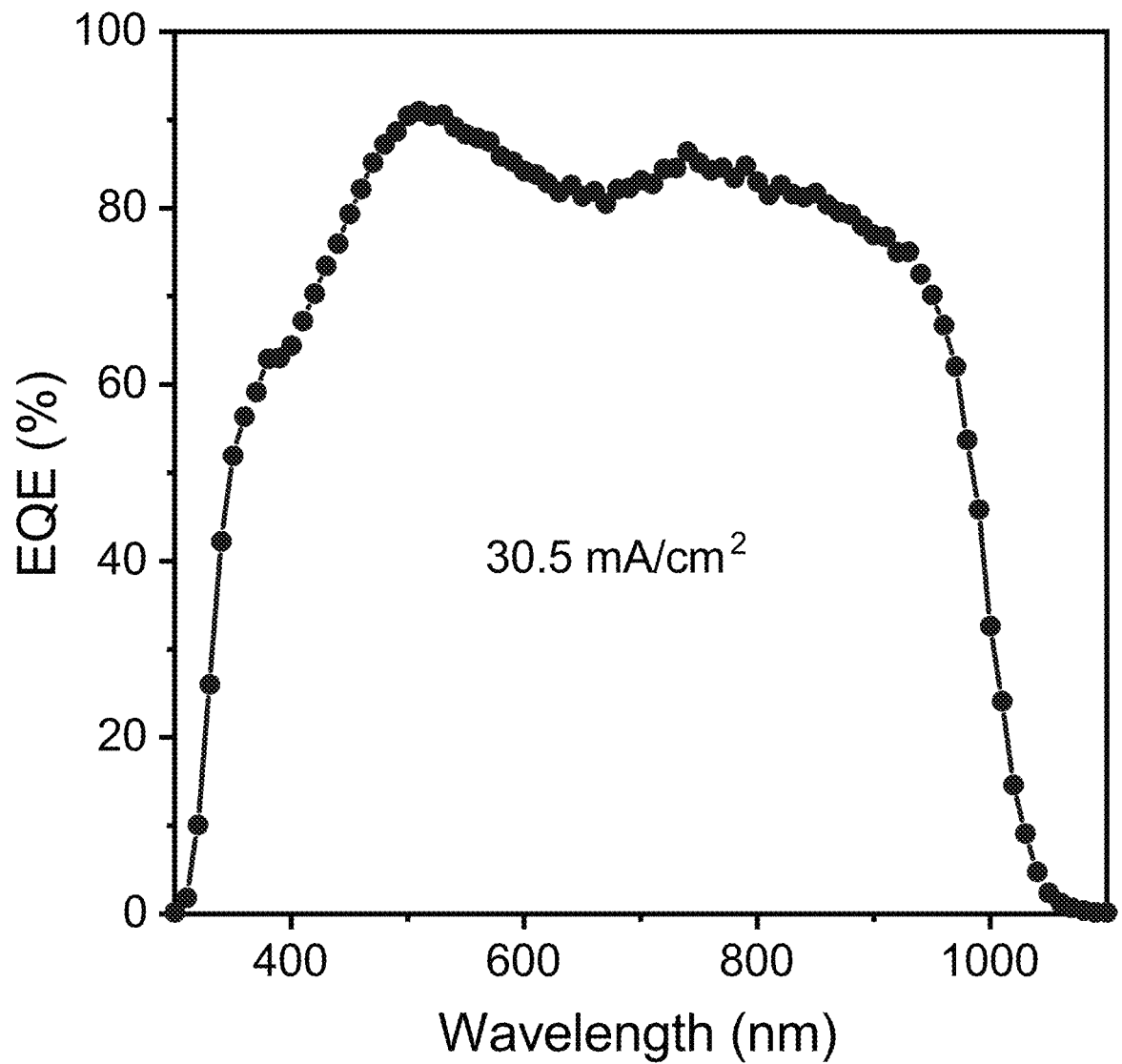
FIG. 11 illustrates the external quantum efficiency (EQE) spectrum of the narrow-bandgap PSC summarized in FIG. 21A, according to some embodiments of the present disclosure.
Figure 21A:
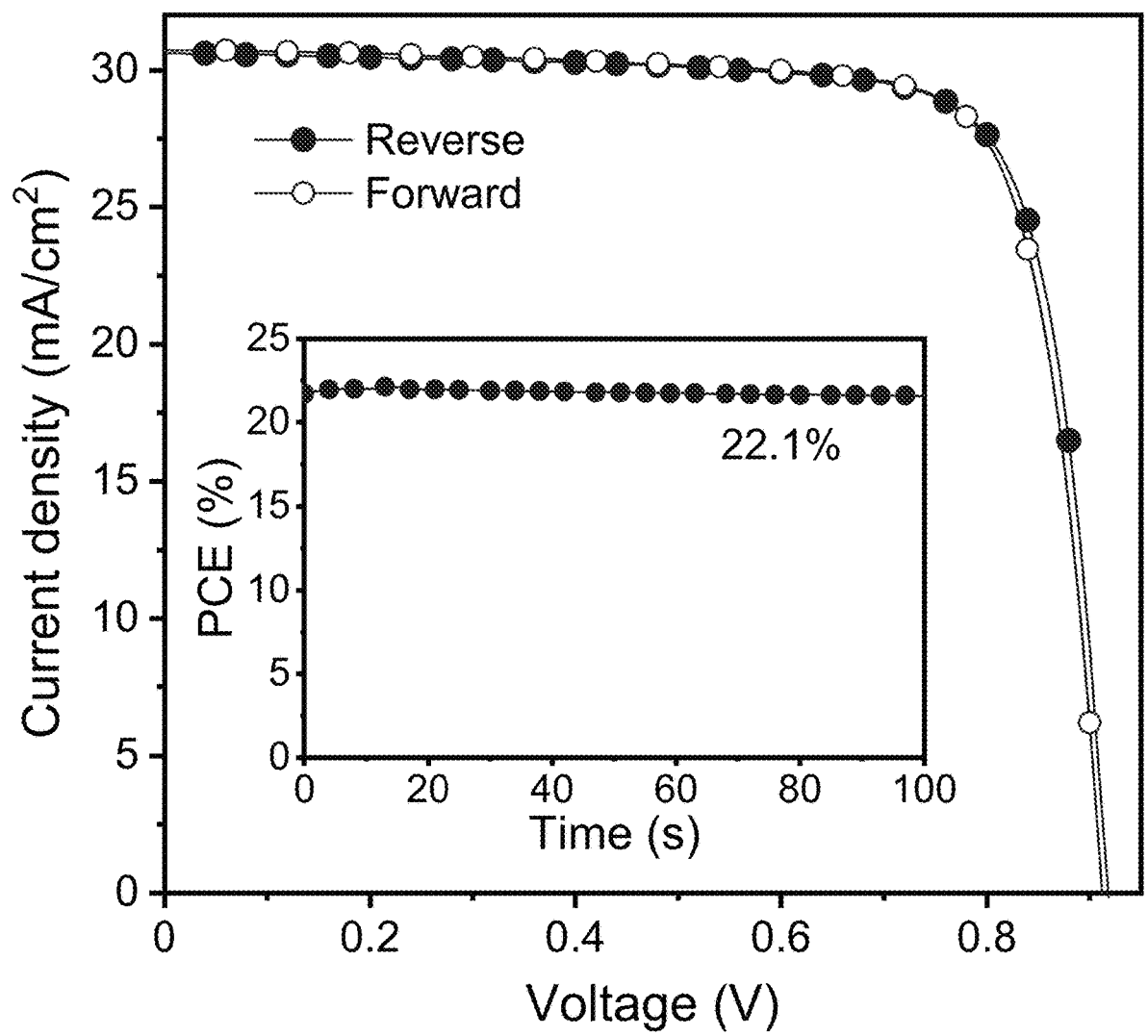
FIG. 21A illustrates the J-V curve of the best-performing narrow-bandgap single-junction Sn—Pb PSCs along with its stable power output (SPO) efficiency near the maximum power point (inset), according to some embodiments of the present disclosure. The perovskite layers in these devices were prepared using PEAI and GASCN.
Figure 21B:
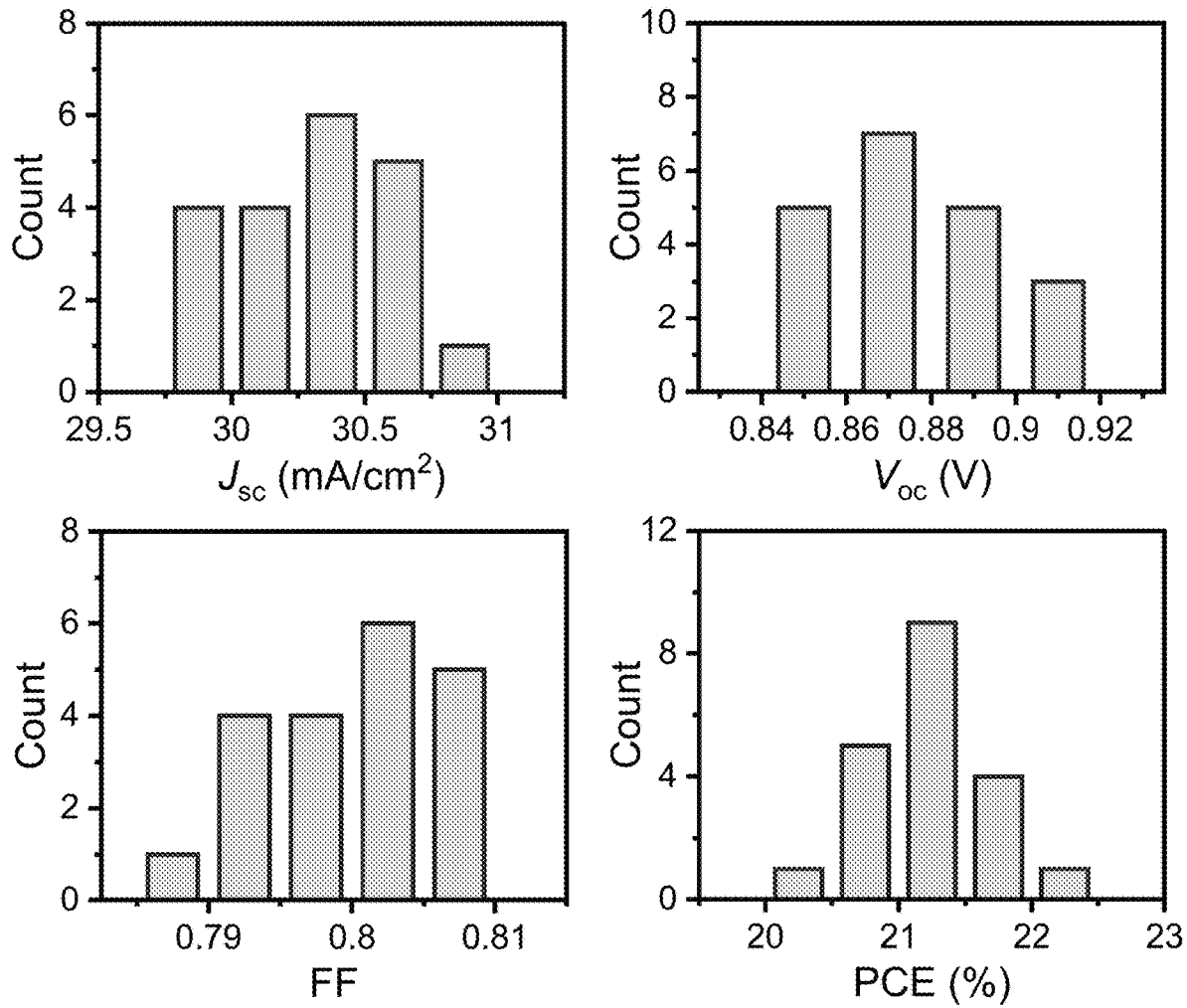
FIG. 21B illustrates statistics of PV parameters of narrow-bandgap single-junction Sn—Pb PSCs, according to some embodiments of the present disclosure. The perovskite layers in these devices were prepared by using PEAI-GASCN additives.
Figure 21C:
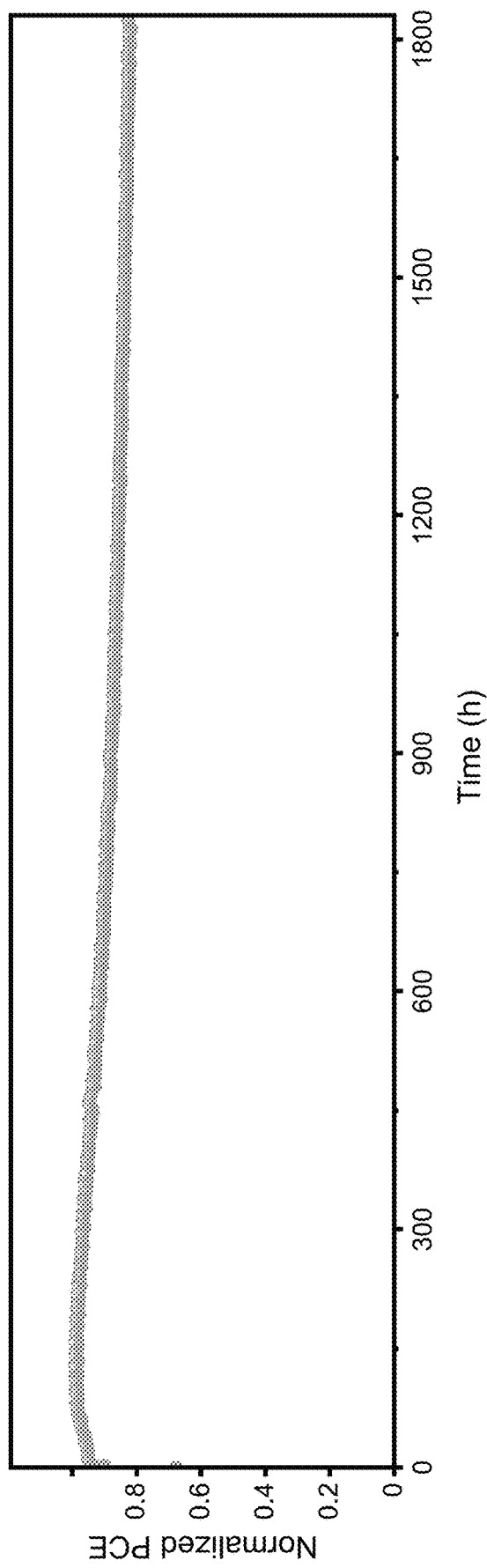
FIG. 21C illustrates the long-term stability of unencapsulated Sn—Pb narrow-bandgap PSC under continuous light illumination at temperatures between about 30° C. and 35° C. in a $N_2$ atmosphere, according to some embodiments of the present disclosure. The perovskite layers in these devices were prepared by using the combination of both PEAI and GASCN additives.

These high-quality Sn—Pb perovskite layers allowed the fabrication of highly efficient and stable Sn—Pb based PSCs. FIG. 21A illustrates the J-V curves of the best performing Sn—Pb PSC, which among other things, is characterized by negligible hysteresis between the reverse and forward voltage scans. The reverse scan yielded a PCE of 22.2%, with a J$_{sc}$ of 30.62 mA/cm$^2$, V$_{oc}$ of 0.916 V, and FF of 0.790. When measured in a forward scan, it showed a PCE of 22.1%, with a J$_{sc}$ of 30.73 mA/cm$^2$, V$_{oc}$ of 0.912 V and FF of 0.787. The corresponding stable power output (SPO) PCE was 22.1% (see the inset of FIG. 21A). The EQE spectrum of the Sn—Pb PSC is illustrated in FIG. 11, which yielded an integrated J$_{sc}$ that agrees with the J-V measurement. FIG. 21B illustrates the statistics of the PV parameters of the Sn—Pb narrow-bandgap PSCs. The V$_{oc}$ of these cells span from about 0.85 V to near 0.92 V. The narrow-bandgap PSC also demonstrated a good device stability, retaining over 82% of its maximum efficiency under continuous simulated solar illumination in N$_2$ for 1830 hours. This good long-term stability along with the high V$_{oc}$ values from Sn—Pb narrow-bandgap PSCs reaffirm the benefit of reducing the dark carrier density and improving carrier lifetime in Sn—Pb perovskites.

TABLE 4

Figure 19:
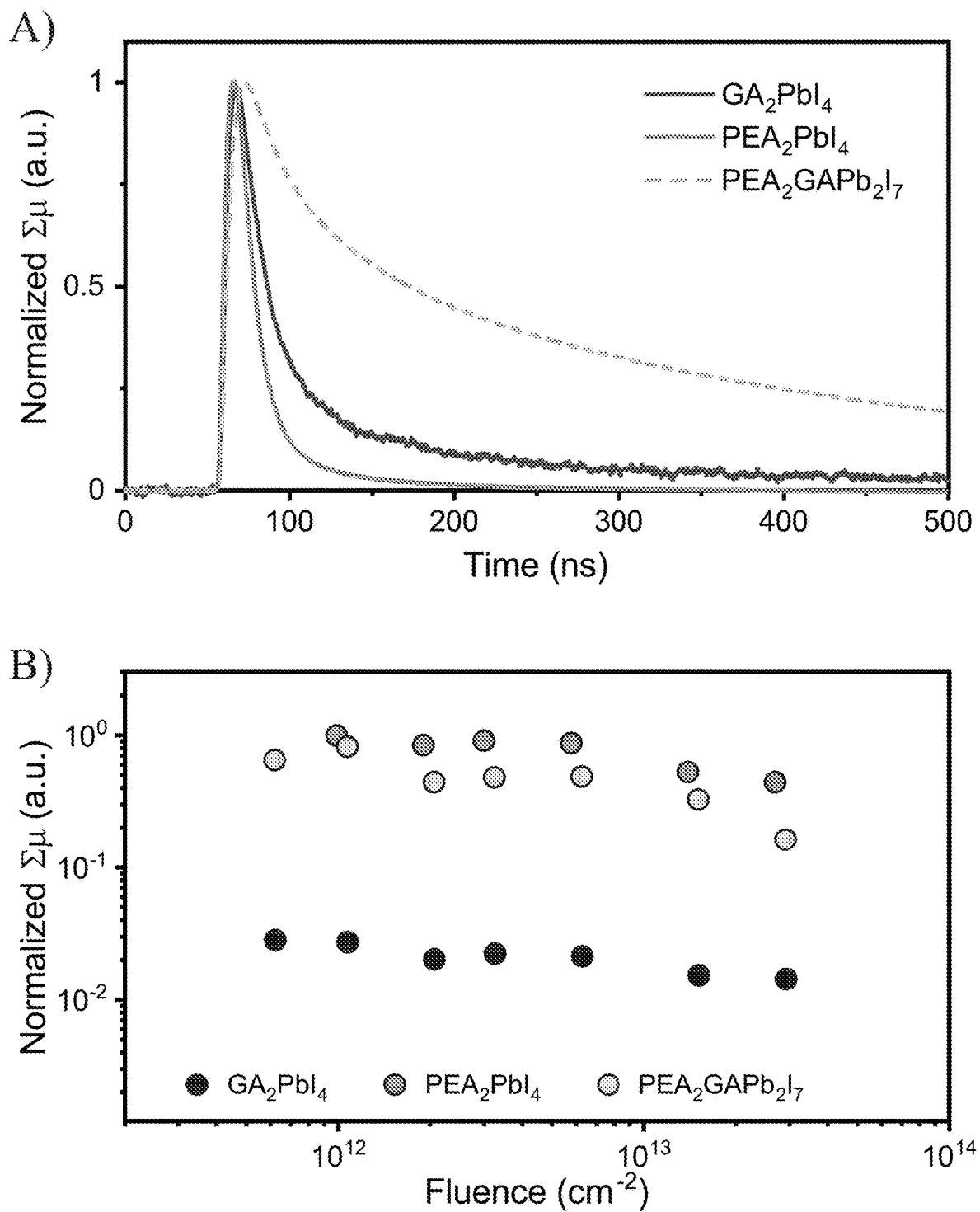
FIG. 19 illustrates (Panel A) a typical normalized photoconductivity transient and (Panel B) the intensity dependence for $GA_2PbI_4$, $PEA_2PbI_4$, and $PEA_2GAPb_2I_7$ using standard (in-plane) time-resolved microwave conductivity (TRMC) characterization, according to some embodiments of the present disclosure.
Figure 20:
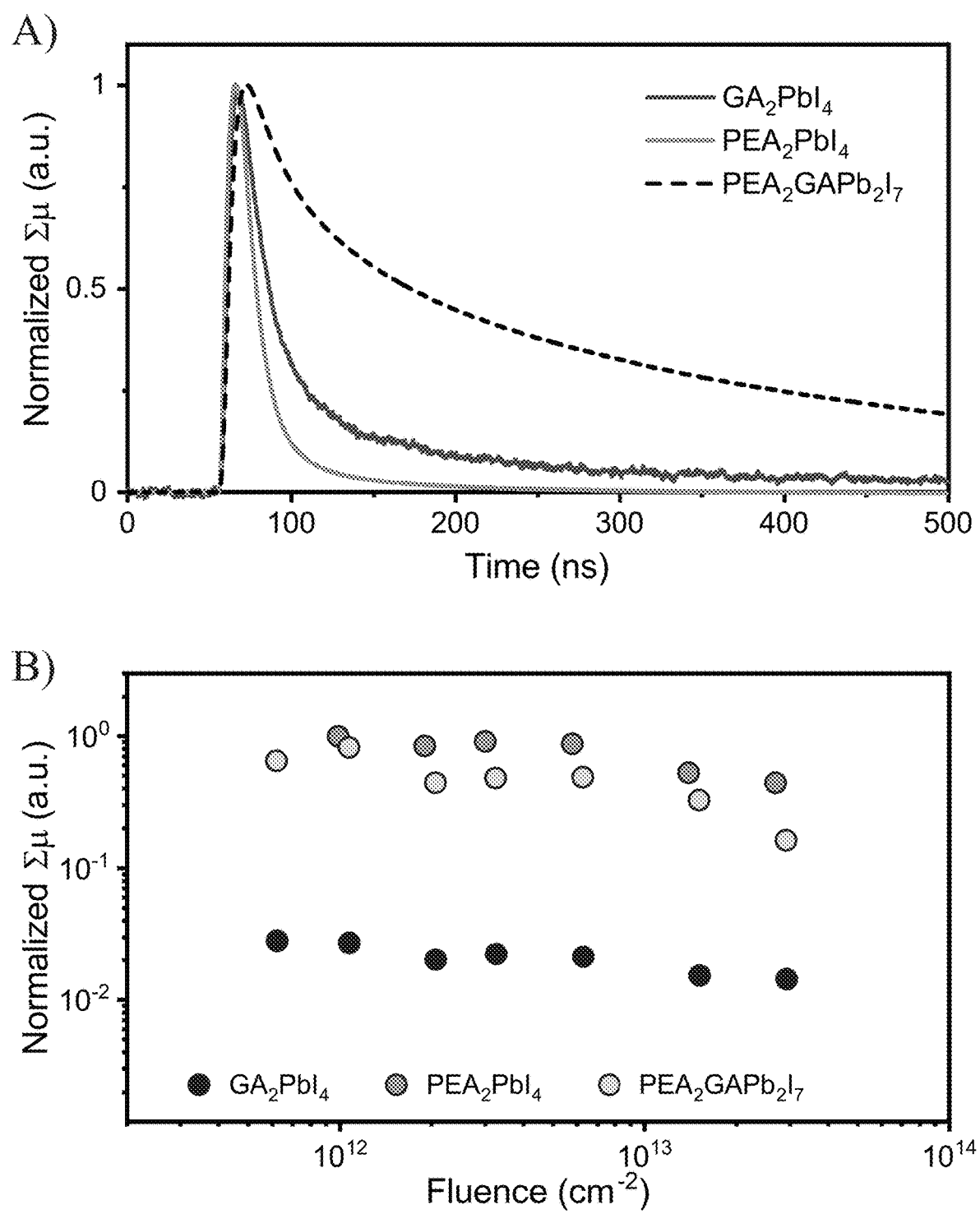
FIG. 20 illustrates a TRMC comparison of out-of-plane transport in $PEA_2PbI_4$ and $PEA_2GAPb_2I_7$, according to some embodiments of the present disclosure. The out-of-plane transport in $GA_2PbI_4$ was too low to measure.

Fitting results of TRMC transients for samples illustrated in Panel A of FIG. 19

| Additives | a$_1$ (f$_1$)* | τ$_1$ (ns) | a$_2$ (f$_2$) | τ$_2$ (ns) | τ$_{avg}$ (ns) |
|---|---|---|---|---|---|
| GA$_2$PbI$_4$ | 0.0123 (0.3488) | 8 | 0.00116 (0.6511) | 151 | 101 |
| PEA$_2$PbI$_4$ | 0.407 (0.7288) | 5 | 0.01061 (0.2711) | 64 | 21 |
| PEA$_2$GAPb$_2$I$_7$ | 0.0951 (0.07314) | 16 | 0.05806 (0.9268) | 332 | 309 |

*a$_i$ is the prefactor of exponential decay function in ϕΣμ(t) = ΣS$_i$ a$_i$ exp(-t/τ$_1$), and f$_i$ is the fractional contribution of each time constant (τ$_i$)

Figure 22A:
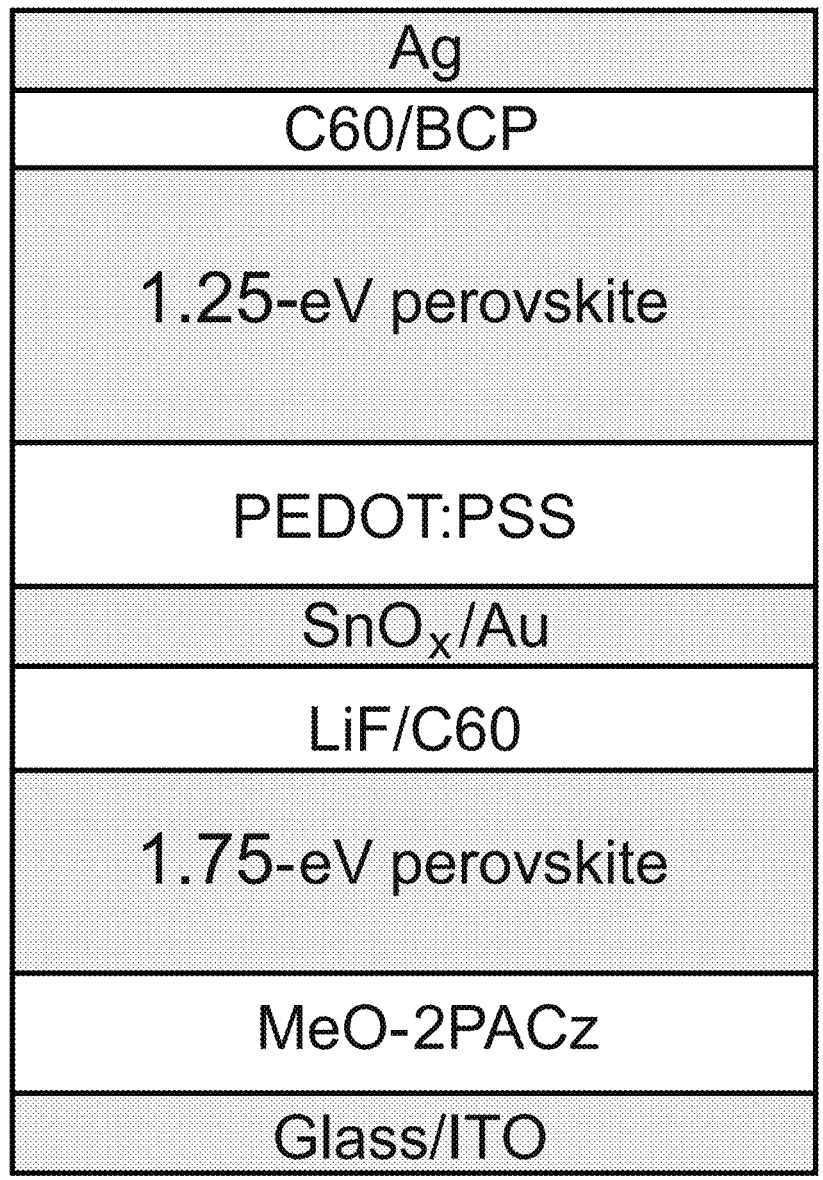
FIG. 22A illustrates monolithic all-perovskite tandem solar cells, according to some embodiments of the present disclosure.
Figure 22B:
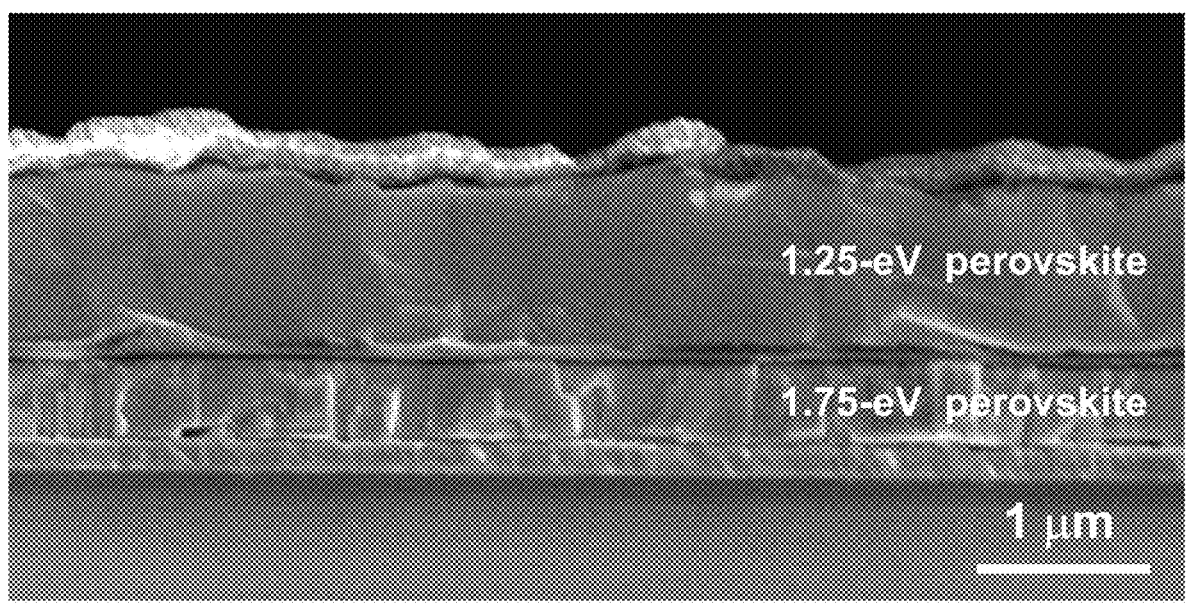
FIG. 22B illustrates an SEM image of a device constructed like the two-terminal monolithic tandem device illustrated in FIG. 22A, according to some embodiments of the present disclosure.
Figure 22C:
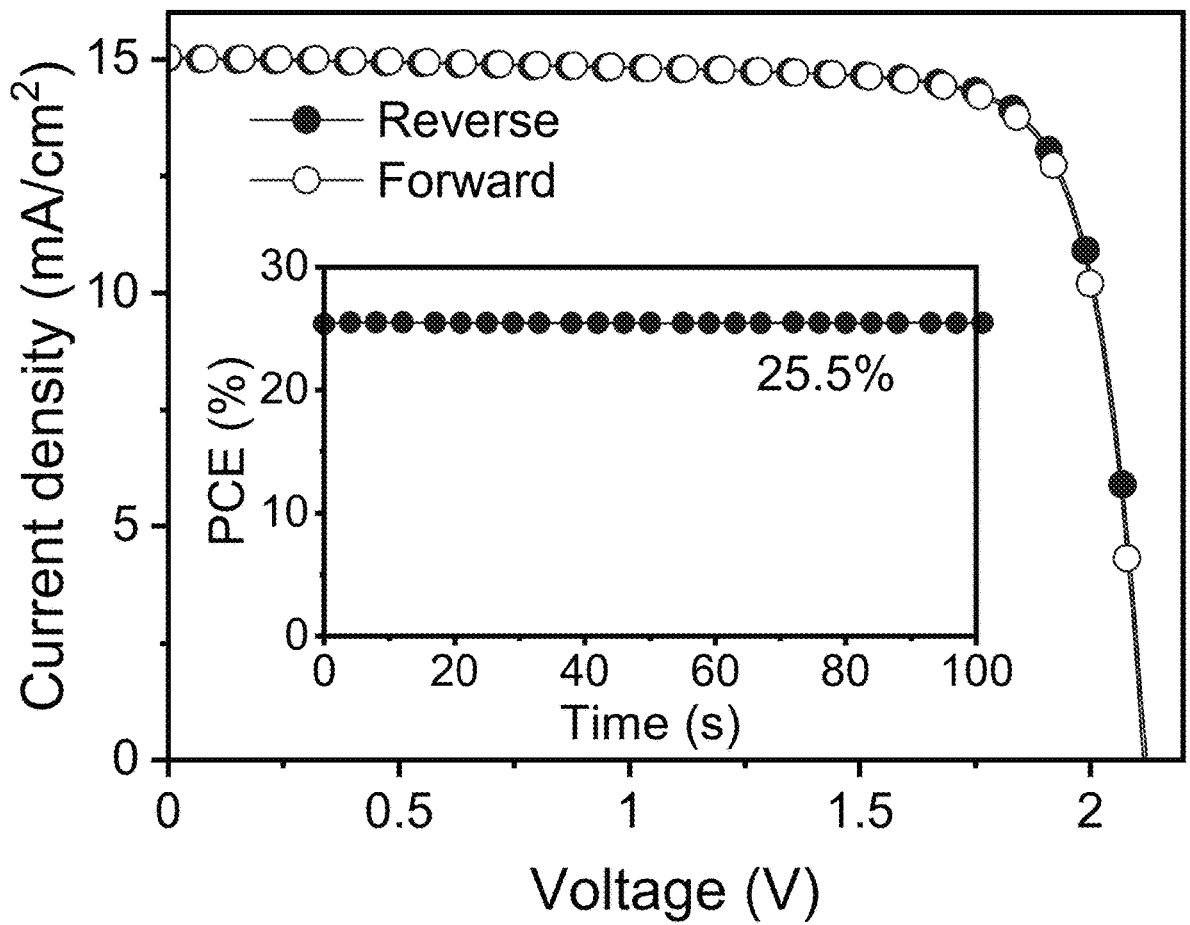
FIG. 22C illustrates a J-V curve of the champion all-perovskite tandem solar cell along with the stable power output (SPO) efficiency near the maximum power point (inset), according to some embodiments of the present disclosure.
Figure 22D:
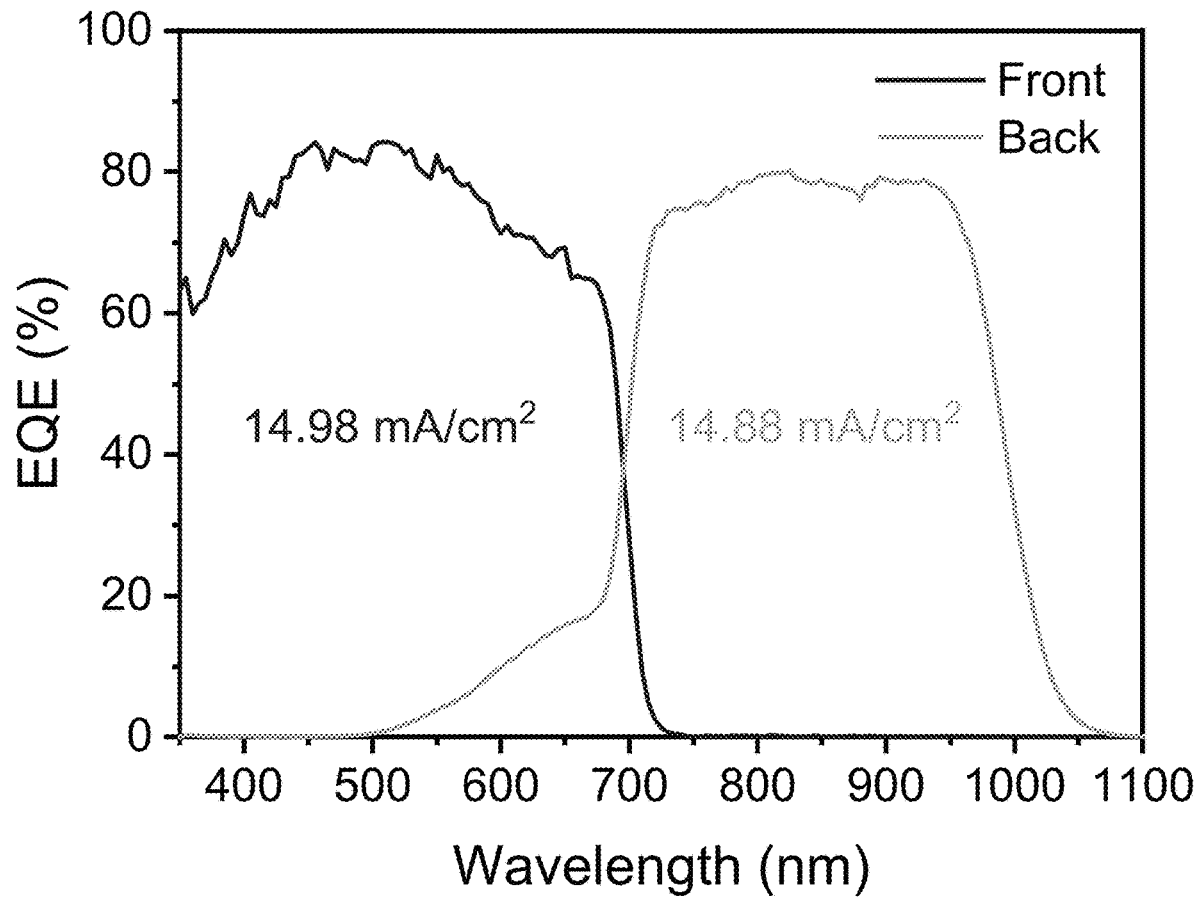
FIG. 22D illustrates the EQE spectra of the front (wide-bandgap) and back (narrow-bandgap) subcells with the integrated $J_{sc}$ values indicated, according to some embodiments of the present disclosure.
Figure 22E:
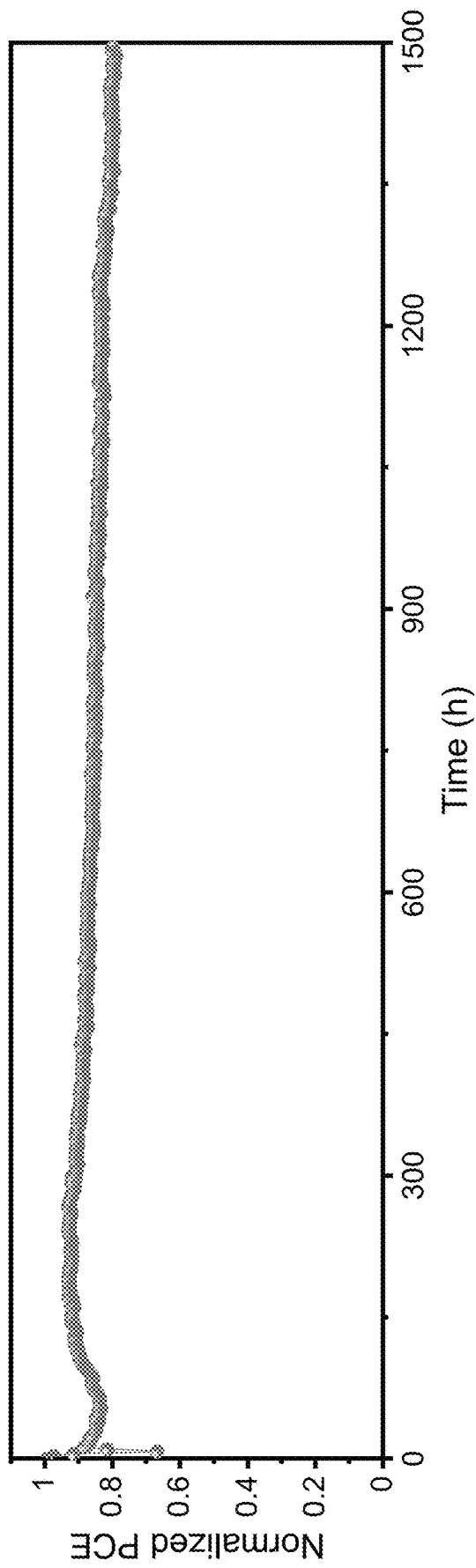
FIG. 22E illustrates the long-term stability of the tandem device under continuous light illumination (~0.8 suns) at about 30-35° C. in $N_2$, according to some embodiments of the present disclosure. The perovskite layers in the narrow-bandgap subcells were prepared by using PEAI-GASCN additives.
Figure 23:
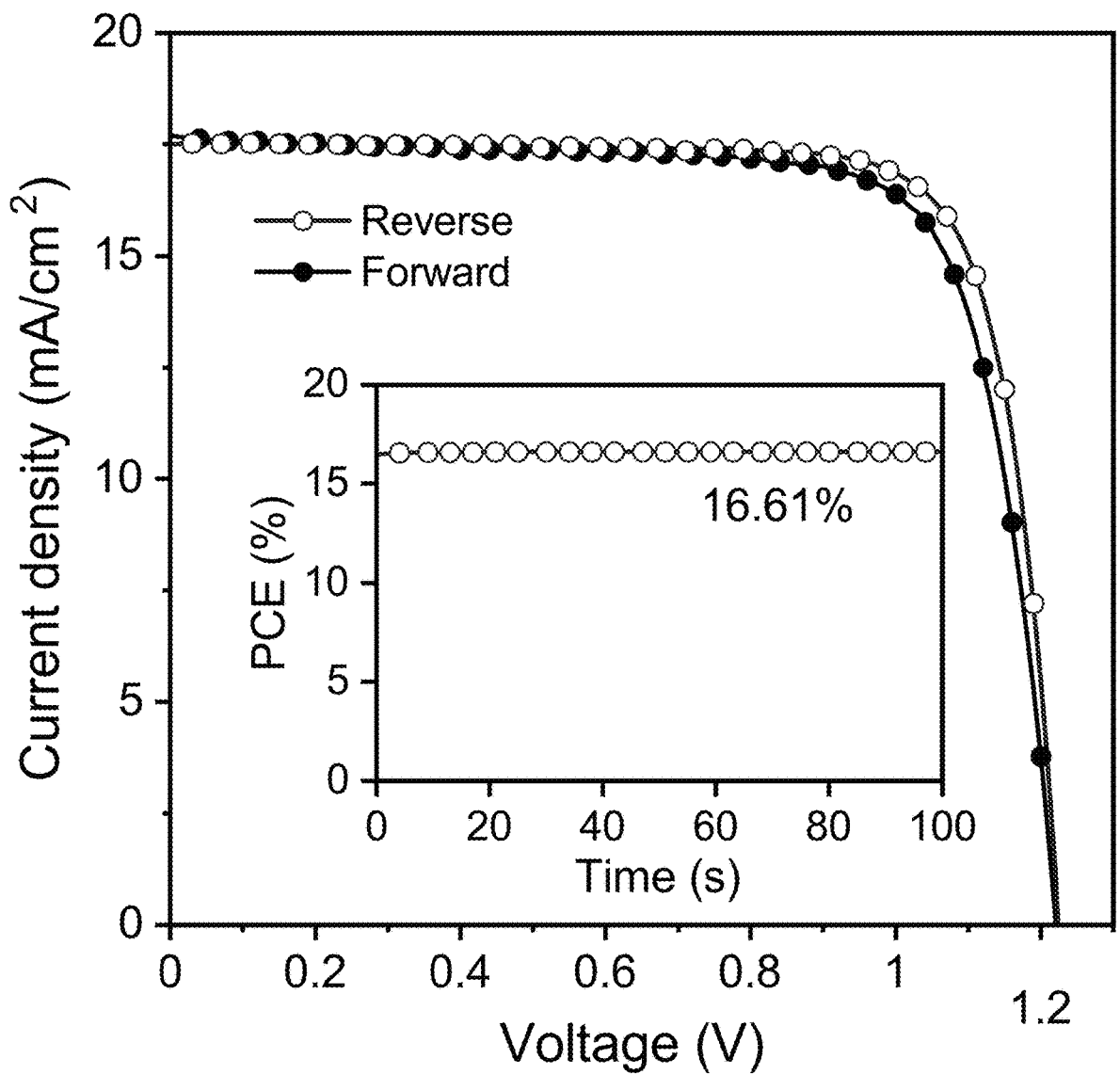
FIG. 23 illustrates J-V curves of a wide-bandgap PSC based on the 1.75-eV perovskite layer, according to some embodiments of the present disclosure. The inset shows the corresponding stable power output (SPO) power conversion efficiency (PCE).
Figure 24:
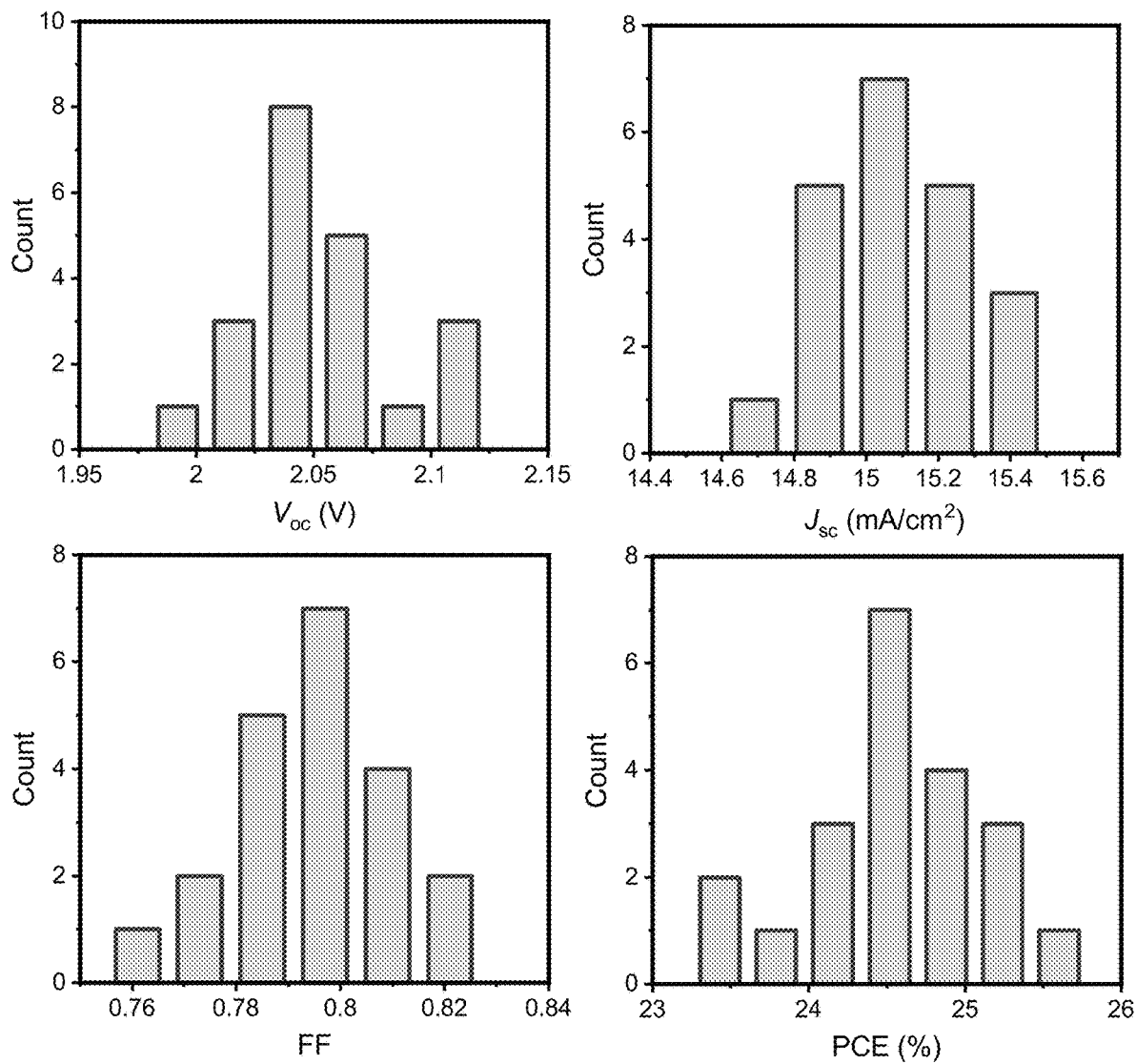
FIG. 24 illustrates statistical distributions of the tandem devices based on the narrow-bandgap perovskite layers prepared using a solution of both PEAI and GASCN at about 2 mol % PEAI and about 7 mol % GASCN additives, according to some embodiments of the present disclosure.
Figure 25:
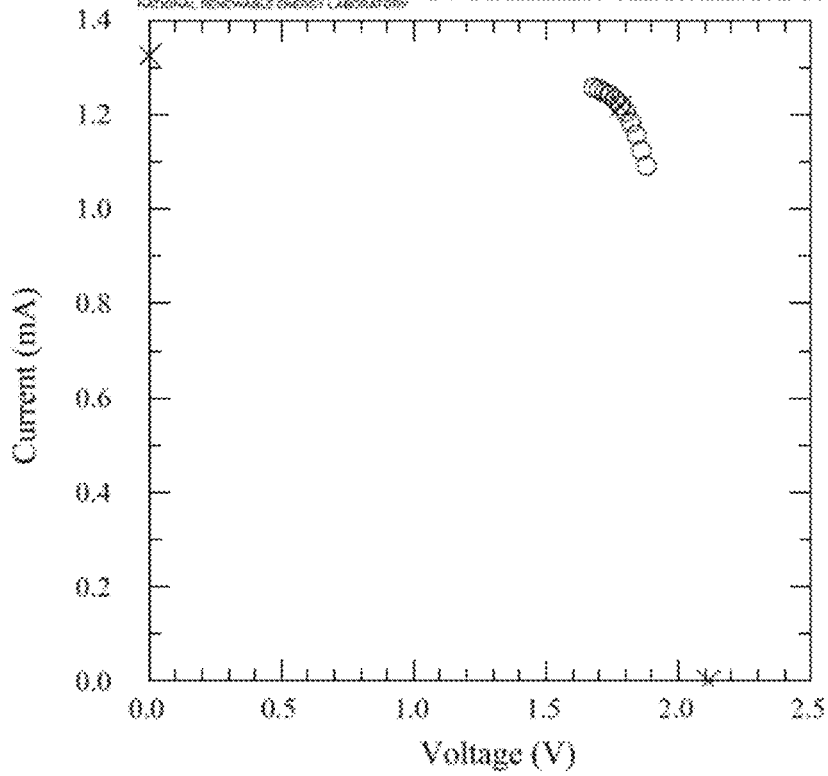
FIG. 25 illustrates the stabilized certified photovoltaic performance of an all-perovskite 2-terminal tandem solar cell as described herein, according to some embodiments of the present disclosure. The stabilized asymptotic scans were measured by holding the cell at 11 different voltages near $V_{max}$ until the current change per minute was less than 0.1% before changing to the next voltage point, according to some embodiments of the present disclosure.
Figure 26:
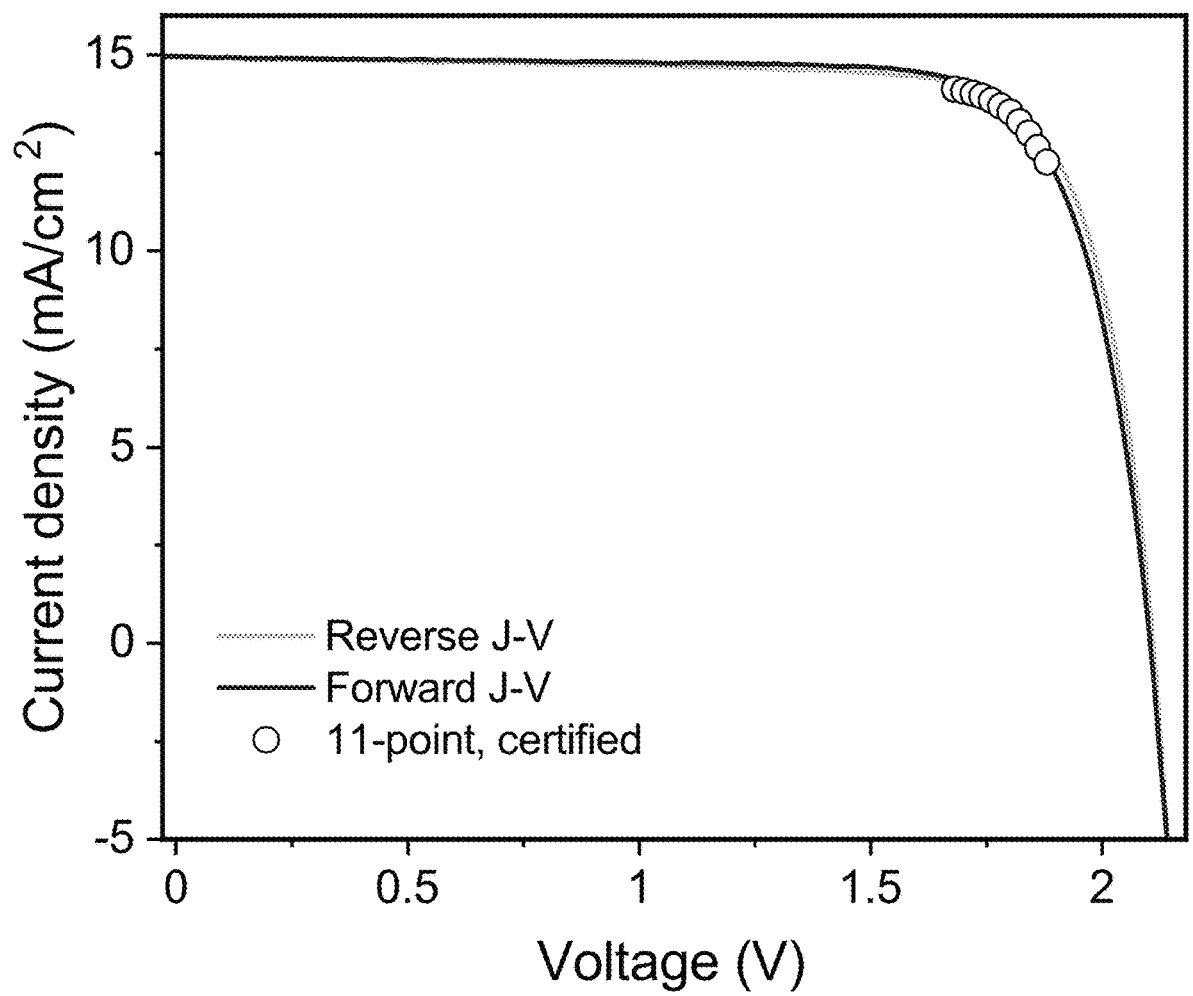
FIG. 26 illustrates the J-V curve for a certified two-terminal all-perovskite tandem, according to some embodiments of the present disclosure. The stabilized PCE was certified by NREL (white circles) using the 11-point-Asymptotic Pmax Scan protocol. The PV metrics illustrated in this figure are summarized in Table 6.

In addition, monolithic all-perovskite tandem solar cells were fabricated by integrating the ~1.25-eV Sn—Pb narrow-bandgap back cell ((FASnI$_3$)$_{0.6}$(MAPbI$_3$)$_{0.4}$) with a FA$_{0.7}$Cs$_{0.3}$PbI$_{2.1}$Br$_{0.9}$-based 1.75-eV wide-bandgap front cell. Panel A of FIG. 22A illustrates the schematic tandem device stack: glass (substrate)/ITO (transparent conducting layer)/MeO-2PACz/1.75-eV perovskite/LiF/C$_{60}$/33-nm SnO$_x$/1-nm Au/PEDOT:PSS/1.25-eV perovskite/C60/BCP/Ag (electrode), where ITO is indium tin oxide, Meo-2PACz is (2-(3,6-Dimethoxy-9H-carbazol-9-yl)ethyl)phosphonic acid and PEDOT:PSS is Poly(3,4-ethylenedioxythiophene):polystyrene sulfonate. A typical cross-section SEM image of the tandem device is illustrated in FIG. 22B. The perovskite layer thickness was about 400 nm for the 1.75-eV and 1 μm for the 1.25-eV perovskite absorbers. The 1-nm Au deposited on $SnO_x$ facilitates electron-hole recombination to connect the two junctions. The J-V curves of the 1.75-eV wide-bandgap PSC are illustrated in FIG. 23, and the corresponding J-V parameters are summarized in Table 5. FIG. 22C illustrates the J-V curves of the champion all-perovskite tandem device with both the reverse and forward voltage scans. The PCE under reverse scan was 25.5%, with a $V_{oc}$ of 2.121 V, a $J_{sc}$ of 15.03 $mA/cm^2$, and an FF of 0.801. When measured from the forward scan, the 2T tandem showed a PCE of 25.4%, with a $V_{oc}$ of 2.114 V, a $J_{sc}$ of 15.05 $mA/cm^2$ and an FF of 0.797. The hysteresis between the reverse and forward scans is negligible. The PCE from the J-V curve is consistent with the stable power output PCE 25.5% (see the inset of FIG. 22C). The statistics of the tandem PV parameters are illustrated in FIG. 24. The high $V_{oc}$ of the tandem PSCs may be attributed to the high $V_{oc}$ of the Sn—Pb junction. One such device was certified with a stabilized PCE of 24.30±0.43% and $V_{oc}$ of >2.11 V using an 11-point Asymptotic P. Scan protocol (see FIGS. 25 and 26; PV parameters illustrated in FIG. 26 are summarized in Table 6). This certified $V_{oc}$ value further confirms the record high photovoltage in our tandem and Sn—Pb narrow-bandgap solar cells. FIG. 22D illustrates the EQEs from the wide-bandgap and narrow-bandgap junctions (i.e., cells), yielding the integrated $J_{sc}$ values of 14.98 $mA/cm^2$ and 14.88 $mA/cm^2$, respectively. These values also agree well with the $J_{sc}$ determined from the J-V measurements. FIG. 22E illustrates that the unencapsulated two-terminal tandem device retained 80% of its maximum efficiency after about 1,500 hours operation under continuous light illumination at ~0.8 suns at a temperature between about 30° C. and 35° C. in an $N_2$ atmosphere.

TABLE 5

PV parameters of narrow-bandgap and wide-bandgap perovskite single-junction and monolithic all-perovskite 2-terminal tandem solar cells.

| Device | | $J_{sc}$ (mA/cm²) | $V_{oc}$ (V) | FF | PCE (%) | SPO (%) |
|---|---|---|---|---|---|---|
| 1.25-eV PSC | Reverse | 30.62 | 0.916 | 0.790 | 22.2 | 22.1 |
| | Forward | 30.73 | 0.912 | 0.787 | 22.1 | |
| 1.75-eV PSC | Reverse | 17.50 | 1.225 | 0.797 | 17.1 | 16.6 |
| | Forward | 17.70 | 1.222 | 0.761 | 16.5 | |
| 2T tandem | Reverse | 15.03 | 2.121 | 0.801 | 25.5 | 25.5 |
| | Forward | 15.05 | 2.114 | 0.797 | 25.4 | |

TABLE 6

PV parameters of a certified two-terminal all-perovskite tandem solar cell.

| | $J_{sc}$ (mA/cm²) | $V_{oc}$ (V) | FF | PCE (%) |
|---|---|---|---|---|
| Reverse | 14.928 | 2.109 | 0.783 | 24.651 |
| Forward | 14.960 | 2.103 | 0.781 | 24.571 |
| 11-point certified | 14.841 | 2.114 | 0.775 | 24.30 ± 0.53 |

The long-term stability of the unencapsulated 2-T tandem cell under ISOS-L-1 $N_2$ conditions at temperatures between 30° C. and 35° C., under continuous light illumination from a sulfur plasma lamp at ~0.8 suns was evaluated. FIG. 22D illustrates that the 2T tandem cell retained 80% of its maximum efficiency after 1500 hours. This demonstrated stability is better than published literature stability results on high-efficiency all-perovskite 2T tandem solar cells. The results on the device efficiency and stability for both the Sn—Pb narrow-bandgap PSC and all-perovskite tandem, by addressing the critical voltage losses, suggest that our use of mixed cations to incorporate n=2 2D structure in the 3D Sn—Pb perovskite precursor can accelerate the development of Sn—Pb-based perovskites for solar cell and other related optoelectronic applications.

Finally, it should be noted that although the instant specification has focused on the tin and/or lead perovskite compositions, the use of quasi-2D perovskite-like phases to stabilize and/or improve the performance metrics of other 3D perovskite compositions fall within the scope of the present disclosure.

Materials and Methods:

Materials: All solvents and chemical materials are directly used without purification unless otherwise stated. Lead iodide ($PbI_2$, 99.999% trace metals basis), tin iodide ($SnI_2$, 99.99% trace metals basis), guanidium thiocyanate (GASCN), tin(II) fluoride ($SnF_2$), and cesium iodide (CsI) were purchased from Sigma-Aldrich. Phenethylammonium iodide (PEAI), formamidinium iodide (FAI), and methylammonium iodide (MAI) were purchased from Greatcell Solar. $PbBr_2$, MeO-2PACz, and bathocuproine (BCP) were purchased from TCI. Heraeus CLEVIOS™ P VP AI 4083 were purchased from Heraeus Clevios. C60 were purchased from Luminescence Technology. Dimethylformamide (DMF), dimethyl sulfoxide (DMSO), toluene, isopropanol, and ethanol were purchased from Sigma-Aldrich.

Perovskite precursor solution: To make the narrow-bandgap $(FASnI_3)_{0.6}(MAPbI_3)_{0.4}$ precursor, FAI (0.6 mmol), $SnI_2$ (0.6 mmol), $SnF_2$ (0.06 mmol), MAI (0.4 mmol), $PbI_2$ (0.4 mmol) were mixed in 500 μl DMF/DMSO (V/V 4:1) and stirring for 2 hours before use. For the $(FASnI_3)_{0.6}(MAPbI_3)_{0.4}$ with GASCN and PEAI passivated samples, the GASCN and PEAI powders were directly added into the $(FASnI_3)_{0.6}(MAPbI_3)_{0.4}$ precursor with different mole ratio with respect to MAI. To make the wide-bandgap of $Cs_{0.3}FA_{0.7}PbI_{2.1}Br_{0.9}$ precursor, $PbCl_2$ (0.02 mmol), FAI (0.7 mmol), CsI (0.3 mmol), $PbBr_2$ (0.45 mmol), and $PbI_2$ (0.55 mmol) were mixed in 750 μl DMF and 250 μl DMSO mixed solution and stirred for 2 hours before use.

Wide-bandgap single-junction perovskite solar cells fabrication: The pre-patterned ITO substrates were sequentially cleaned by ultra-sonic in acetone and isopropanol for 20 min, respectively. After UV-Ozone treatment of the ITO substrates for 15 min, 1 mM of MeO-2PACz ethanol solution was dropped onto the ITO substrates and spin-coated at 3000 rpm for 30 s, followed by 100° C. 10-min annealing in a $N_2$ glovebox. After cooling down the substrates, the wide-bandgap perovskite precursor was dropped onto it and spin-coated at 6000 rpm for 60 s. During the spinning process, the antisolvent of toluene was dropped at 15 s. The resulting perovskite layer was then annealed at 100° C. for 10 min. Then 1-nm LiF/30-nm C60 were thermal evaporated on the perovskite, followed by 33-nm $SnO_x$ deposited by ALD. Finally, 100-nm Ag was evaporated.

Narrow-bandgap single-junction perovskite solar cells fabrication: The pre-patterned ITO substrates were sequentially cleaned by ultra-sonic in acetone and isopropanol for 20 minutes, respectively. PEDOT: PSS was spin-coated onto the ITO substrate at 5000 rpm and annealed at 120° C. for 20 min in air. After that, the ITO-PEDOT:PSS substrates were transferred into a $N_2$ glovebox. The $(FASnI_3)_{0.6}(MAPbI_3)_{0.4}$-based precursors without and with additives were spin-coated onto the ITO/PEDOT:PSS substrates at 5000 rpm for 30 s and 350 μl toluene was dripped onto the spinning substrate at 10 s after the starting of the spin coating. The resulting perovskite layers were then thermal annealed at 100° C. for 10 min. Finally, 30-nm C60/6-nm BCP/100-nm Ag were sequentially thermal-evaporated on the perovskite layer.

Monolithic two-terminal all-perovskite tandem solar cell fabrication: The two-terminal tandem solar cells were built by fabricating the narrow-bandgap junction on top of the wide-bandgap junction. The fabrication process of each subcell was identical to the single-junction solar cells. 30-nm C60/33-nm $SnO_x$/1-nm Au was used as the interconnecting layer between the wide- and narrow-bandgap subcells. The 30-nm C60 and 1-nm Au were deposited by thermal evaporation in the glovebox. The 33-nm $SnO_x$ layer (thickness characterized by spectroscopic ellipsometry on a reference silicon wafer) was deposited by atomic layer deposition (ALD) at 90° C. from 250 cycles of tetrakis (dimethylamino)tin(IV) (Strem chemicals, CAS: 1066-77-9) and water. The deposition was performed in a Beneq TFS200 reactor with chamber. The tetrakis(dimethylamino) tin(IV) (TDMASn) precursor was maintained at 55° C. and water unheated and nitrogen process flows at 250 and 300 sccm, respectively. The TDMASn was dosed according to a charge-pulse-purge procedure consisting of a 0.35 s nitrogen charge, 1 s pulse, and 0.2 s pulse with nitrogen flow through the bubbler. The tin oxide growth consisted of a cyclical process of: TDMASn charge-pulse-purge dose procedure, purge (6 s), water dose (0.2 s), and purge (6 s) for a growth rate of 1.4 Å/cycle.

Solar cell characterizations: The photocurrent density-voltage (J-V) were measured in a $N_2$ glovebox using an AM 1.5G solar simulator (Oriel Sol3A Class AAA). The intensity of the solar simulator was calibrated to 100 mW/cm$^2$ using a reference Silicon solar cell (Oriel, VLSI standards, certified by NREL PV Performance Calibration group). The J-V curves of both single-junction and tandem solar cells were taken with reverse and forward voltage scans. The device area was 0.112 cm$^2$ and masked with a metal aperture to define an active area of 0.09 cm$^2$. The stable power output (SPO) efficiency of the solar cells was measured by monitoring the output efficiency with the biased voltage set at the maximum power point. The external quantum efficiency (EQE) spectra of single-junction cells were taken by using the Newport Oriel IQE200. The reference cell used for the calibration of EQE was calibrated by the certification group in NREL. For EQE measurement of the tandem solar cells, two highly bright LEDs with emission wavelength at 470 nm and 850 nm were used as the bias light to measure the back narrow-bandgap and front wide-bandgap subcells, respectively. The chopper frequency was 314 Hz. For long-term stability measurement, the solar cells were loaded into a home-built stability measuring system. During the measurement, samples were kept in a nitrogen environment and maintained at about 30-35° C.

Time-resolved photoluminescence characterization: Excitation was provided by the 640-nm output from an optical parametric amplifier pumped by a Yb:KGW laser with the repetition rate reduced to 55 kHz and a pulse width of ca. 0.3 ps (Orpheus/Pharos, Light Conversion). A multi-mode optical fiber was used to guide the excitation beam to the sample. The light was focused on the sample with an aspheric lens to provide an excitation spot with a diameter of approximately 180 μm. The same lens/fiber combination was used to collect the PL signal, which was routed to the detector using a dichroic beam splitter through a 70 nm bandpass filter centered at 1000 nm. The TRPL decays were recorded via time-correlated single-photon counting (PicoHarp 300 TCSPC Module, PicoQuant) using a silicon single-photon avalanche diode (Micro Photon Devices). Temperature dependent TRPL measurements were performed by mounting the sample inside an optical closed loop helium cryostat.

Time-resolved microwave conductivity characterization: Thin perovskite layers deposited directly onto pre-cleaned and UV-ozone-treated quartz substrates were photoexcited through the quartz side of the substrate with 450 nm (5-ns pulse width) from an optical parametric oscillator (Continuum Panther) pumped by the 355-nm harmonic of a Q-switched Nd:YAG laser (Continuum Powerlite). Flash-photolysis time-resolved microwave conductivity experiments were conducted with the sample oriented in parallel, and perpendicular to the microwave electric field, for the in-plane measurements and for the out of plane measurement, respectively. The transient change in photoconductance, $\Delta G(t)$, was measured via changes in the microwave power, $\Delta P(t)$, due to absorption of microwaves (~9 GHz) by the photogenerated holes and electrons: $\Delta P/P=-K\Delta G$. The end-of-pulse (peak) photoconductance, $\Delta G_{peak}$, is related to the product of the yield of free-carrier generation, $\varphi$, and the sum of the GHz-frequency electron and hole mobilities. The sensitivity factor (K) is 24,000 for the in-plane measurements, and 929 for the out-of-plane measurements.

X-ray diffraction (XRD) and electron microscope characterizations: The crystal structures of prepared perovskite layers were characterized using an X-ray diffractometer (D-Max 2200, Rigaku) with a Cu Kα radiation source. 2D-XRD was measured using a D8-Discover (Bruker) with general area detector diffraction system (GADDS) four-circle detector and a Cu Kα radiation source. The morphologies and microstructures of the prepared perovskite layers and the cross-sectional structures and thickness of the solar cells were investigated using a field-emission scanning electron microscopy (FESEM, Nova 630 NanoSEM, FEI). The optical absorption spectra of perovskite layers were measured using an ultraviolet-visible (UV-vis) spectrophotometer (Cary-6000i, Agilent).

Hall effect measurement: Transport measurements of the perovskite layers were measured using a Lakeshore 8425 Hall probe equipped with a 2T superconducting magnet at room temperature. The perovskite layer was prepared on the glass substrate, and then the four-terminal Ti/Au (10 nm/80 nm) square contacts were deposited on the perovskite layer to define a Van der Pauw sample with an area of 50 μm×50 μm by using the standard semiconducting fabrication techniques in the cleanroom.

X-ray photoemission spectroscopy (XPS) characterization: XPS measurements were performed on a Physical Electronics 5600 photoelectron spectrometer. Briefly, radiation was produced by a monochromatic 350 W Al Kα excitation centered at 1486.7 eV. XPS core-level spectra were collected using a step size of 0.1 eV and pass energy of 11.75 eV. The electron binding energy scale was calibrated using the Fermi edge of a copper substrate, cleaned with Argon ion bombardment. Peak areas were fit using a Gaussian-Lorentzian peak fitting algorithm with a Shirley background. Spectra taken with the Al source are typically assigned an uncertainty of 0.05 eV. Compositional analyses and deconvolutions are typically assigned an uncertainty of 5%.

EXAMPLES

Example 1. A composition comprising: a perovskite phase comprising $ABX_3$; and a perovskite-like phase comprising $A'_2A''B'_2X'_7$, wherein: A is a first cation, B is a second cation, X is a first anion, A' is a third cation, A" is a fourth cation, B' is a fifth cation, X' is a second anion, and A' is different than A".

Example 2. The composition of Example 1, wherein A' comprises an ammonium functional group.

Example 3. The composition of either Example 1 or Example 2, wherein A' comprises at least one of phenylethylammonium (PEA), guanidinium (GA), 4-flouorophenethylammonium, N-methyl-1,3-propane diammonium, 1,4-butane diamine, or N,N-dimethyl-1,3-propane diammonium, dipropylammonium, or diethylammonium.

Example 4. The composition of any one of Examples 1-3, wherein A" comprises at least one of phenylethylammonium (PEA), guanidinium (GA), 4-flouorophenethylammonium, N-methyl-1,3-propane diammonium, 1,4-butane diamine (BDA), or N,N-dimethyl-1,3-propane diammonium, dipropylammonium, or diethylammonium.

Example 5. The composition of any one of Examples 1-4, wherein X comprises a halide.

Example 6. The composition of any one of Examples 1-5, wherein X comprises at least one of iodide, bromide, or chloride.

Example 7. The composition of any one of Examples 1-6, wherein B comprises at least one of tin or lead.

Example 8. The composition of any one of Examples 1-7, wherein B comprises tin and lead.

Example 9. The composition of any one of Examples 1-9, wherein A comprises at least one of methylammonium (MA), formamidinium (FA), dimethylammonium, or cesium.

Example 10. The composition of any one of Examples 1-9, wherein the perovskite phase comprises $FA_{(1-x)}MA_xPb_{1-z}Sn_zI_3$, and each of x and z are greater than zero.

Example 11. The composition of any one of Examples 1-10, wherein the perovskite phase further comprises $FA_{(1-x-y)}MA_xCs_yPb_{1-z}Sn_zI_3$ and y is greater than zero.

Example 12. The composition of any one of Examples 1-11, wherein the perovskite phase further comprises $FA_{(1-x-y)}MA_xCs_yPb_{1-z}Sn_z(I_{1-a-b}Br_aCl_b)_3$ and at least one of a or b is greater than zero.

Example 13. The composition of any one of Examples 1-12, wherein the perovskite phase further comprises at least one of A' or A".

Example 14. The composition of any one of Examples 1-13, wherein the amount of A' or A" is present in the perovskite phase at a concentration between 0.0001 mol % and 10 mol %.

Example 15. The composition of any one of Examples 1-14, wherein the amount of A' or A" is present in the perovskite phase at a concentration between 0.1 mol % and 5 mol %

Example 16. The composition of any one of Examples 1-15, wherein X' comprises a halide.

Example 17. The composition of any one of Examples 1-16, wherein X' comprises at least one of iodide, bromide, or chloride.

Example 18. The composition of any one of Examples 1-17, wherein B' comprises at least one of tin or lead.

Example 19. The composition of any one of Examples 1-18, wherein B' comprises at least one of tin and lead.

Example 20. The composition of any one of Examples 1-19, wherein the perovskite-like phase further comprises A.

Example 21. The composition of any one of Examples 1-20, wherein B' is the same as B.

Example 22. The composition of any one of Examples 1-21, X' is the same as X.

Example 23. The composition of any one of Examples 1-22, wherein the perovskite-like phase comprises $(PEA)_2GAPb_2I_7$.

Example 24. The composition of any one of Examples 1-23, wherein the perovskite-like phase further comprises $(PEA)_2(GA_{1-x}-A_x)Pb_2I_7$ and x is greater than zero.

Example 25. The composition of any one of Examples 1-24, wherein the perovskite-like phase further comprises $(PEA)_2(GA_{1-x}A_x)(Pb_{1-z}Sn_z)_2I_7$ and z is greater than zero.

Example 26. The composition of any one of Examples 1-25, wherein the perovskite-like phase further comprises $(PEA)_2(GA_{1-x-y}MA_xFA_y)(Pb_{1-z}Sn_z)_2(I)_7$ at least one of x or y is greater than zero.

27. The composition of any one of Examples 1-26, wherein the perovskite-like phase further comprises $(PEA)_2(GA_{1-x-y}MA_xFA_y)(Pb_{1-z}Sn_z)_2(I_{1-m}Br_m)_7$ and m is greater than zero.

Example 28. The composition of any one of Examples 1-27, wherein the perovskite phase is in the form of a layer.

Example 29. The composition of any one of Examples 1-28, wherein the layer has a thickness between 200 nm and 1500 nm.

Example 30. The composition of any one of Examples 1-29, wherein the thickness is between 700 nm and 1200 nm.

Example 31. The composition of any one of Examples 1-30, wherein the perovskite-like phase is a dispersed phase within the perovskite phase, which is present as a continuous phase.

Example 32. The composition of any one of Examples 1-31, wherein: the continuous perovskite phase comprises a plurality of grains separated by grain boundaries, and the dispersed perovskite-like phase associates with the grain boundaries.

Example 33. The composition of any one of Examples 1-32, wherein: the dispersed phase forms a coating that covers at least a portion of the grain boundaries, and the coating has a thickness between about 1 nm and about 100 nm.

Example 34. The composition of any one of Examples 1-33, wherein the thickness of the coating is between about 1 nm and about 10 nm.

Example 35. The composition of any one of Examples 1-34, wherein the perovskite-like phase is present at a concentration between greater than 0 mol % and less than or equal to 5 mol %.

Example 36. The composition of any one of Examples 1-35, wherein the perovskite-like phase concentration is between greater than 0 mol % and less than or equal to 2 mol %.

Example 37. The composition of any one of Examples 1-36, characterized by a low-angle diffraction peak below 14 degrees)(°, when tested by XRD.

Example 38. The composition of any one of Examples 1-37, wherein the low-angle diffraction peak comprises three peaks present at about 4.3°, about 8.5°, and about 12.8°.

Example 39. The composition of any one of Examples 1-38, characterized by a surface having an elemental ratio of tin:lead between 0.5:1 and 10:1.

Example 40. The composition of any one of Examples 1-39, wherein the elemental ratio is between 2:1 and 8:1.

Example 41. The composition of any one of Examples 1-40, wherein the elemental ratio is between 0.5:1 and 10:1.

Example 42. The composition of any one of Examples 1-41, characterized by a carrier lifetime between 5 and 10 microseconds.

Example 43. The composition of any one of Examples 1-42, characterized by a surface recombination velocity between 1 cm/s and 10 cm/s.

Example 44. The composition of any one of Examples 1-43, characterized by a dark carrier density between $0.5 \times 10^{14}$ cm$^{-3}$ and $0.5 \times 10^{16}$ cm$^{-3}$.

Example 45. A tandem device comprising: a composite layer having a first bandgap and comprising a perovskite phase and perovskite-like phase; and a perovskite layer having a second bandgap, wherein: the first bandgap is less than the second bandgap.

Example 46. The tandem device of Example 45, wherein: the perovskite phase comprises $ABX_3$, the perovskite-like phase comprises $A'_2A''B'_2X'_7$, A is a first cation, B is a second cation, X is a first anion, A' is a third cation, A'' is a fourth cation, B' is a fifth cation, X' is a second anion, and A' is different than A''.

Example 47. The tandem device of either Example 45 or Example 46, wherein: the perovskite layer comprises $A^*B^*X^*_3$, and A* is a sixth cation, B* is a seventh cation, X* is a third anion.

Example 48. The tandem device of any one of Examples 45-47, wherein A* is the same as A, B* is the same as B, and X* is the same as X.

Example 49. The tandem device of any one of Examples 45-48, wherein at least one of A* is different than A, B* is different than B, and X* is different than X.

Example 50. The tandem device of any one of Examples 45-49, wherein the first bandgap is between 1.1 eV and 1.5 eV or between 1.1 eV and 1.3 eV.

Example 51. The tandem device of any one of Examples 45-50, wherein the second bandgap is between 1.55 eV and 2.0 eV or between 1.6 eV and 1.9 eV.

Example 52. The tandem device of any one of Examples 45-51, wherein the perovskite layer comprises $FA_{1-x}Cs_xPb(I_{1-m}Br_m)_3$ and FA is formamidinium.

Example 53. The tandem device of any one of Examples 45-52, wherein the perovskite layer further comprises $FA_{1-x-y}Cs_xMA_yPb(I_{1-m}Br_m)_3$, MA is methylammonium, and y is greater than zero.

Example 54. The tandem device of any one of Examples 45-53, wherein the perovskite layer further comprises $FA_{1-x-y}Cs_xMA_yPb_{1-z}Sn_z(I_{1-m}Br_m)_3$ and z is greater than zero.

Example 55. The tandem device of any one of Examples 45-54, wherein the perovskite layer further comprises $FA_{1-x-y}Cs_xMA_yPb_{1-z}Sn_z(I_{1-m-n}Br_mCl_n)_3$ and n is greater than zero.

Example 56. The tandem device of any one of Examples 45-55, wherein the perovskite layer has a stoichiometry approximately equal to $FA_{0.7}Cs_{0.3}PbI_{2.1}Br_{0.9}$.

Example 57 The tandem device of any one of Examples 45-56, wherein the composite layer has a stoichiometry approximately equal to $(FASnI_3)_{0.6}(MAPbI_3)_{0.4}$.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A tandem device comprising:
   a composite layer having a first bandgap and comprising a first phase comprising $ABX_3$ and a second phase comprising $A'_2A''B'_2X'_7$; and
   a perovskite layer having a second bandgap, wherein:
   A is a first cation, B is a second cation, X is a first anion,
   A' is a third cation, A'' is a fourth cation comprising guanidinium (GA), B' is a fifth cation, X' is a second anion,
   A' is different than A'', and
   the first bandgap is less than the second bandgap.

2. The tandem device of claim 1, wherein A' comprises an ammonium functional group.

3. The tandem device of claim 1, wherein A' comprises at least one of phenylethylammonium (PEA), guanidinium (GA), 4-flouorophenethylammonium, N-methyl-1,3-propane diammonium, 1,4-butane diamine, N,N-dimethyl-1,3-propane diammonium, dipropylammonium, or diethylammonium.

4. The tandem device of claim 1, wherein A'' further comprises at least one of phenylethylammonium (PEA), 4-flouorophenethylammonium, N-methyl-1,3-propane diammonium, 1,4-butane diamine (BDA), N,N-dimethyl-1,3-propane diammonium, dipropylammonium, or diethylammonium.

5. The tandem device of claim 1, wherein B comprises at least one of tin or lead.

6. The tandem device of claim 1, wherein B comprises tin and lead.

7. The tandem device of claim 1, wherein A comprises at least one of methylammonium (MA), formamidinium (FA), dimethylammonium, or cesium.

8. The tandem device of claim 1, wherein:
   the first phase comprises $FA_{(1-x)}MA_xPb_{1-z}Sn_zI_3$, $0<x\leq1$ and $0<z\leq1$.

9. The tandem device of claim 1, wherein:
   the first phase comprises $FA_{(1-x-y)}MA_xCs_yPb_{1-z}Sn_zI_3$, $0<x\leq1$, $0<y\leq1$, and $0<z\leq1$.

10. The tandem device of claim 1, wherein:
    the first phase comprises $FA_{(1-x-y)}MA_xCs_yPb_{1-z}Sn_z(I_{1-a-b}Br_aCl_b)_3$,
    $0<a\leq1$, $0<b\leq1$, $0<x\leq1$, $0<y\leq1$, and $0<z\leq1$.

11. The tandem device of claim 4, wherein:
    the first phase further comprises at least one of A' or A'', and
    the amount of A' or A'' is present in the first phase at a concentration between 0.0001 mol % and 10 mol %.

12. The tandem device of claim 1, wherein the second phase comprises $(PEA)_2GAPb_2I_7$.

13. The tandem device of claim 1, wherein the second phase comprises $(PEA)_2(GA_{1-t}A_t)Pb_2I_7$ and $0<t\leq1$.

14. The tandem device of claim 1, wherein:
    the second phase comprises $(PEA)_2(GA_{1-t}A_t)(Pb_{1-v}Sn_v)_2I_7$,
    $0<t\leq1$ and $0<v\leq1$.

15. The tandem device of claim 1, wherein:
the second phase comprises $(PEA)_2(GA_{1-t-u}MA_tFA_u)(Pb_{1-v}Sn_v)_2I_7$,
$0<t\leq1$, $0<u\leq1$ and $0<v\leq1$.

16. The tandem device of claim 1, wherein:
the second phase comprises $(PEA)_2(GA_{1-t-u}MA_tFA_u)(Pb_{1-v}Sn_v)_2(I_{1-m}B_m)_7$,
$0<m\leq1$, $0<t\leq1$, $0<u\leq1$, and $0<v\leq1$.

17. The tandem device of claim 1, wherein the second phase is present at a concentration between greater than 0 mol % and less than or equal to 5 mol %.

18. The tandem device of claim 1, wherein the composite layer is characterized by a low-angle diffraction peak below 14 degrees (°), when tested by XRD.

19. The tandem device of claim 18, wherein the low-angle diffraction peak comprises three peaks present at about 4.3°, about 8.5°, and about 12.8°.

* * * * *